(12) United States Patent
Ren et al.

(10) Patent No.: US 11,627,691 B2
(45) Date of Patent: Apr. 11, 2023

(54) ZINTL COMPOUNDS WITH HIGH THERMOELECTRIC PERFORMANCE AND METHODS OF MANUFACTURE THEREOF

(71) Applicant: University of Houston System, Houston, TX (US)

(72) Inventors: Zhifeng Ren, Pearland, TX (US); Jing Shuai, Houston, TX (US)

(73) Assignee: UNIVERSITY OF HOUSTON SYSTEM, Houston, TX (US)

(*) Notice: Subject to any disclaimer, the term of this patent is extended or adjusted under 35 U.S.C. 154(b) by 1240 days.

(21) Appl. No.: 15/999,846

(22) PCT Filed: Feb. 17, 2017

(86) PCT No.: PCT/US2017/018407
§ 371 (c)(1),
(2) Date: Aug. 20, 2018

(87) PCT Pub. No.: WO2017/143213
PCT Pub. Date: Aug. 24, 2017

(65) Prior Publication Data
US 2021/0217943 A1 Jul. 15, 2021

Related U.S. Application Data

(60) Provisional application No. 62/296,902, filed on Feb. 18, 2016.

(51) Int. Cl.
*H10N 10/852* (2023.01)
*C22C 12/00* (2006.01)
(Continued)

(52) U.S. Cl.
CPC ........... *H10N 10/852* (2023.02); *B22F 1/054* (2022.01); *B22F 3/15* (2013.01); *C22C 12/00* (2013.01);
(Continued)

(58) Field of Classification Search
CPC ..... C22C 12/00; H10N 10/852; H10N 10/853
See application file for complete search history.

(56) References Cited

U.S. PATENT DOCUMENTS

| | | | |
|---|---|---|---|
| 2009/0211619 | A1 | 8/2009 | Sharp et al. |
| 2017/0117453 | A1* | 4/2017 | Tamaki ................. H01L 35/16 |

FOREIGN PATENT DOCUMENTS

| | | | |
|---|---|---|---|
| CN | 101101954 A | * | 1/2008 |
| CN | 101359713 B | * | 6/2012 |

OTHER PUBLICATIONS

CN-101101954-A English machine translation (Year: 2008).*
(Continued)

*Primary Examiner* — Andrew J Golden
(74) *Attorney, Agent, or Firm* — Conley Rose, P.C.

(57) ABSTRACT

Systems and methods discussed herein relate to Zintl-type thermoelectric materials, including a p-type thermoelectric material according to the formula $AM_yX_y$, and includes at least one of calcium (Ca), europium (Eu), ytterbium (Yb), and strontium (Sr), and has a ZT of the above about 0.60 above 675K. The n-type thermoelectric component includes magnesium (Mg), tellurium (Te), antimony (Sb), and bismuth (Bi) according to the formula $Mg_{3.2}Sb_{1.3}Bi_{0.5-x}Te_x$ that has an average ZT above 0.8 from 400K to 800K. The p-type and n-type materials discussed herein may be used alone, in combination with other materials, or in combination with each other in various configurations.

16 Claims, 45 Drawing Sheets

(51) Int. Cl.
H10N 10/853 (2023.01)
C22C 28/00 (2006.01)
B22F 3/15 (2006.01)
B22F 1/054 (2022.01)
B22F 9/04 (2006.01)

(52) U.S. Cl.
CPC ........... *C22C 28/00* (2013.01); *H10N 10/853* (2023.02); *B22F 2009/043* (2013.01)

(56) References Cited

OTHER PUBLICATIONS

CN-101359713-B English machine translation (Year: 2012).*
May et al, Thermoelectric transport properties of CaMg2Bi2, EuMg2Bi2, and Yb Mg2Bi2, Physical Review B 85, 035202 (2012) (Year: 2012).*
Yu et al, Improved thermoelectric performance in the Zintl phase compounds YbZn2-xMnxSb2 via isoelectronic substitution in the anionic framework, Journal of Applied Physics 104, 013705 (2008) (Year: 2008).*
Toberer et al, Electronic structure and transport in thermoelectric compounds AZn2Sb2 (A=Sr, Ca, Yb, Eu), Dalton Trans., 2010, 39, 1046-1054. (Year: 2010).*
Wang et al, Synthesis and high thermoelectric efficiency of Zintl phase YbCd2-xZnxSb2, Appl. Phys. Lett. 94, 092106 (2009) (Year: 2009).*

International Patent Application No. PCT/US2017/018407 International Search Report and Written Opinion dated Jun. 19, 2017 (17 pages).
Wubieneh, et al. "Thermoelectric Properties of Zintl Phase Compounds of Ca1-xEuxZn2Sb2 ($0 \leq x \leq 1$)," Journal of Electronic Materials, vol. 45, No. 3, 2016. Published on Dec. 2015. [retrieved on Jun. 2, 2017]. Retrieved from <URL:https://www.researchgate.net/publication/288917806_Thermoelectric_Properties_of_Zintl_Phase_Compounds_of_Ca1-X_EU_x_Zn2Sb2_0_x_1>; (6 pages).
Shuai et al. "Thermoelectric properties of Bi-based Zintl compounds Ca1-xYbxMg2Bi2†," Journal of Materials Chemistry A, 2016, 4, 4312-4320. Published on Feb. 12, 2016. [retrieved on Jun. 2, 2017]. Retrieved from internet <URL:http//pubs.rsc.org/is/content/articlelanding/2016/ta/c6ta00507a#!divAbstract> (9 pages).
Gascoin et al. "Zintl Phases as Thermoelectric Materials: Tuned Transport Properties of the Compounds CaxYb1-xZn2Sb2," Advanced Functional Materials, 15(11):1860-1864, Nov. 2005. [retrieved on Jun. 2, 2017]. Retrieved from internet <URL:http://onlinelibrary.wiley.com/dol/10.1002/adfm.200500043/full> (7 pages).
Shuai et a. "Enhancement of thermoelectric performance of phase pure Zintl compounds Ca1-xYbxZn2Sb2, Ca1-xEuxZn2Sb2, and Eu1-xYbxZn2Sb2 by mechanical alloying and hot pressing," Nano Energy 25 (2016) 136-144., Published on Apr. 19, 2016. [retrieved on Jun. 5, 2017]. Retrieved from internet <URL:http://www.sciencedirect.com/science/article/pii/S2211285516300787> (10 pages).
Flange-Larsen et al. "Valence band study of thermoelectric Zintl-phase SrZn2Sb2 and YbZn2Sb2: X-ray photoelectron spectroscopy and density functional theory," Physical Review B 81, 205204. May 10, 2010. <URL: https://journals.aps.org/prb/abstract/10.1103/PhysRevB.81.205204> (7 pages).

* cited by examiner

ZINTL COMPOUNDS WITH HIGH THERMOELECTRIC PERFORMANCE AND METHODS OF MANUFACTURE THEREOF

CROSS-REFERENCE TO RELATED APPLICATIONS

This application is a National Phase entry of, and claims priority to PCT Application No. PCT/US2017/018407, filed Feb. 17, 2017, which claims priority to U.S. Application No. 62/296,902, filed Feb. 18, 2016, entitled "High Thermoelectric Performance of Zintl Compounds and Methods of Manufacture Thereof," the entire contents of each being hereby incorporated by reference herein for all purposes.

STATEMENT REGARDING FEDERALLY SPONSORED RESEARCH OR DEVELOPMENT

This work is supported by the United States Department of Energy under award numbers DE-SC0010831 and DE-SC0001299.

BACKGROUND

Due to the potential benefits, thermoelectric materials have attracted extensive interest in waste-heat conversion. The energy conversion efficiency is determined by Carnot efficiency and the dimensionless figure of merit (ZT), defined as $ZT=(S^2\sigma/\kappa) T$, where S, $\sigma$, $\kappa$, and T are the Seebeck coefficient, electrical conductivity, thermal conductivity, and absolute temperature, respectively. For bulk thermoelectric materials, it is difficult to independently optimize the Seebeck coefficient, electric resistivity, and thermal conductivity simultaneously since they are interrelated at least by carrier concentration and effective mass. Presently, methods to improve the efficiency of thermoelectric materials rely on increasing the power factor by optimizing the carrier concentration, resonant level, band convergence, energy barrier filtering, and reducing the thermal conductivity through solid solution, nanoscale second phase, bulk nanostructuring, and complex crystal structure.

BRIEF SUMMARY OF THE DISCLOSURE

In an embodiment, a thermoelectric device comprising: a thermoelectric material according to the formula $AM_yX_y$, wherein the ZT of the thermoelectric material is above about 0.60 at above about 675K.

In an alternate embodiment, a thermoelectric device comprising: a thermoelectric component comprising magnesium (Mg), tellurium (Te), antimony (Sb), and bismuth (Bi) according to the formula $Mg_{3.2}Sb_{1.5}Bi_{0.5-x}Te_x$.

In an alternate embodiment, a thermoelectric device comprising: an n-type thermoelectric component according to the formula $Mg_{3.2-y}Sb_{1.5}Bi_{0.5-x}Te_x$ and a p-type thermoelectric component according to the formula $AM_yX_y$, wherein the n-type thermoelectric component is electrically coupled to the p-type thermoelectric component.

BRIEF DESCRIPTION OF THE DRAWINGS

For a detailed description of the exemplary embodiments disclosed herein, reference will now be made to the accompanying drawings in which.

DETAILED DESCRIPTION OF THE DISCLOSED EXEMPLARY EMBODIMENTS

Figure 1A:
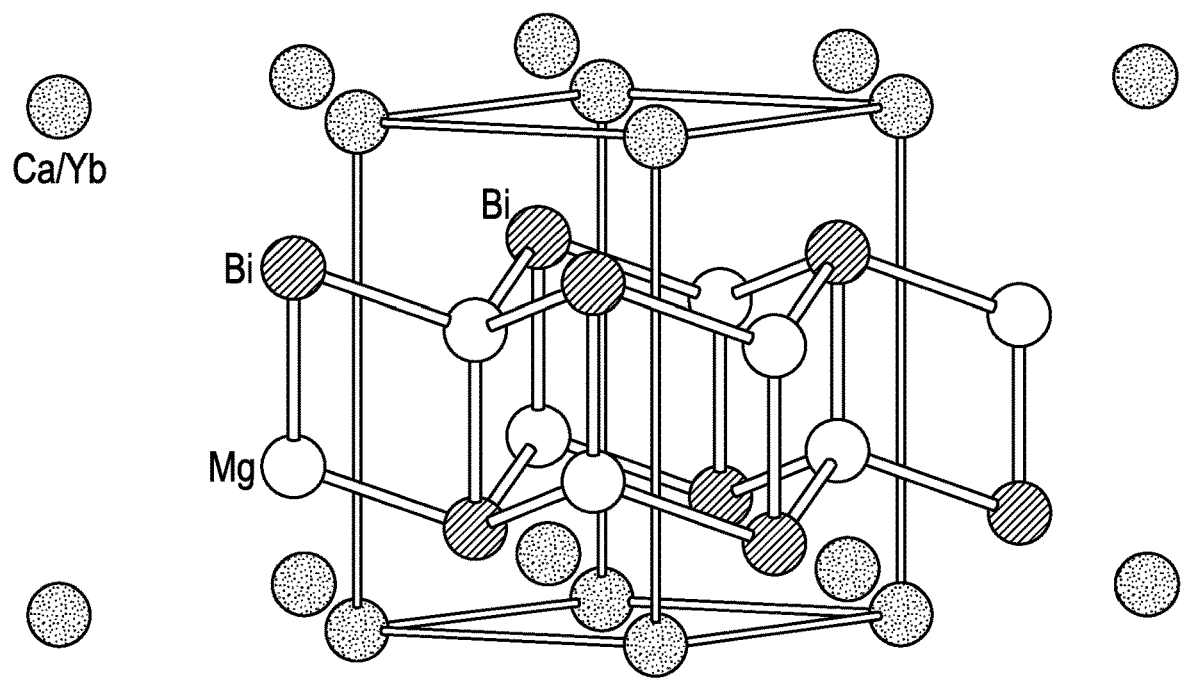
FIG. 1A illustrates an exemplary crystal structure of p-type thermoelectric materials fabricated according to certain embodiments of the present disclosure.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . "

Zintl materials may be used, as discussed herein, for both n-type and p-type thermoelectric materials. Zintl phases are products of a reaction between an alkali metal or an alkaline earth and any post transition metal or metalloid. Stated differently, Zintl phases are products of reactions between a component from groups 13, 14, 15, or 15, and either a group 1 or group 2 component. A variety of Zintl compounds such as $Yb_{14}MnSb_{11}$, $Zn_4Sb_3$, $Mg_3Sb_2$, $BaGa_2Sb_2$, $Eu_5In_2Sb_6$, $Ca_xYb_1$, $Zn_2Sb_2$, $EuCd_2Sb_2$, $YbCd_{2-x}Zn_xSb_2$, etc. have been widely investigated. Among all those Zintl antimonides, ternary antimonides with the $CaAl_2Si_2$ structure-type (trigonal, No. 164, P-3m1; $AX_2Sb_2$; X=Cd, Zn; A=Sr, Ca, Yb, Eu) have shown promising thermoelectric performance in the middle temperature range. The highest figure of merit of 1.2 at 700 K is reported in $YbCd_{1.6}Zn_{0.4}Sb_2$. Even though Sb-based Zintl compounds have been studied for many decades, the analogous Bi-based materials have received much less attention. Zintl phases $CaMg_2Bi_2$ and $YbMg_2Bi_2$ have also been reported, however, the ZT of ~0.4 in $YbMg_2Bi_2$ at 625 K, and <0.1 in $CaMg_2Bi_2$ by using traditional way via melting, grinding, and annealing, as previously reported are not high enough for many thermoelectric applications.

The n- and p-type materials discussed herein may be employed in semiconductor devices or other devices, alone or in combination to form a PN junction. A PN junction describes the interface between a p-type and an n-type material, e.g., the boundary where the two types of thermoelectric materials meet. The materials at this junction may be described as "electrically coupled" since, when the host device is activated, electrons diffuse across the boundary to combine with the excess of holes in the p-type region, creating a depletion layer.

P-Type Phase Pure Bi-Based Ternary Zintl Phase Compounds

Using the systems and methods discussed herein, phase pure Bi-based ternary Zintl compounds $Ca_{1-x}Yb_xMg_2Bi_2$ were fabricated, as were Zintl phase compounds according to the formula $Ca_{1-x}Yb_xZn_2Sb_2$ (x=0, 0.25, 0.5, 0.75, and 1), $EuZn_2Sb_2$, $Eu_{0.5}Yb_{0.5}Zn_2Sb_2$, and $Eu_{0.5}Ca_{0.5}Zn_2Sb_2$ were prepared by ball milling and hot pressing. These compounds exhibit thermoelectric properties including a ZT of about 1, and a higher average ZT and conversion efficiency than previously reported compounds, and would therefore be more commercially viable than Zintl or other compounds with less desirable thermoelectric properties. Ball milling and hot pressing has been demonstrated to be effective to fabricate high performance phase pure $AZn_2Sb_2$ Zintl compounds, especially $Ca_{1-x}Yb_xZn_2Sb_2$ with enhanced thermoelectric properties. TEM characterization indicates that the lattice thermal conductivity is effectively reduced by point defects, nanoinclusions and a wide grain size distribution in $Ca_{1-x}Yb_xZn_2Sb_2$ samples. The larger carrier mobility in the rare earth alloyed compounds appears to be an inherent feature of these materials, but the experimentally measured smaller effective mass may also be a reason for the increased Hall mobility with increasing Yb/Eu concentration in $AZn_2Sb_2$ Zintl compounds. The highest ZT value achieved is ~0.9 for x=0.75 at 773 K, ~50% higher than the best performance of the sample made by melting method. Thus, discussed herein are reliable methods of bulk synthesis of Zintl phases.

When Bi is at stoichiometry of 2, samples exhibited the presence of free Bi with the amount depending on the ratio of Ca/Yb. This ratio may be, for example, from 1 to 3. In an embodiment, increasing Ca content results in increased free Bi. In some embodiments, even a slight Bi deficiency in the initial material ($CaMg_2Bi_{1.98}$ and $Ca_{0.5}Yb_{0.5}Mg_2Bi_{1.99}$) may eliminate the free Bi in the materials. Elimination of free Bi drastically reduced the electrical resistivity by increasing the carrier concentration. As a result, much higher power factors, a desirable property in thermoelectric materials, were achieved in these compounds, which lead to much improved ZTs and power factors especially at temperatures below 873 K. Such improvement in ZT and power factor could result in efficiency about 11%, which makes this material competitive with half-Heusler or skutterudite compounds.

Sample Fabrication: Calcium (Ca, Sigma Aldrich, 99.9%, pieces), ytterbium (Yb, Sigma Aldrich, 99.9%, chunks), magnesium (Mg, Sigma Aldrich, 99.9%, pieces), and bismuth (Bi, Sigma Aldrich, 99.999%, chunks) were weighed according to the stoichiometry of $Ca_{1-x}Yb_xMg_2Bi_2$ with x=0, 0.3, 0.5, 0.7, and 1, and then loaded in a stainless steel jar with stainless steel balls for mechanical alloying by a high energy ball mill (SPEX 8000D) for 12 h. The final ball-milled nanopowder was then loaded into a graphite die with an inner diameter of 12.7 mm, and consolidated by alternating current (AC) hot pressing at ~933 K for 2 min. In order to make phase pure samples, the Bi concentration was further reduced to improve the thermoelectric properties by using the same experimental process. The phase pure samples were made from initial compositions of $CaMg_2Bi_{1.98}$ and $Ca_{0.5}Yb_{0.5}Mg_2Bi_{1.99}$ based on the undoped sample $CaMg_2Bi_2$ and optimized sample $Ca_{0.5}Yb_{0.5}Mg_2Bi_2$.

Material Characterization: X-ray diffraction spectra were collected on a PANalytical multipurpose diffractometer with an X'celerator detector (PANalytical X'Pert Pro). The microstructures, examined on a freshly broken surface, were investigated by a scanning electron microscope (SEM, JEOL 6330F). The electrical resistivity ($\rho$) and Seebeck coefficient (S) were simultaneously measured on a commercial system (ZEM-3, ULVAC) using the four-point direct current switching method and the static temperature difference method. The thermal conductivity was measured by measuring the thermal diffusivity (D) on a laser flash apparatus (LFA 457, NETZSCH), specific heat ($C_P$) on a DSC (404 C, NETZSCH), and volumetric density ($\rho_D$) by Archimedes method. The carrier concentration was obtained by Hall effect measurement (Van der Pauw method) at room temperature using a modified sample puck in Physical Properties Measurement System (PPMS D060, Quantum Design).

Figure 1B:
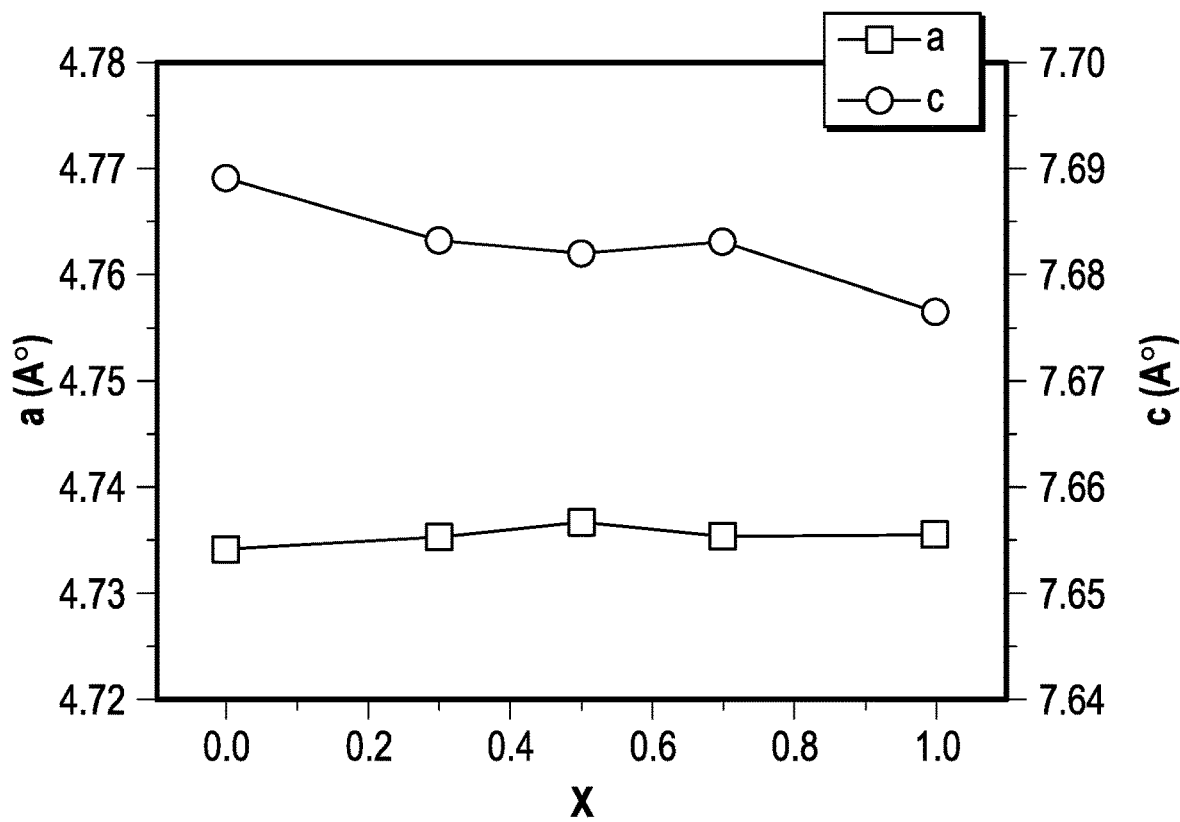
FIG. 1B illustrates the dependence of the unit cell parameters on the Yb content x.
Figure 1C:
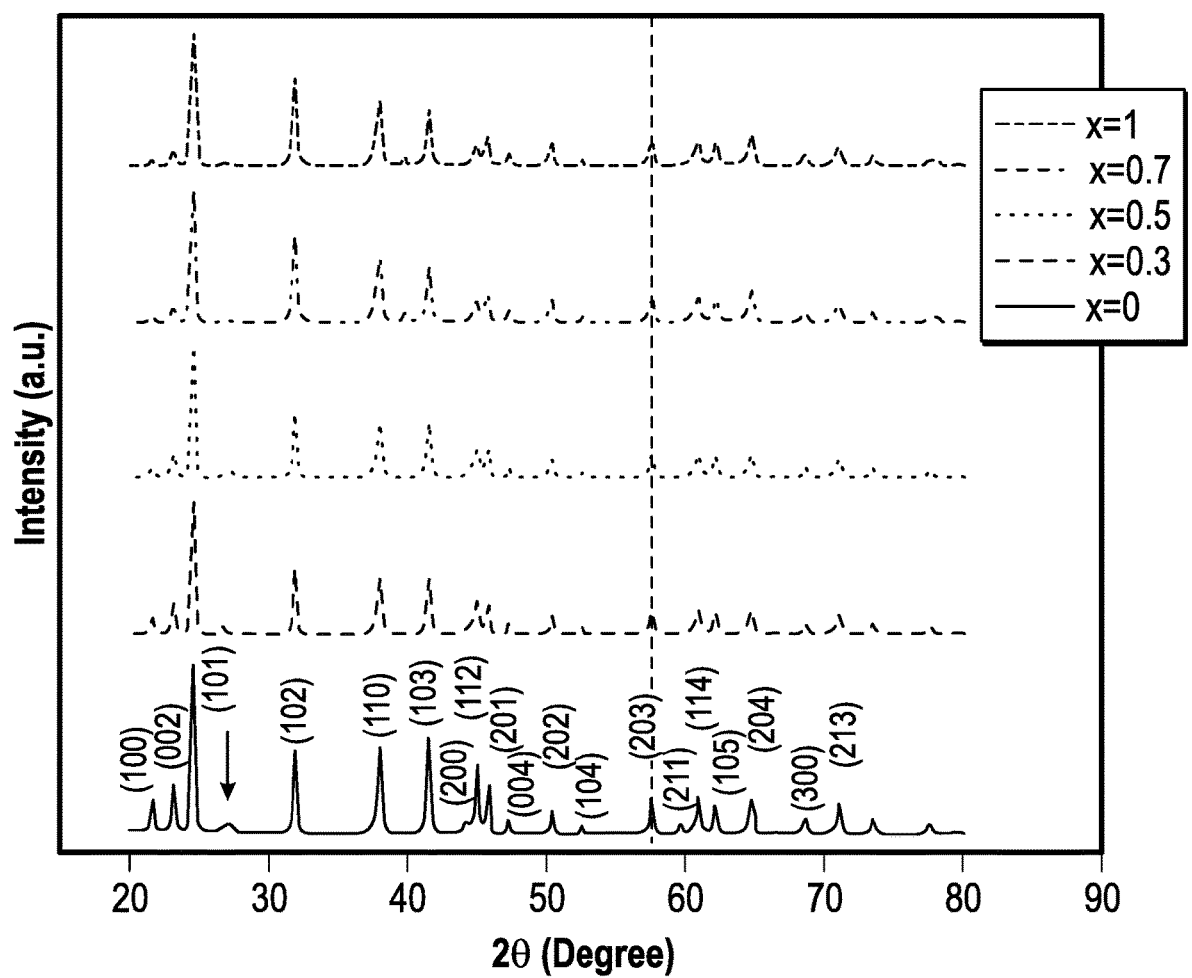
FIG. 1C illustrates XRD patterns of p-type thermoelectric materials fabricated according to certain embodiments of the present disclosure.

FIG. 1A illustrates an exemplary crystal structure of $Ca_{1-x}Yb_xMg_2Bi_2$, FIG. 1B illustrates the dependence of the unit cell parameters on the Yb content x, and FIG. 1C shows the XRD patterns of $Ca_{1-x}Yb_xMg_2Bi_2$ with x=0, 0.3, 0.5, 0.7, and 1. All diffraction peaks are indexed according to the reported structure of $CaAl_2Si_2$ (space group P$\bar{3}$m1, No. 164). The results indicate that Yb has successfully substituted Ca to form $Ca_{1-x}Yb_xMg_2Bi_2$ solid solutions. For example, as shown in FIG. 1C, there was little variation observed in the lattice parameters of all compounds because of similar size of $Ca^{2+}$ and $Yb^{2+}$. There is a small amount of free Bi as the impurity phase indicated by the arrow in the figure except for the case when x=1, consistent previously reported compounds. However, with increasing Yb content, the impurity peaks gradually disappear. By applying the Zintl concept, the structure of $Ca_{1-x}Yb_xMg_2Bi_2$ can be described as the anionic building block $(Mg_2Bi_2)^{2-}$ with divalent cations ($Ca^{2+}$ and $Yb^{2+}$) seating between the chains to provide electrons.

Figure 2:
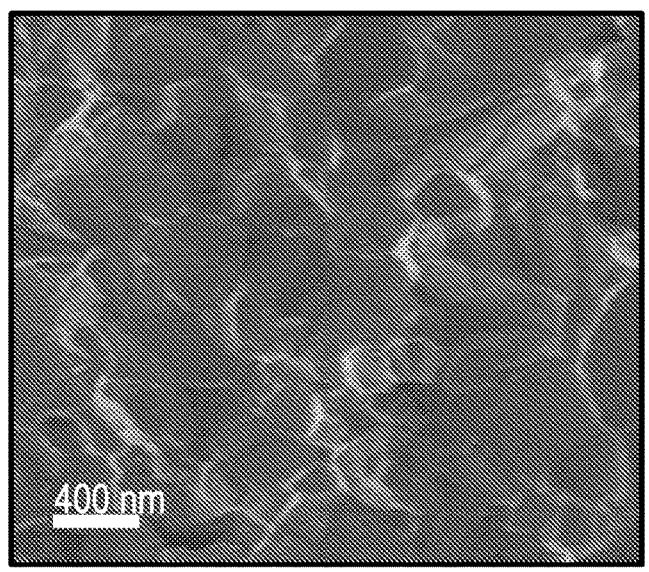
FIG. 2 illustrates a scanning electron microscopy (SEM) image of p-type thermoelectric materials fabricated according to certain embodiments of the present disclosure.

FIG. 2 illustrates a SEM image of $Ca_{0.5}Yb_{0.5}Mg_2Bi_2$ fabricated according to embodiments of the present disclosure. FIG. 2 illustrates the SEM image of the optimized $Ca_{0.5}Yb_{0.5}Mg_2Bi_2$ which is densely packed with grains varying in diameter from about 100 nm to about 500 nm.

Figure 3A:
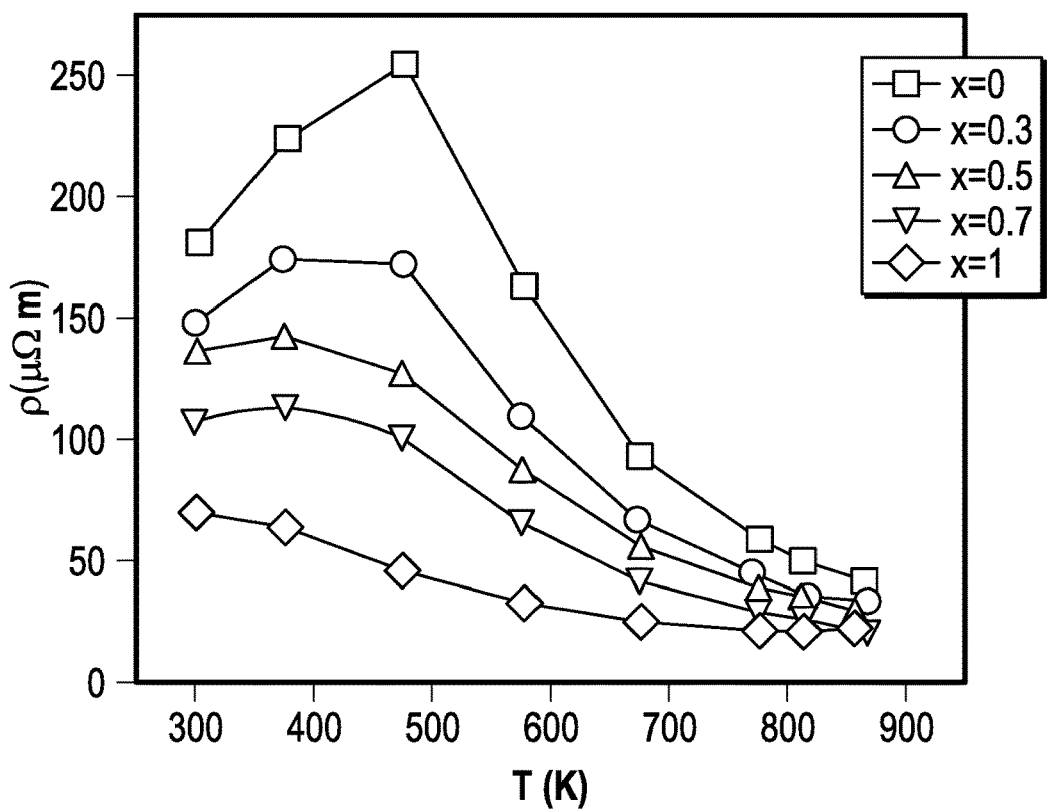
FIGS. 3A-3C illustrate thermoelectric properties of p-type thermoelectric materials fabricated according to certain embodiments of the present disclosure.
Figure 3B:
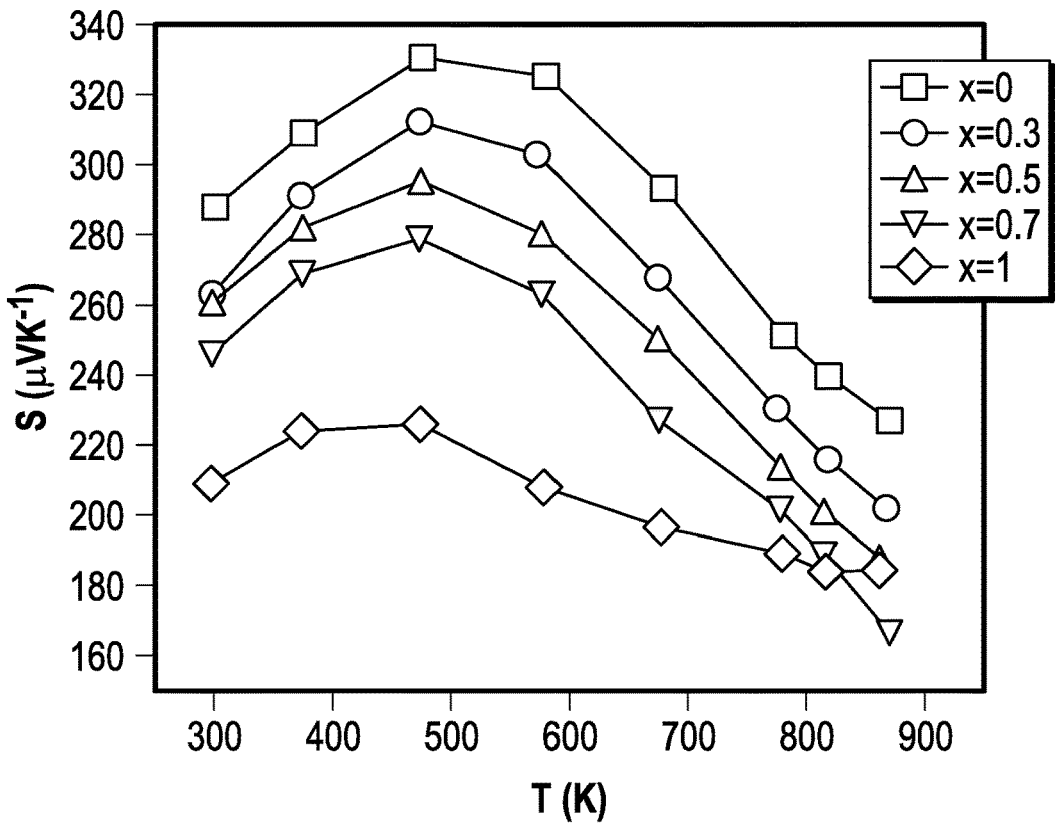
Figure 3C:
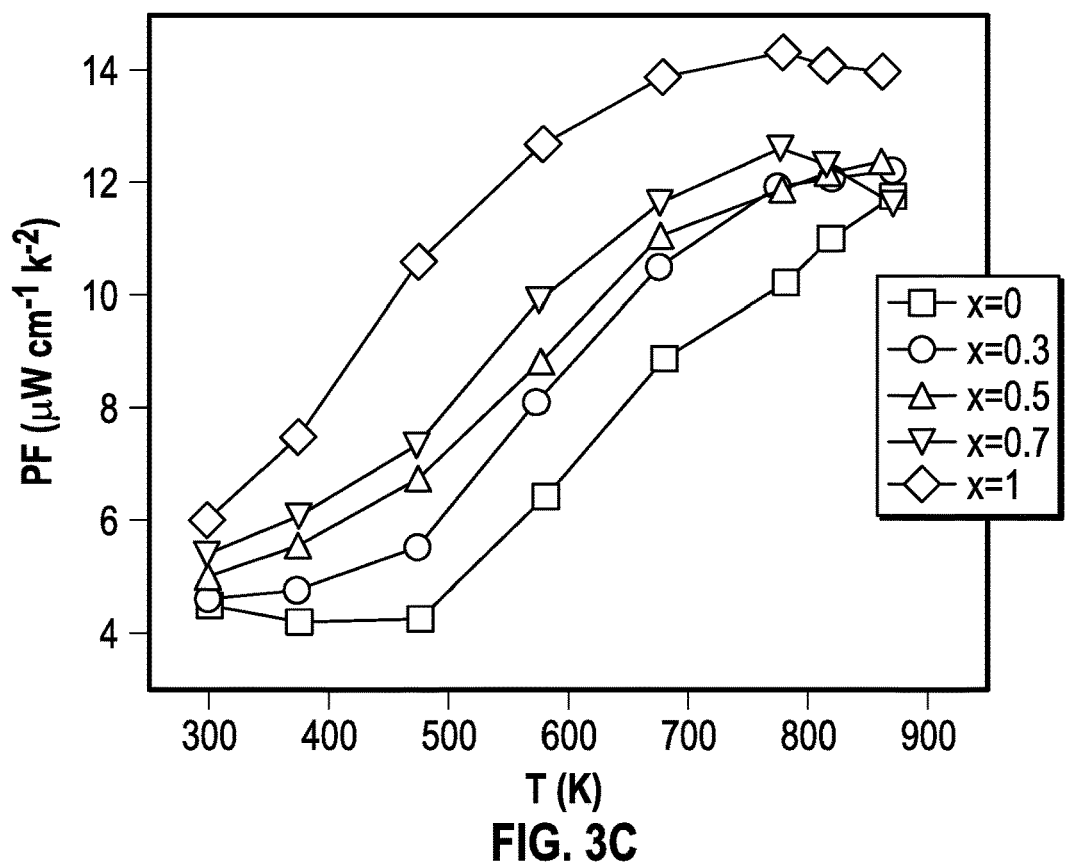

FIGS. 3A-3C illustrate thermoelectric properties of $Ca_{0.5}Yb_{0.5}Mg_2Bi_2$ fabricated according to certain embodiments of the present disclosure. FIG. 3A shows the temperature dependent electrical resistivity of $Ca_{1-x}YbMg_2Bi_2$ samples. For pure Ca containing compound $CaMg_2Bi_2$, the electrical resistivity first rises with increasing temperature due to phonon scattering, and then reaches a maximum and decreases. Moreover, the electrical resistivity decreases with increasing Yb concentration, which might be attributed to increased carrier concentration shown in Table 1, despite a small reduction in Hall mobility.

TABLE 1

Room-temperature thermoelectric transport properties of $Ca_{1-x}Yb_xMg_2Bi_2$

| $Ca_{1-x}Yb_xMg_2Bi_2$ | x = 0 | x = 0.3 | x = 0.5 | x = 0.7 | x = 1 |
|---|---|---|---|---|---|
| Carrier concentration ($10^{18}$ cm$^{-3}$) | 2.38 | 2.75 | 3.29 | 4.26 | 7.2 |
| Hall mobility (cm$^2$ V$^{-1}$ s$^{-1}$) | 143 | 153 | 138 | 131 | 119 |
| Effective mass ($m_e$) | 0.62 | 0.56 | 0.61 | 0.65 | 0.66 |

The carrier concentration significantly increases with x. The carrier concentration (n) and Hall mobility ($\mu$) listed in Table 1 affect the electrical resistivity ($\rho$) by the relationship $1/\rho=ne\mu$. Although both used as cations in Zintl phase, calcium ion and ytterbium ion have similar sizes, the difference in electronegativity results in the different electrical properties. Because the dominant carriers are holes and calcium is more electropositive than ytterbium, calcium-rich compound means more electrons transfer, resulting in lower hole concentration.

FIG. 3B illustrates the temperature dependent Seebeck coefficient of all $Ca_{1-x}Yb_xMg_2Bi_2$ samples fabricated according to certain embodiments of the present disclosure. Consistent with the trend of electrical resistivity, Seebeck coefficient first increases with temperature, then reaches a maximum and decreases. The Seebeck coefficient decreases as x increases, a consequence of the increased carrier concentration. Using the peak in the Seebeck coefficient, the individual band gap are estimated by $E_g=2e|S|_{max}T_{max}$, where e, $S_{max}$, and $T_{max}$ are electron charge, the maximum Seebeck coefficient, and the corresponding temperature, respectively. The $E_g$s of all the samples $Ca_{1-x}Yb_xMg_2Bi_2$ with x=0, 0.3, 0.5, 0.7, and 1 are estimated to be 0.32, 0.30, 0.28, 0.27, and 0.22 eV, indicating Yb can modify the band gap to some extent. Based on the single band model, a rough estimation of the effective mass can be obtained by the following Eq. 1-3.

$$m^* = \frac{h^2}{2k_BT}\left[\frac{n}{4\pi F_{1/2}(\eta)}\right]^{2/3} \quad (1)$$

$$S = \pm \frac{k_B}{e}\left(\frac{(r+3/2)F_{r+3/2}(\eta)}{(r+3/2)F_{r+1/2}(\eta)} - \eta\right) \quad (2)$$

$$F_n(\eta) = \int_0^\infty \frac{\chi^n}{1+e^{\chi-\eta}}d\chi \quad (3)$$

Where $F_n(\eta)$ is the $n^{th}$ order Fermi integral, $\eta$ the reduced Fermi energy, r the scattering factor, h the Plank constant, $k_B$ the Boltzmann constant, and e the electron charge. As acoustic phonon scattering is commonly the main scattering mechanism for most thermoelectric materials, the scattering factor r could be considered as −½ in calculation. These relationships give m*=0.6±0.05 $m_e$ for all x values.

FIG. 3C illustrates the power factors for the samples fabricated according to certain embodiments of the present disclosure, which are the combined electrical resistivity and Seebeck coefficients. With more Yb concentration, the power factor increases due to the increased carrier concentration.

Figure 4A:
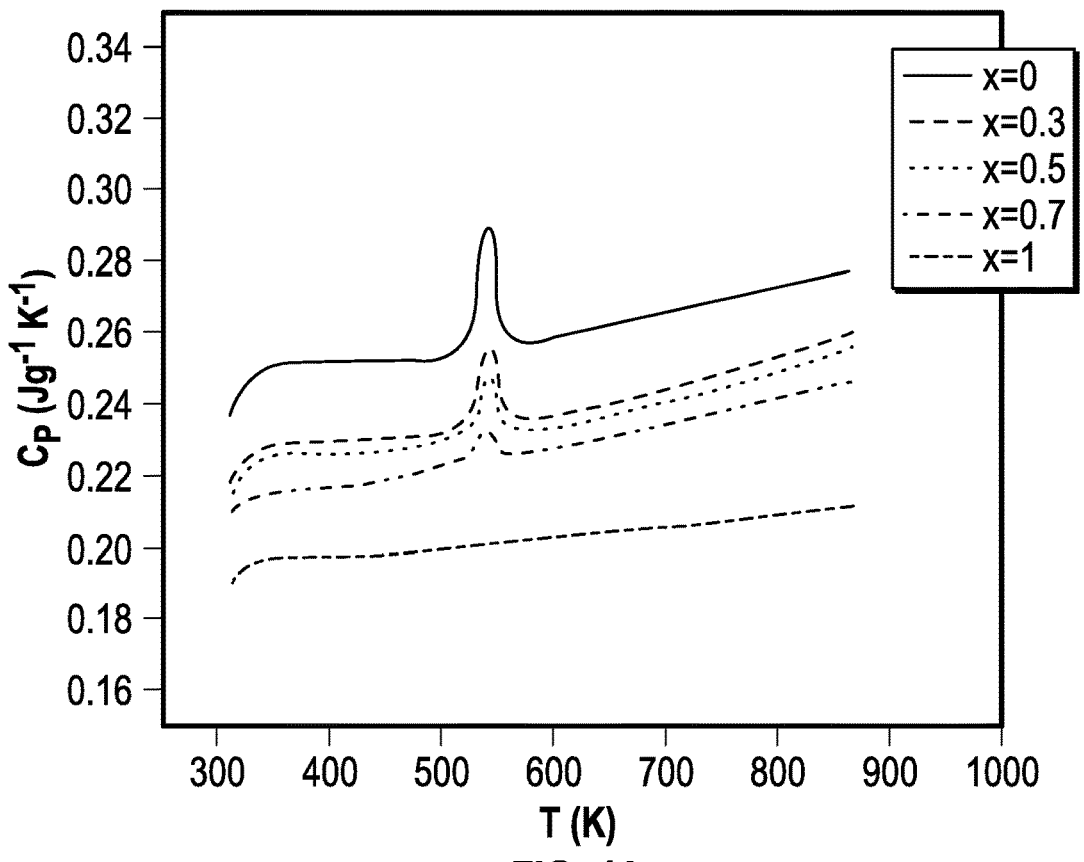
FIGS. 4A, and 4C-4E show the temperature-dependent thermal transport behavior of p-type thermoelectric materials samples fabricated according to certain embodiments of the present disclosure.
Figure 4B:
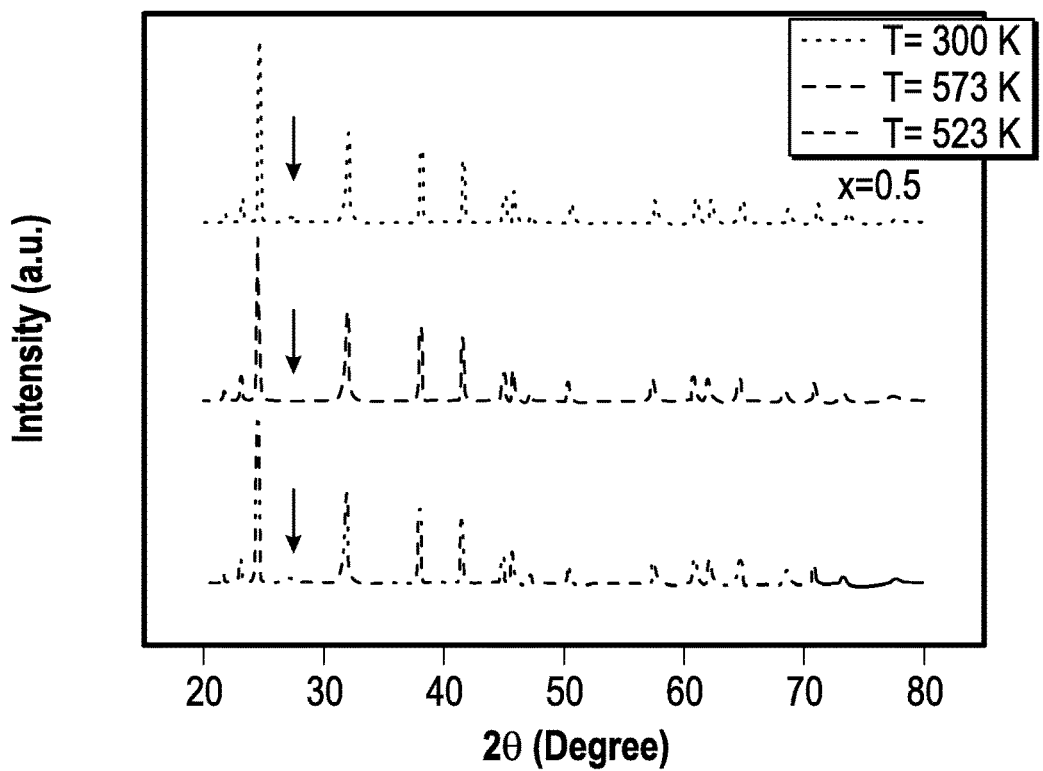
FIG. 4B illustrates XRD patterns of p-type thermoelectric materials at 523 K, 573 K and 300 K after cooling down.

FIGS. 4A, 4C-4E shows the temperature-dependent thermal transport behavior of $Ca_{1-x}Yb_xMg_2Bi_2$ samples fabricated according to certain embodiments of the present disclosure. Specific heat ($C_p$) for all samples is shown in FIG. 4A. For samples containing Ca, the peaks around 543 K are observed which indicates there is a phase transition. This is mainly because of the existence of impurity phase Bi, as shown in FIG. 1C. The same phenomenon has been observed in $Bi_2Te_3$, the DSC curve is assigned to free bismuth melting. Also as shown in FIG. 4A, the melting point of Bi is 544 K, exactly corresponding to the peak observed in specific heat measurement. With increasing x, because of decreasing impurity Bi, the impurity peak decreases and then vanishes. FIG. 4B illustrates XRD patterns of $Ca_{0.5}Yb_{0.5}Mg_2Bi_2$ at 523 K, 573 K and 300 K (after cooling down). To demonstrate free Bi does exist in some compositions, the optimized composition $Ca_{0.5}Yb_{0.5}Mg_2Bi_2$ was chosen to measure the high temperature XRD. The XRD patterns of powder sample were measured at 523 K and 573 K, and then measured again after cooling down to room temperature. When temperature of 523 K is lower than the melting point (544 K) of Bi, the XRD peak (around 27°) is clearly seen in FIG. 4B. However, the XRD peak of the impurity phase Bi disappears when measured at temperature of 573 K, a clear demonstration of existence of Bi, which means Bi have melted or possibly got into the lattice. When the sample was cooled down to room temperature, the impurity phase Bi appears again. The high temperature XRD patterns results indicate the free Bi is indeed in the compound.

Figure 4C:
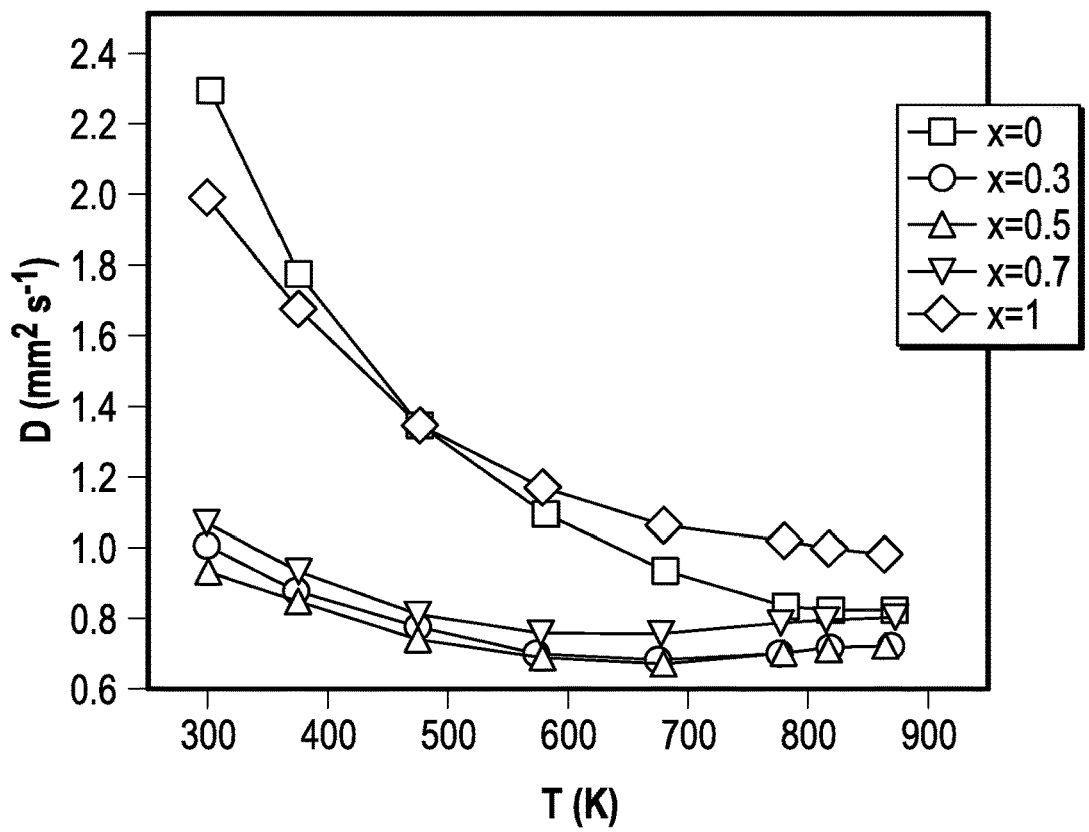

FIG. 4C illustrates the thermal diffusivity of all samples. With increasing temperature, the diffusivity (D) of both $CaMg_2Bi_2$ and $YbMg_2Bi_2$ shows gradually decreased tendency, while the diffusivity of mixed Ca and Yb compounds first decrease and then increase due to intrinsic excitation. $C_p$ and D are used to calculate the total thermal conductivity ($\kappa$) of all the doped samples by $\kappa = D\rho_D C_p$, where $\rho_D$ is the measured density of samples. The densities of all the samples $Ca_{1-x}Yb_xMg_2Bi_2$ with x=0, 0.3, 0.5, 0.7, and 1 measured by Archimedes method are 5.50, 5.74, 6.20, 6.48, and 7.03 g cm$^{-3}$, respectively. All samples are densely packed, demonstrated by the SEM images taken on the freshly fractured surface.

Figure 4D:
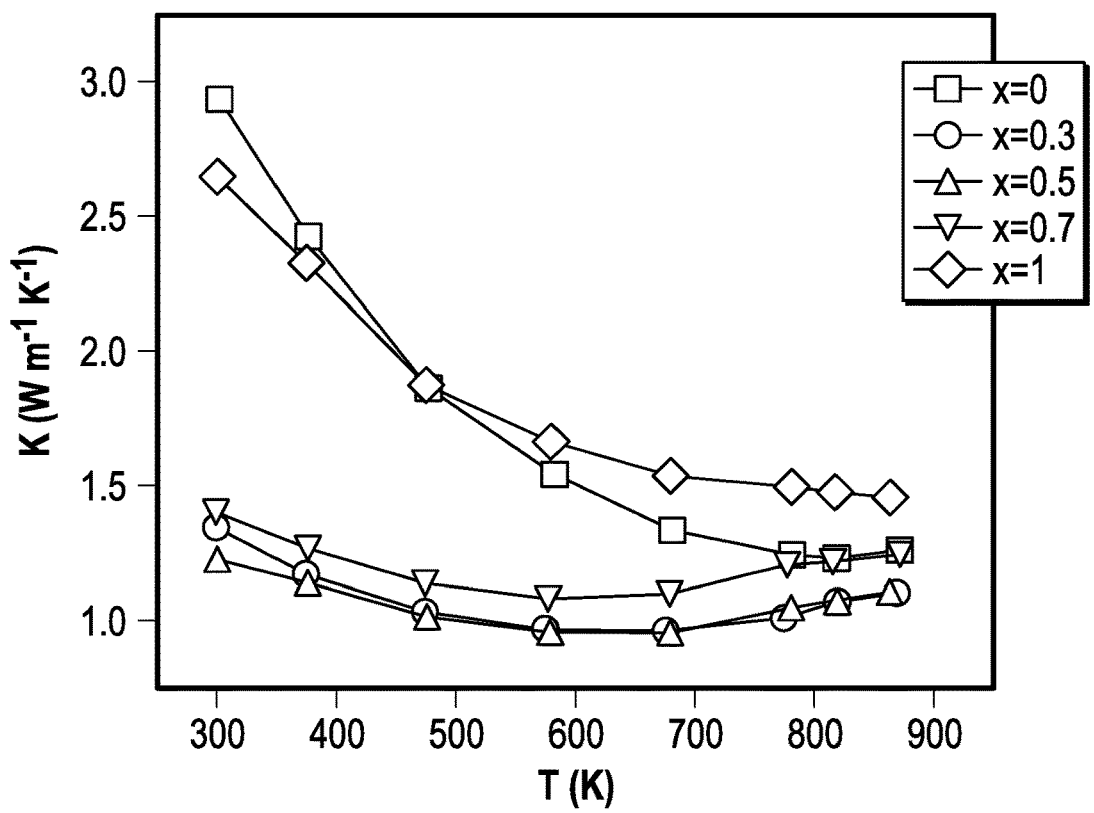
Figure 4E:
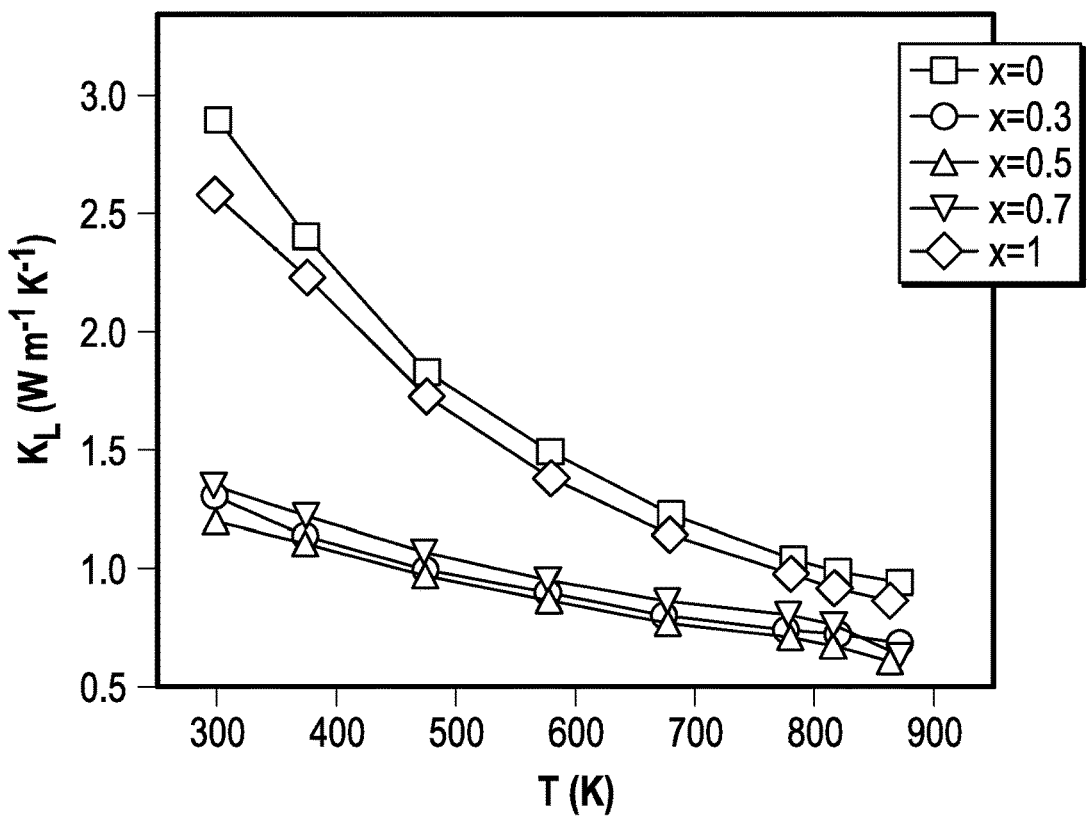

FIG. 4D illustrates the temperature dependence of the total thermal conductivity (K). Similar as the thermal diffusivity, the thermal conductivity of the Ca/Yb mixed compounds is expected to be lower than those of $CaMg_2Bi_2$ and $YbMg_2Bi_2$ because of the disorder introduced in the structure, which is the same mechanism as reported in the compound $Ca_xYb_{1-x}Zn_2Sb_2$. The lattice thermal conductivity ($\kappa_L$), shown in FIG. 4E, is obtained by directly subtracting the electronic contribution ($\kappa_e$) from the total thermal conductivity. $\kappa_e$ could be estimated by using the Wiedemann-Franz relationship ($\kappa_e = LT/\rho$), where L is the Lorenz number, approximated using a single parabolic band model. The $\kappa_L$ exhibits significant reduction in Ca/Yb mixed samples.

Figure 5:
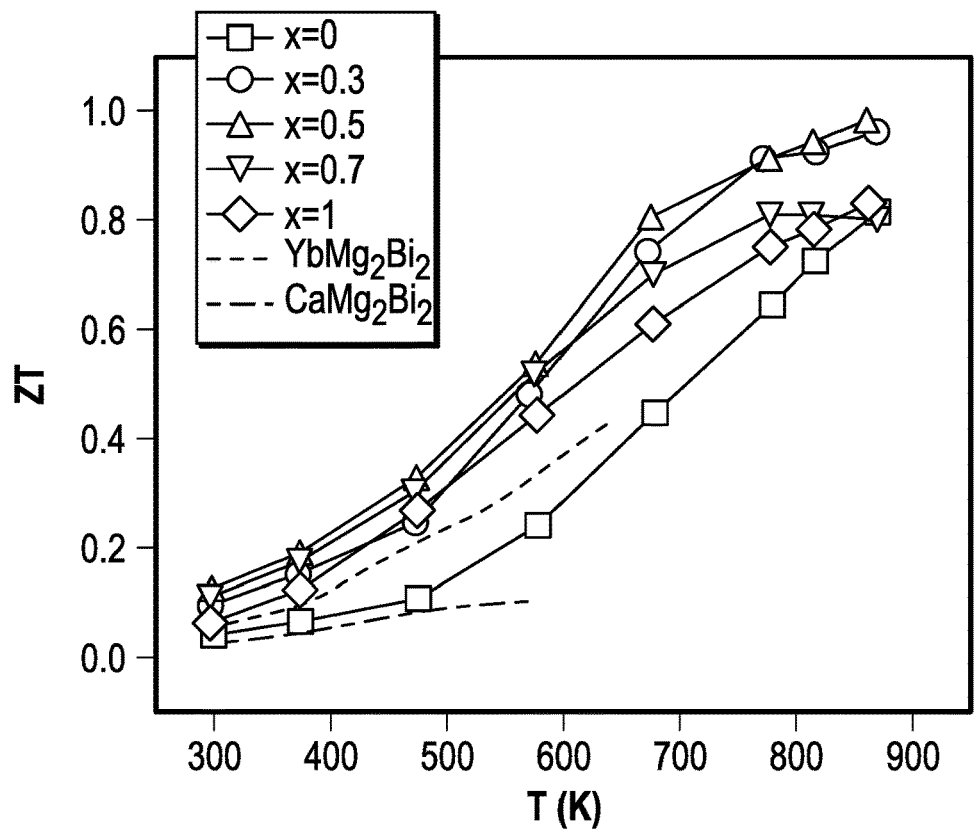
FIG. 5 illustrates the figure-of-merit ZT versus temperature and Yb content x.

FIG. 5 illustrates the figure-of-merit ZT versus temperature and Yb content x. With increasing temperature, ZT increases continuously. At 873 K, ZT reaches a maximum of ~1 for x=0.5, owing to the lower thermal conductivity than other samples.

In some embodiments, the engineering dimensionless figure of merit $(ZT)_{eng}$ as a function of thermal boundaries, i.e., the temperatures of hot side $T_h$ and cold side $T_c$, which is defined as, $$(ZT)_{eng} = \frac{\left(\int_{T_c}^{T_h} S(T)dT\right)^2}{\int_{T_c}^{T_h} \rho(T)dT \int_{T_c}^{T_h} \kappa(T)dT}(T_h - T_c) = \frac{(PF)_{eng}}{\int_{T_c}^{T_h} \kappa(T)dT}(T_h - T_c) \quad (7)$$

where S(T), ρ(T), and κ(T) are temperature dependent thermoelectric properties, and $(PF)_{eng}$ is the engineering power factor with respect to the boundary temperatures. In (7), $(ZT)_{eng}$ implies the cumulative effect of TE properties at a given thermal boundary, and $(PF)_{eng}$ has unit of W m$^{-1}$ K$^{-4}$, different from the conventional unit of W m$^{-1}$ K$^{-2}$ due to its cumulative effect associated with the temperature gradient.

Figure 6A:
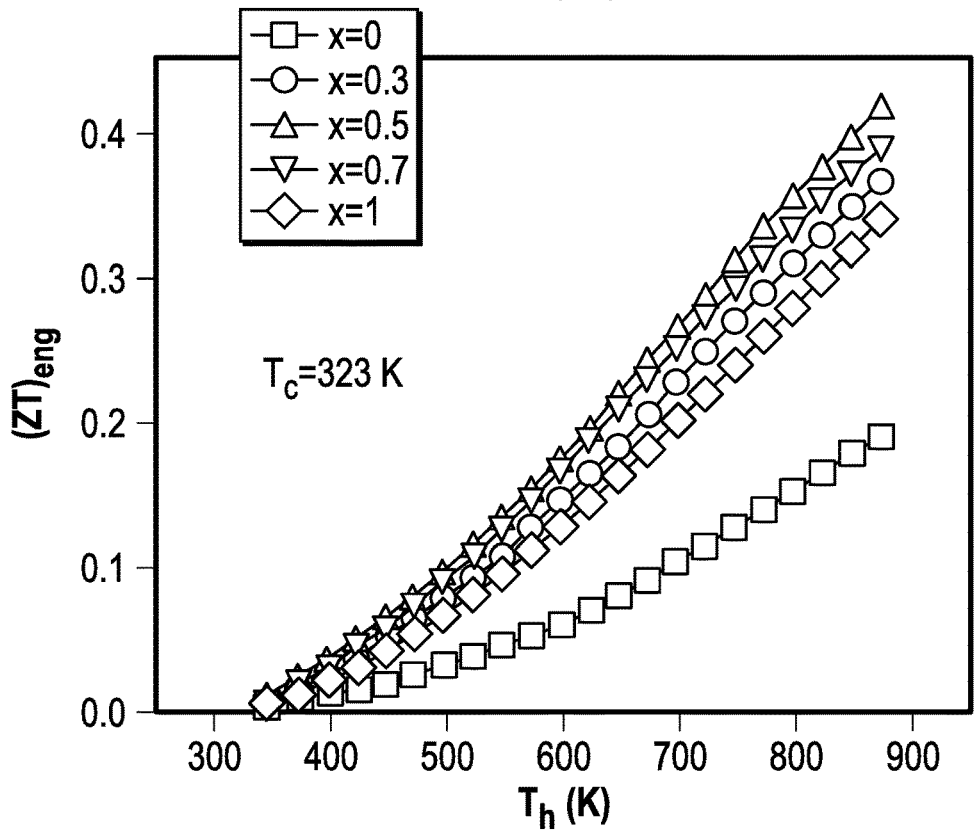
FIGS. 6A-6D illustrate temperature dependent thermal properties of p-type thermoelectric materials fabricated according to certain embodiments of the present disclosure.
Figure 6B:
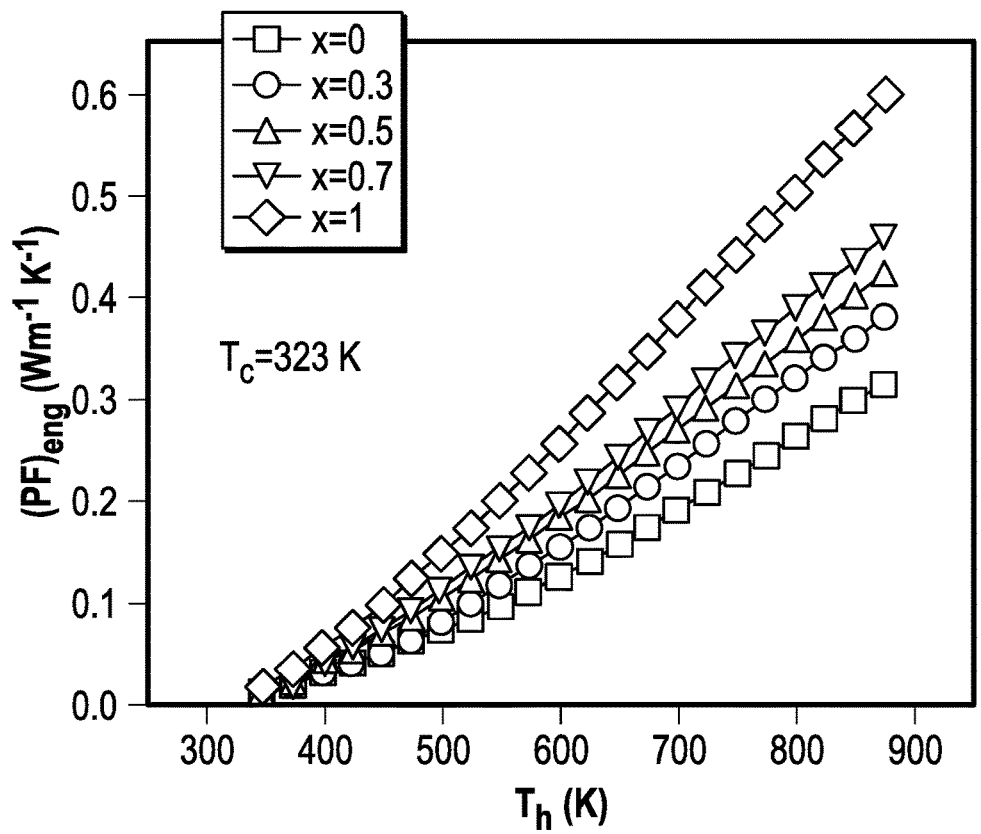
Figure 6C:
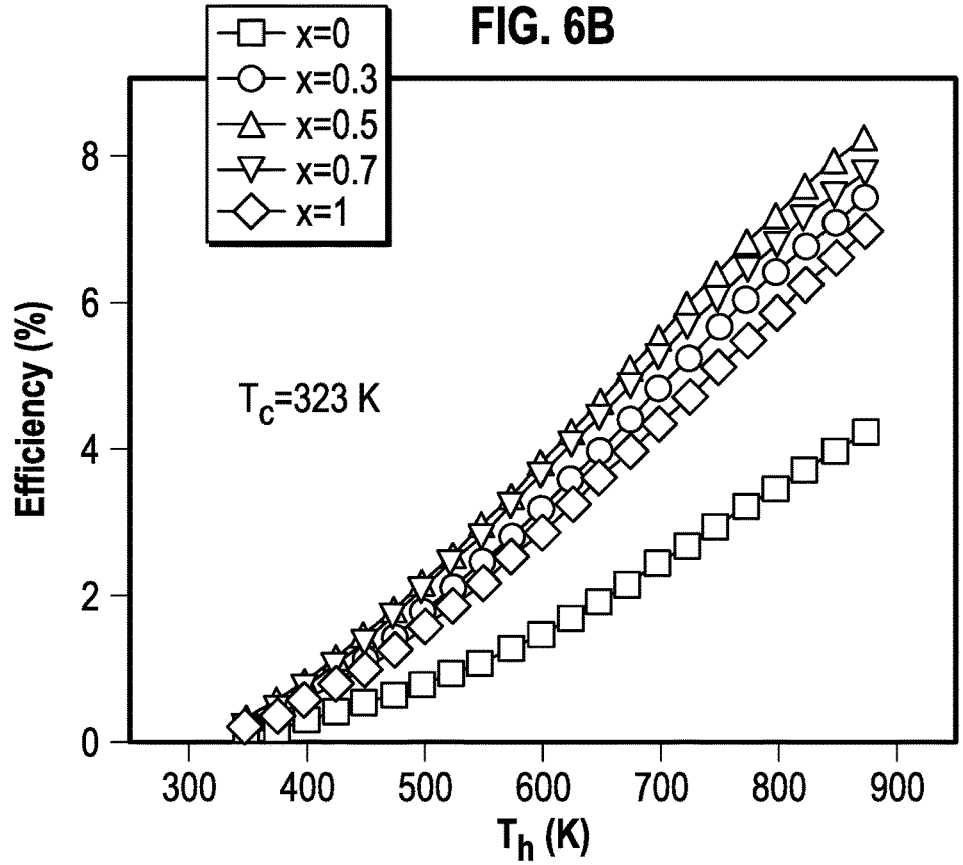
Figure 6D:
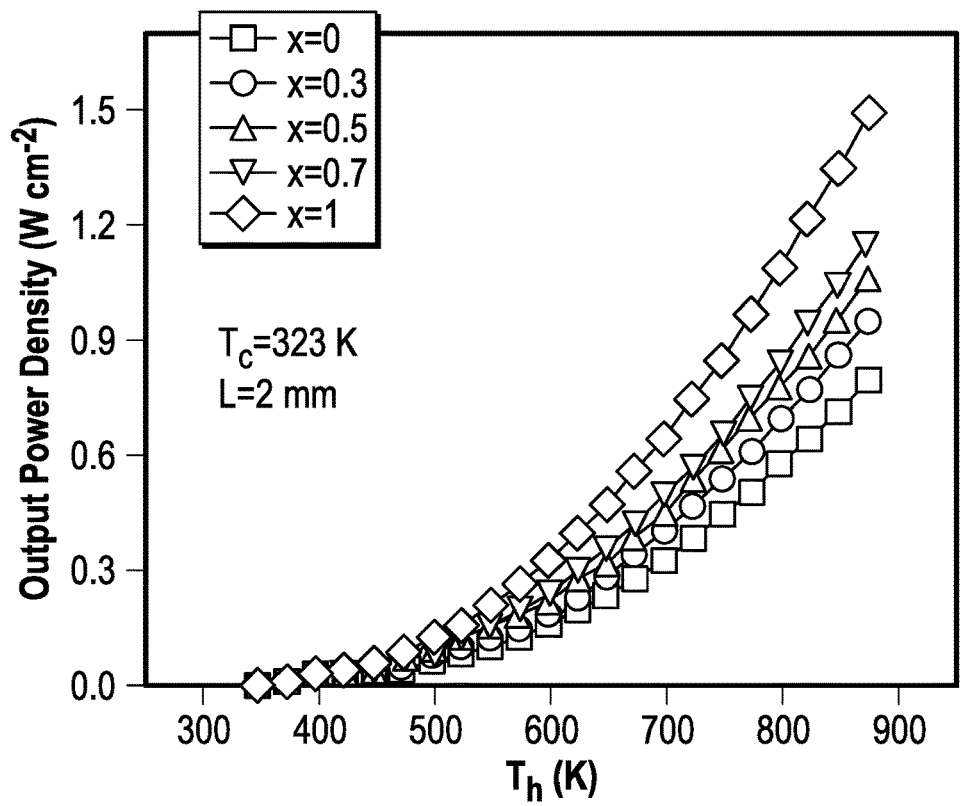

FIGS. 6A-6D illustrate temperature dependent thermal properties of $Ca_{1-x}Yb_xMg_2Bi_2$ fabricated according to certain embodiments of the present disclosure. The calculated $(ZT)_{eng}$ (FIG. 6A) and $(PF)_{eng}$ (FIG. 6B) dependence of the hot side temperature up to 873 K while the cold side temperature is kept at 323 K. FIG. 6A illustrates that the optimized sample with x=0.5 improves the materials' performance by a factor of 2 in terms of $(ZT)_{eng}$ as compared with the undoped sample with x=0. Based on $(ZT)_{eng}$, $Ca_{0.3}Yb_{0.7}Mg_2Bi_2$ displays higher performance than $Ca_{0.7}Yb_{0.3}Mg_2Bi_2$ even though the peak ZT of the latter is higher than the former at $T_h$=873 K. Assuming $T_c$=323 K and 2 mm of leg length, the maximum efficiency $\eta_{max}$ and its corresponding output power density $P_d$ including Thomson heat were calculated based on $(ZT)_{eng}$ and $(PF)_{eng}$ using the following formulae.

$$\eta_{max} = \eta_c \frac{\sqrt{1 + (ZT)_{eng}\alpha_1\eta_c^{-1}} - 1}{\alpha_0\sqrt{1 + (ZT)_{eng}\alpha_1\eta_c^{-1}} + \alpha_2} \quad (8)$$

$$P_d = \frac{(PF)_{eng}\Delta T}{L} \frac{\sqrt{1 + (ZT)_{eng}\alpha_1\eta_c^{-1}}}{\left(\sqrt{1 + (ZT)_{eng}\alpha_1\eta_c^{-1}} + 1\right)^2} \quad (9)$$

where.

$$\alpha_i = \frac{S(T_h)\Delta T}{\int_{T_c}^{T_h} S(T)dT} - \frac{\int_{T_c}^{T_h} \tau(T)dT}{\int_{T_c}^{T_h} S(T)dT}W_T\eta_c - iW_J\eta_c \quad (10)$$

(i = 0, 1 and 2)

$$W_J = \frac{\int_{T_c}^{T_h}\int_{T}^{T_h} \rho(T)dTdT}{\Delta T \int_{T_c}^{T_h} \rho(T)dT} \text{ and } W_T = \frac{\int_{T_c}^{T_h}\int_{T}^{T_h} \tau(T)dTdT}{\Delta T \int_{T_c}^{T_h} \tau(T)dT} \quad (11)$$

In (8)-(11), $\eta_c$ is Carnot efficiency, and $W_J$ and $W_T$ are weight factors representing a practical contribution of Joule and Thomson heat affecting the heat flux at the hot side, respectively, based on their cumulative effect. The conversion efficiency (FIG. 6C) of the optimized $Ca_{0.5}Yb_{0.5}Mg_2Bi_2$ is about 8.2% at ΔT=550° C. However, $YbMg_2Bi_2$ shows the best output power density (FIG. 6D) of 1.5 W cm$^{-2}$ because of the higher power factor among all the $Ca_{1-x}Yb_xMg_2Bi_2$ compounds.

Figure 7A:
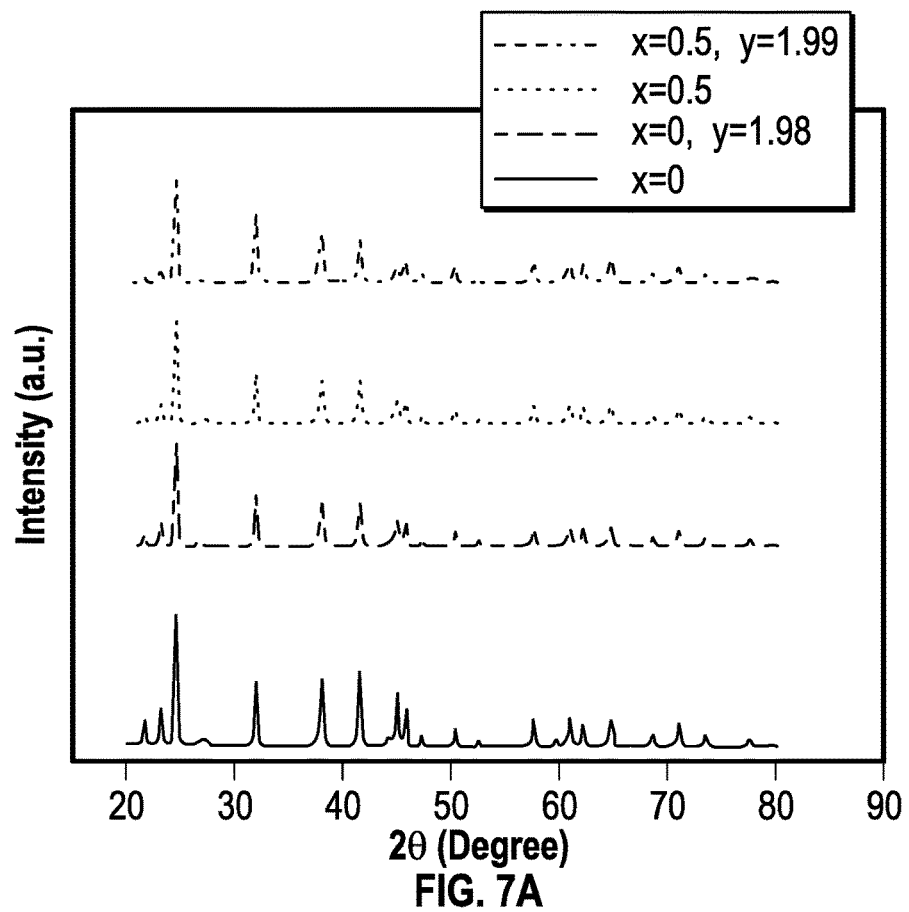
FIG. 7A illustrates XRD patterns for p-type thermoelectric materials fabricated according to certain embodiments of the present disclosure.
Figure 7B:
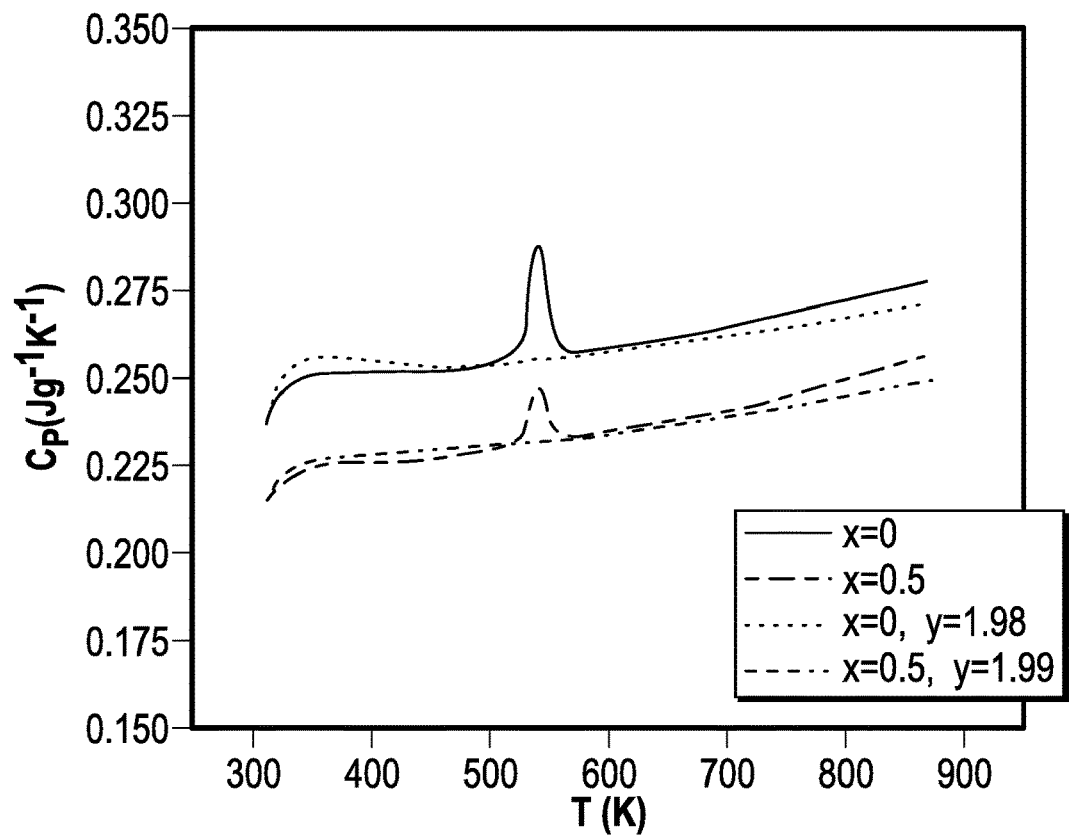
FIG. 7B illustrates specific heat for p-type thermoelectric materials fabricated according to certain embodiments of the present disclosure.

FIG. 7A illustrates XRD patterns for $CaMg_2Bi_2$, $CaMg_2Bi_{1.98}$, $Ca_{0.5}Yb_{0.5}Mg_2Bi_2$, and $Ca_{0.5}Yb_{0.5}Mg_2Bi_{1.99}$. FIG. 7B illustrates specific heat for $CaMg_2Bi_2$, $CaMg_2Bi_{1.98}$, $Ca_{0.5}Yb_{0.5}Mg_2Bi_2$, and $Ca_{0.5}Yb_{0.5}Mg_2Bi_{1.99}$. In an embodiment, the thermoelectric properties of $Ca_{1-x}Yb_xMg_2Bi_2$ including the average ZT were improved by reducing the initial Bi concentration in $CaMg_2Bi_2$ and $Ca_{0.5}Yb_{0.5}Mg_2Bi_2$, which may also significantly reduce or eliminate the free Bi impurity phase since the DSC peaks increase with increasing Ca concentration due to presence of Bi. In an embodiment, when the initial compositions are $CaMg_2Bi_{1.98}$ and $Ca_{0.5}Yb_{0.5}Mg_2Bi_{1.99}$, the peaks on the DSC curves for both cases vanish, as shown in FIG. 7B, indicating the disappearance (elimination) of the impurity phase of Bi. The phase purity can also be confirmed by XRD patterns (FIG. 7A), the impurity peaks disappear after reducing the Bi concentration in comparison with FIG. 1C.

Figure 8A:
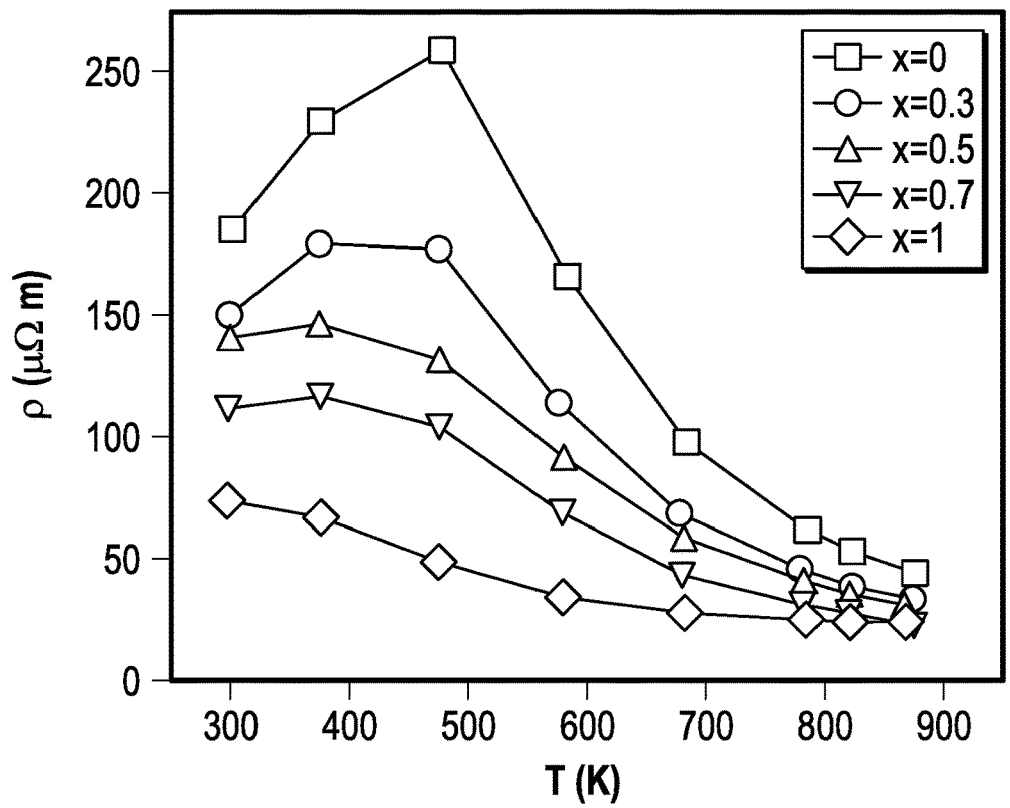
FIG. 8A-8C are graphs that illustrate the electric transport properties for p-type thermoelectric materials fabricated according to certain embodiments of the disclosure.
Figure 8B:
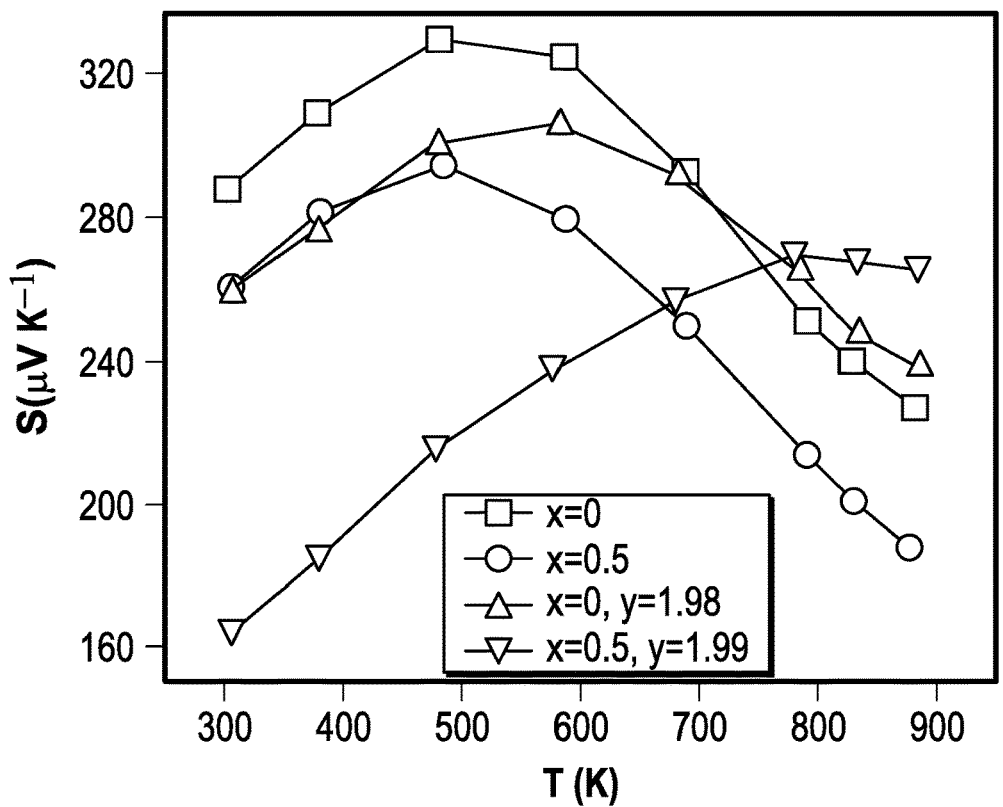
Figure 8C:
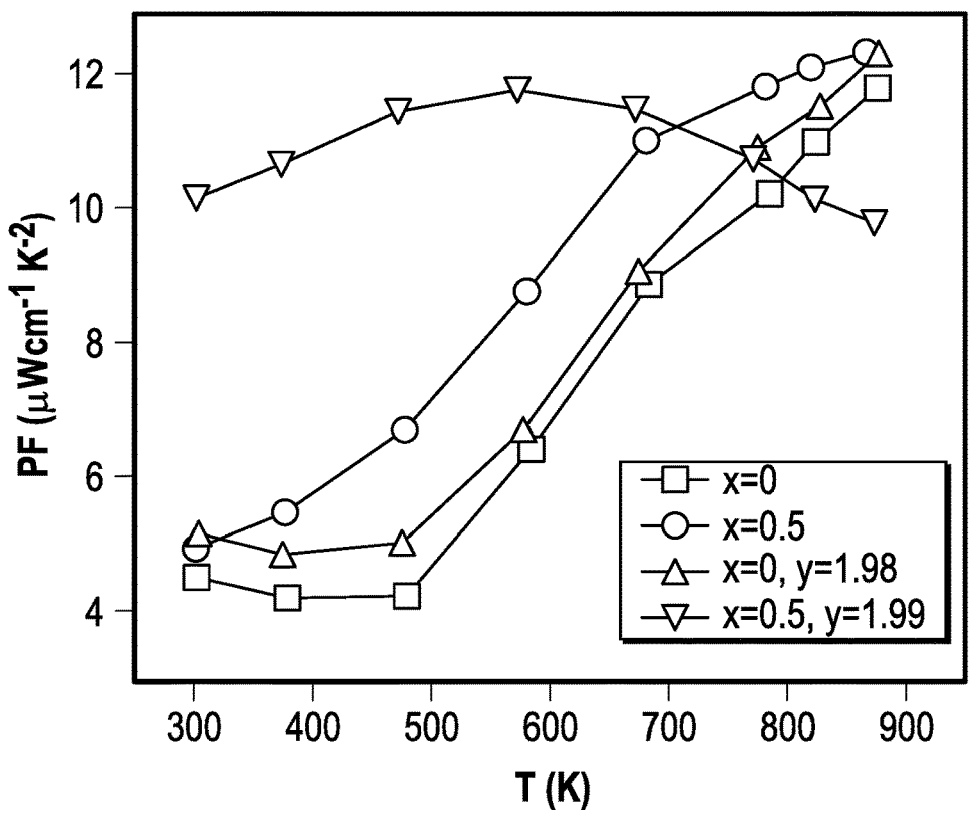

FIG. 8A-8C are graphs that illustrate the electric transport properties for $CaMg_2Bi_2$, $CaMg_2Bi_{1.98}$, $Ca_{0.5}Yb_{0.5}Mg_2Bi_2$, and $Ca_{0.5}Yb_{0.5}Mg_2Bi_{1.99}$, fabricated according to certain embodiments of the disclosure. As shown in FIG. 8A, the electrical resistivity of Bi-reduced compounds ($CaMg_2Bi_{1.98}$ and $Ca_{0.5}Yb_{0.5}Mg_2Bi_{1.99}$) decreases, especially at lower temperature, which could be attributed to the enhanced carrier concentration and almost unchanged Hall mobility. Table 2 lists the carrier concentration (n) and Hall mobility (μ) for the samples, as well as the effective mass ($m_e$).

TABLE 2

Room-temperature thermoelectric transport properties of $Ca_{1-x}Yb_xMg_2Bi_y$

| $Ca_{1-x}Yb_xMg_2Bi_y$ | x = 0 | x = 0, y = 1.98 | x = 0.5 | x = 0.5, y = 1.99 |
|---|---|---|---|---|
| Carrier concentration ($10^{18}$ cm$^{-3}$) | 2.38 | 3.46 | 3.29 | 15.00 |
| Hall mobility (cm$^2$ V$^{-1}$ s$^{-1}$) | 143 | 138 | 138 | 155 |

However, $Ca_{0.5}Yb_{0.5}Mg_2B_{1.99}$ exhibits metallic behavior at all temperature range, which is different from the others and its electrical resistivity becomes higher than that of $Ca_{0.5}Yb_{0.5}Mg_2Bi_2$ when temperature is above 673 K. The Seebeck coefficient displays a similar trend with the electrical resistivity as shown in FIG. 8B. Power factor calculated from the measured electrical resistivity and Seebeck coefficient are displayed in FIG. 8C. The power factor of Bi-reduced $CaMg_2Bi_{1.98}$ increases to some degree compared with $CaMg_2Bi_2$, while the power factor of Bi-reduced $Ca_{0.5}Yb_{0.5}Mg_2B_{1.99}$ drastically increases and maintains the high value in the entire temperature range.

Figure 9A:
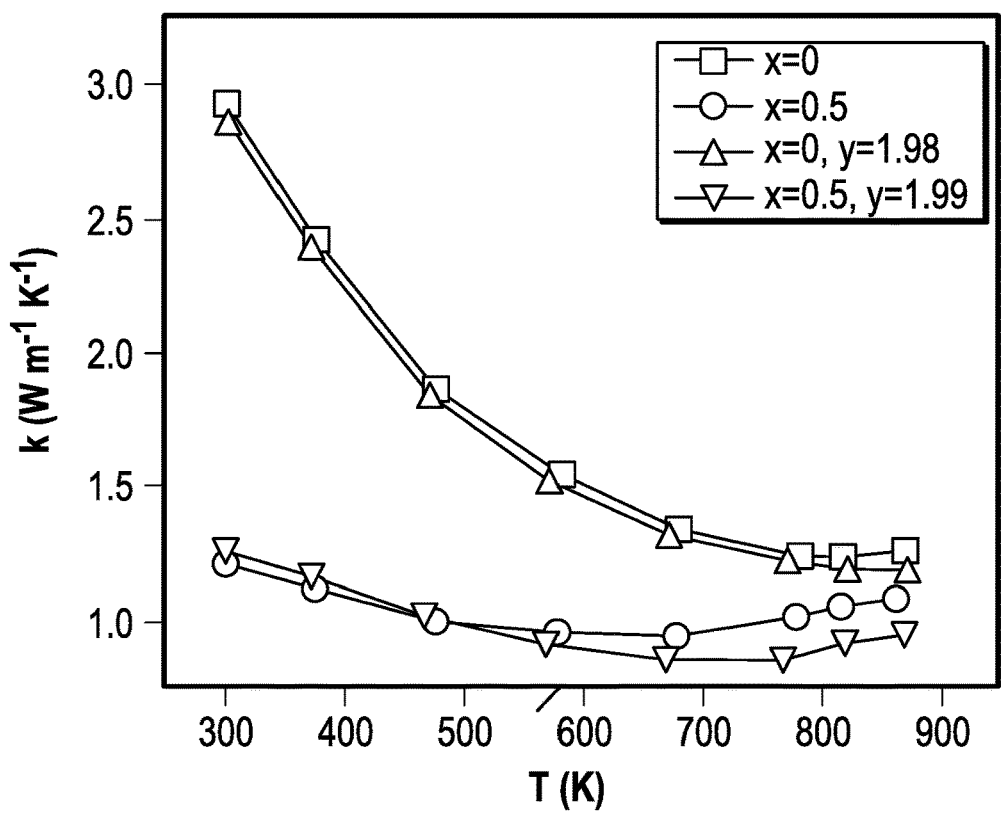
FIGS. 9A-9F illustrate thermoelectric properties of p-type thermoelectric materials fabricated according to certain embodiments of the present disclosure.
Figure 9B:
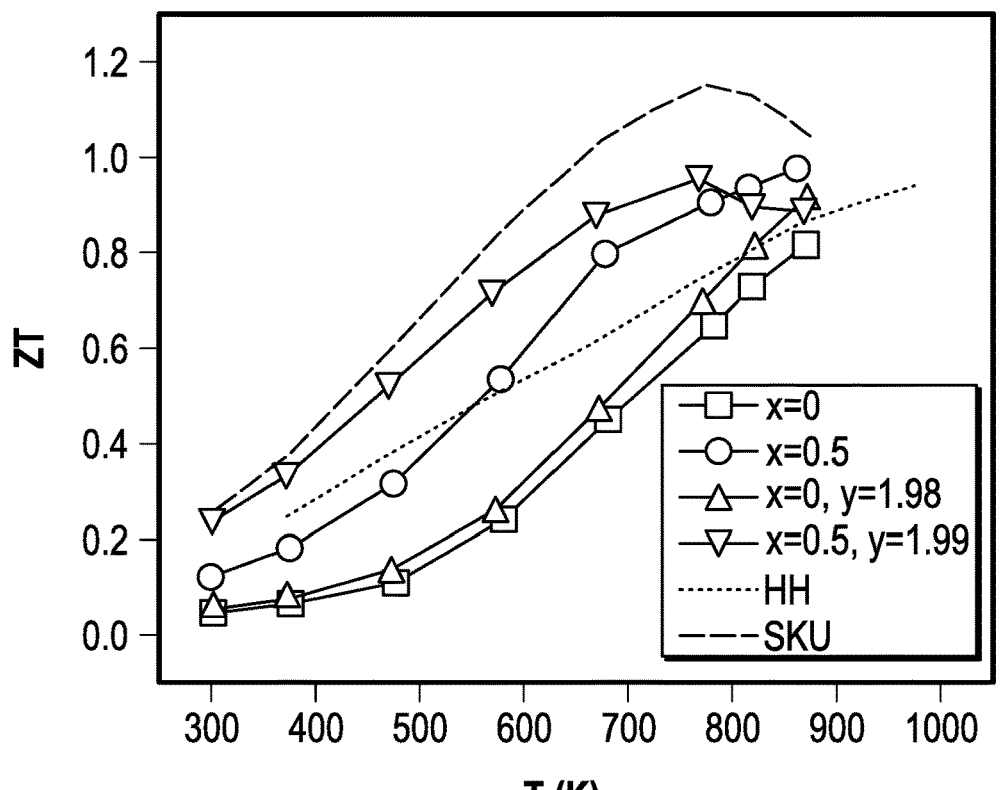
Figure 9C:
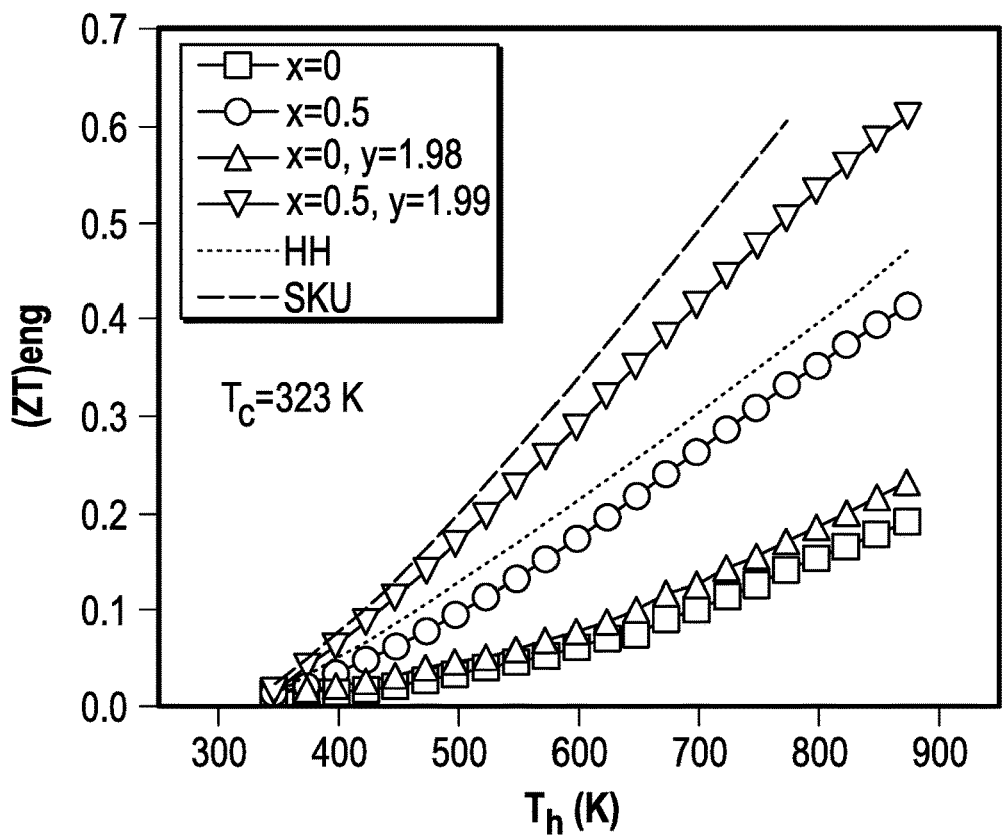
Figure 9D:
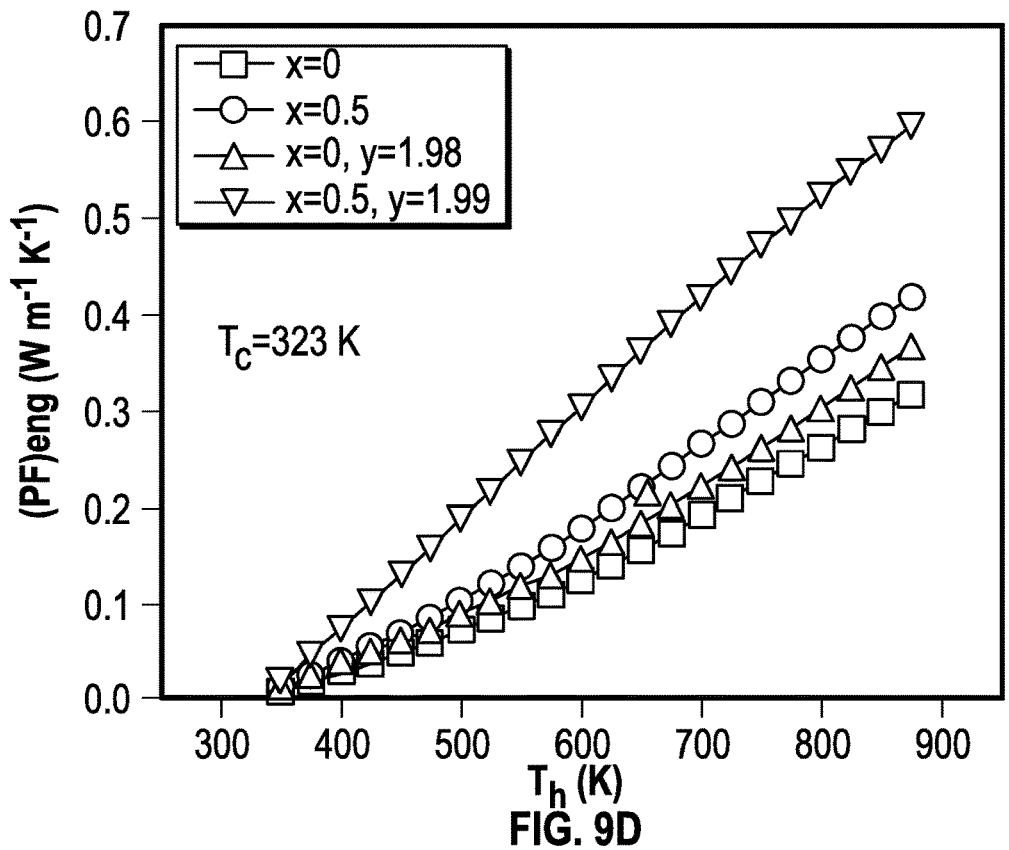

FIGS. 9A-9F illustrate thermoelectric properties of $Ca_{1-x}Yb_xMg_2Bi_2$ samples, fabricated according to certain embodiments of the present disclosure. The thermal conductivity (FIG. 9A) decreases a little at higher temperature for Bi-reduced samples. As a result, ZT values (FIG. 9B), especially the ZT values at low temperatures, drastically increase for both Bi-reduced compounds $CaMg_2Bi_{1.98}$ and $Ca_{0.5}Yb_{0.5}Mg_2Bi_{1.99}$ although the peak ZT values do not differ substantially. The same method was used to calculate $(ZT)_{eng}$ (FIG. 9C) and $(PF)_{eng}$ (FIG. 9D) dependence of the hot side temperature up to 873 K while the cold side temperature was kept at 323 K. FIG. 9C shows the $(ZT)_{eng}$ of $Ca_{0.5}Yb_{0.5}Mg_2Bi_{1.99}$ can reach 0.6, 50% higher than that of $Ca_{0.5}Yb_{0.5}Mg_2Bi_2$. The $(PF)_{eng}$ of $Ca_{0.5}Yb_{0.5}Mg_2Bi_{1.99}$ also increases 50% due to the relatively higher power factor in the entire temperature range as shown in FIG. 9D.

Figure 9E:
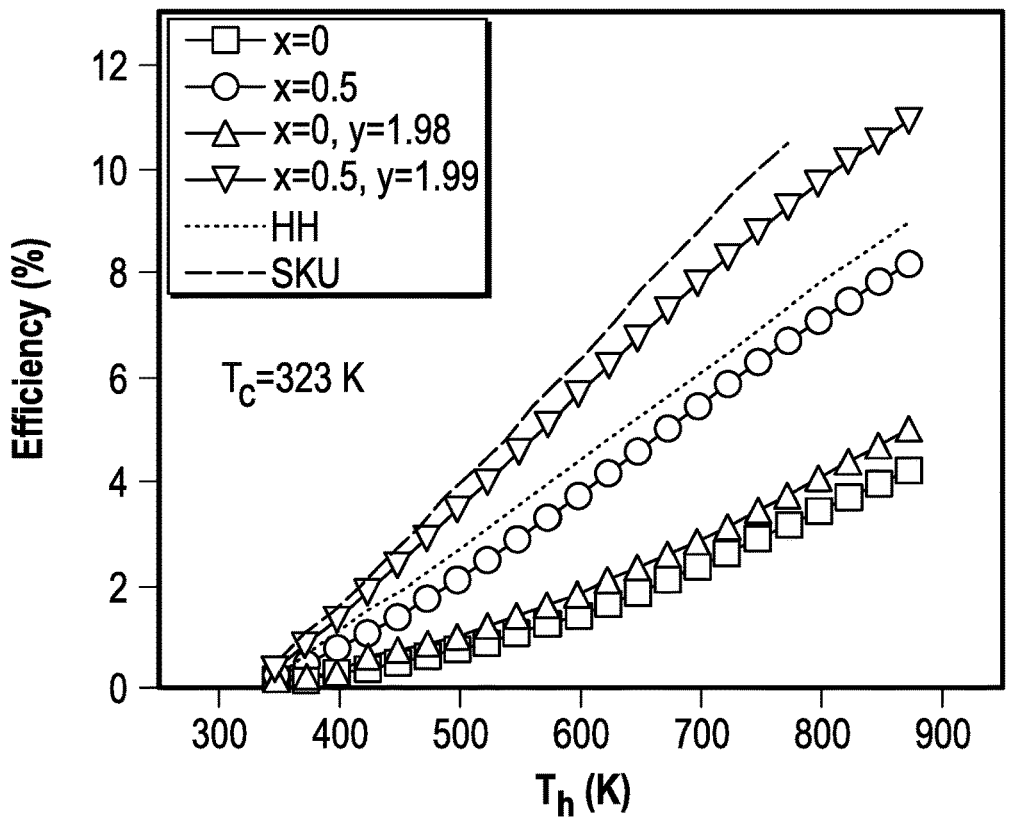
Figure 9F:
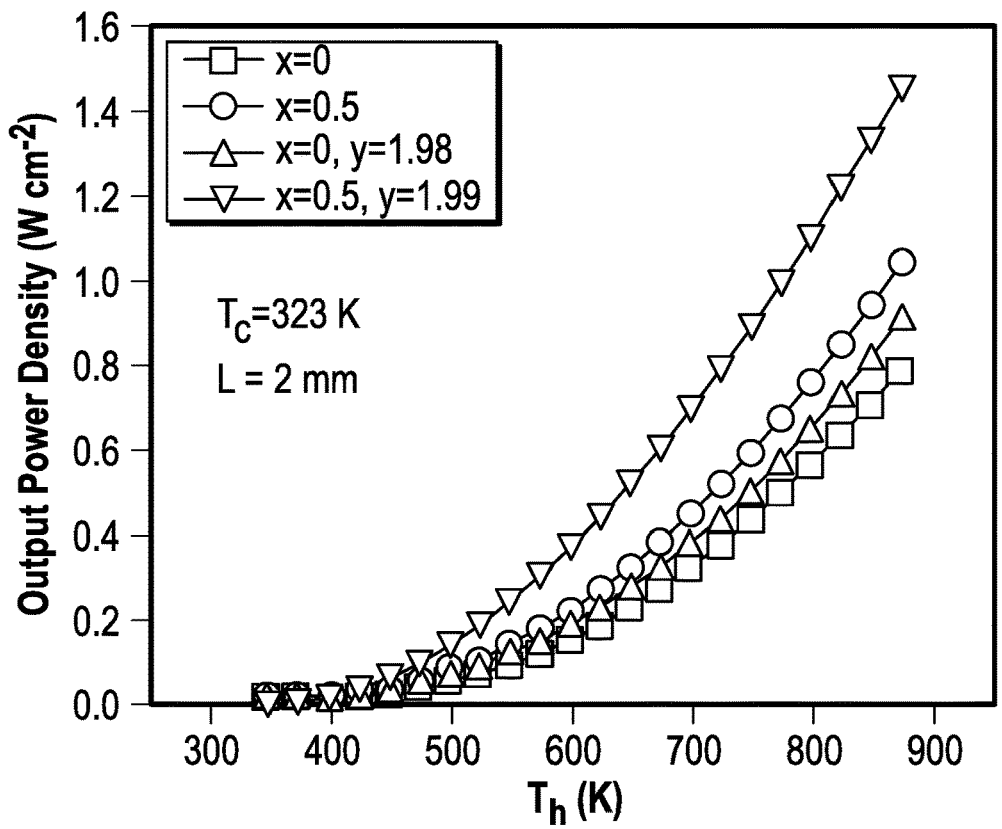

The calculated efficiency and output power density based on $(ZT)_{eng}$ and $(PF)_{eng}$ are shown in FIGS. 9E and 9F. A conversion efficiency about 11.3% and output power density of 1.5 W cm$^{-2}$ are expected for Bi-reduced samples $Ca_{0.5}Yb_{0.5}Mg_2Bi_{1.99}$, which are significantly higher than those of the samples with Bi impurity. The enhancement of thermoelectric performance comes mainly from purifying the phase by reducing Bi concentration.

The efficiency about 11% for Th of 873 K and $T_h$ of 323 K makes this material (industrially) competitive with half-Heusler and skutterudites for power generation in this temperature range. For comparison, the efficiency of two half-Heusler and skutterudites are shown in FIG. 9E for comparison. The hot side temperature for skutterudites is 773 K since it becomes unstable when $T_h$ is larger than that. In the same temperature range, the efficiency of $Ca_{0.5}Yb_{0.5}Mg_2Bi_{1.99}$ is even higher than that of half-Heusler, just a little lower than that of skutterudites. Such a good efficiency makes this material a potential p-type thermoelectric material to pair with the existing n-type materials.

Fabrication of Additional P-Type Zintl Compounds $AM_2X_2$

Sample Fabrication: Calcium (Ca, Sigma Aldrich, 99.9%, pieces), ytterbium (Yb, Sigma Aldrich, 99.9%, cubes), europium (Eu, Atlantic, 99.9%, cubes), zinc (Zn, Sigma Aldrich, 99.9%, powder), and antimony (Sb, Sigma Aldrich, 99.999%, chunks) were weighed according to the stoichiometry of $Ca_{1-x}Yb_xZn_2Sb_2$ with x=0, 0.25, 0.5, 0.75, and 1, $EuZn_2Sb_2$, $Eu_{0.5}Yb_{0.5}Zn_2Sb_2$, $Eu_{0.5}Ca_{0.5}Zn_2Sb_2$, and then loaded in a stainless steel jar with stainless steel balls for mechanical alloying by a high energy ball mill (SPEX 8000D) for 12 h, which resulted in nanopowders. The final nanopowder was then loaded into a graphite die with an inner diameter of 12.7 mm, and consolidated by alternating current (AC) hot pressing at ~923 K for 2 min.

Material Characterization. A PANalytical multipurpose diffractometer with an X'celerator detector (PANalytical X'Pert Pro) was used to characterize the bulk sample after ball milling and hot pressing. The lattice constants of $Ca_{1-x}Yb_xZn_2Sb_2$ (x=0, 0.5, and 1), $EuZn_2Sb_2$, $Eu_{0.5}Ca_{0.5}Zn_2Sb_2$, and $Eu_{0.5}Yb_{0.5}Zn_2Sb_2$ were calculated by Rietveld refinement using the Fullprof software. Morphology and elemental ratios of the samples were characterized by scanning electron microscopy (SEM, LEO 1525) and Electron Probe Micro-Analysis (EPMA, JXA-8600), respectively. Transmission electron microscopy (TEM, JEOL 2100F) was used to analyze the detailed microstructures.

The electrical resistivity (ρ) and Seebeck coefficient (S) were simultaneously measured on a commercial system (ZEM-3, ULVAC) using four-point direct current switching method and static temperature difference method. The thermal conductivity was measured by measuring the thermal diffusivity (D) on a laser flash apparatus (LFA 457, NETZSCH), specific heat ($C_p$) on a DSC (404 C, NETZSCH), and volumetric density ($ρ_D$) by Archimedes method. The carrier concentration was obtained by Hall effect measurement (Van der Pauw method) at room temperature using a modified sample puck in Physical Properties Measurement System (PPMS D060, Quantum Design) under 3 Tesla magnetic field.

Figure 10:
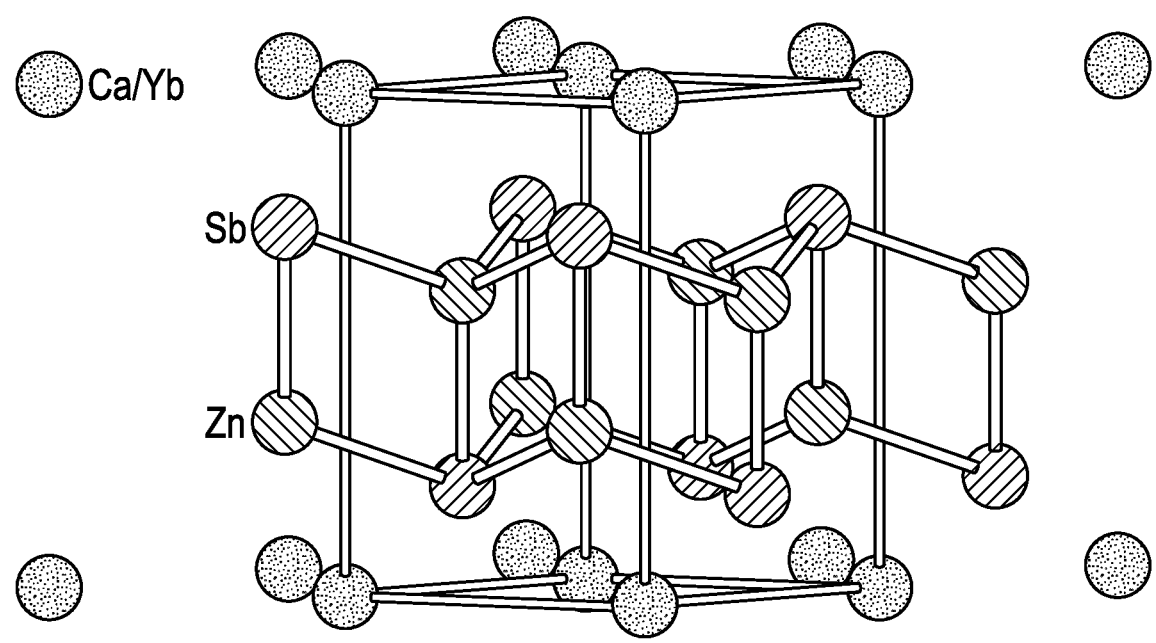
FIG. 10 is a schematic illustration of an exemplary crystal structure of p-type thermoelectric materials fabricated according to certain embodiments of the present disclosure.
Figure 11A:
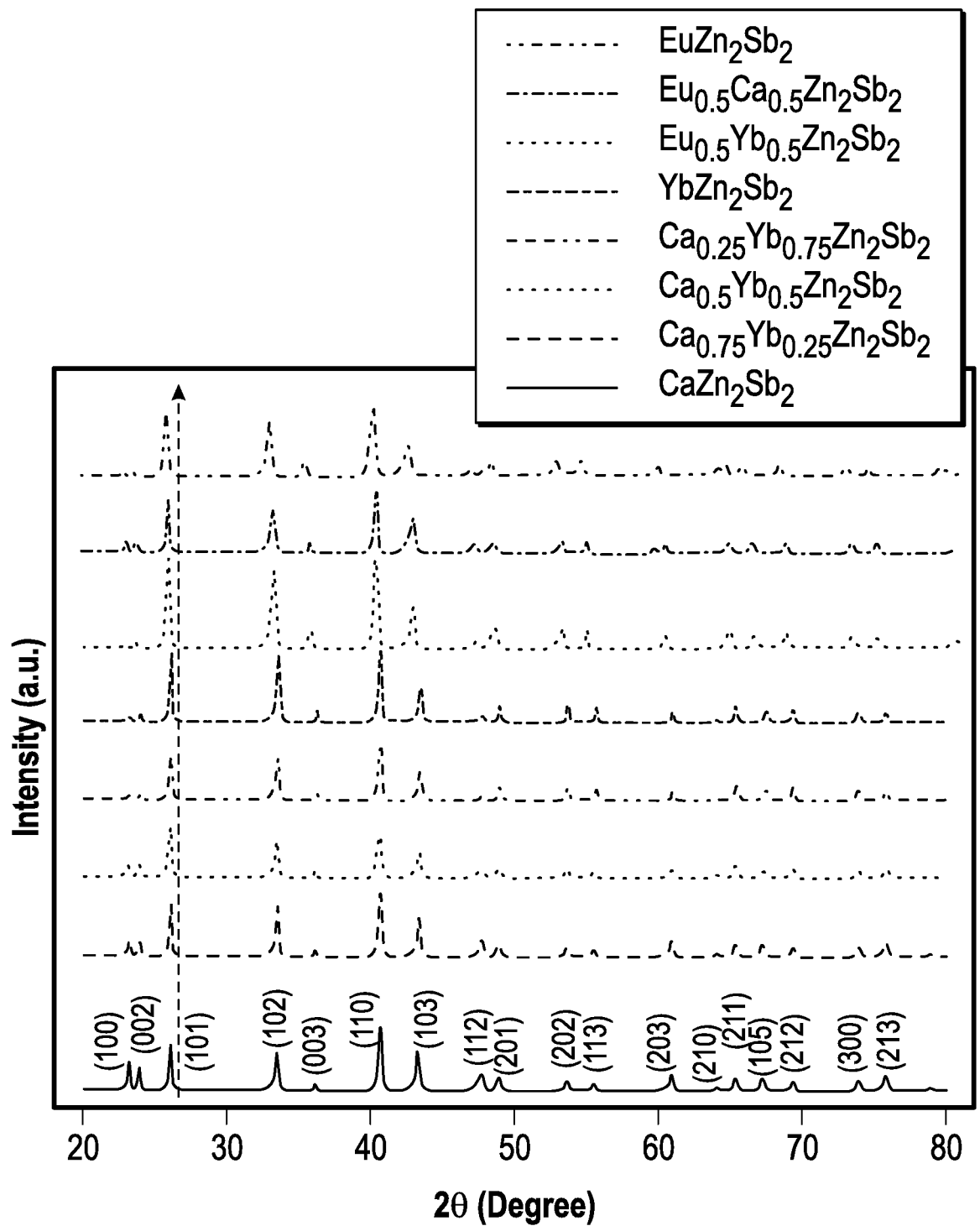
FIG. 11A illustrates XRD patterns for p-type thermoelectric materials fabricated according to certain embodiments of the present disclosure.
Figure 11B:
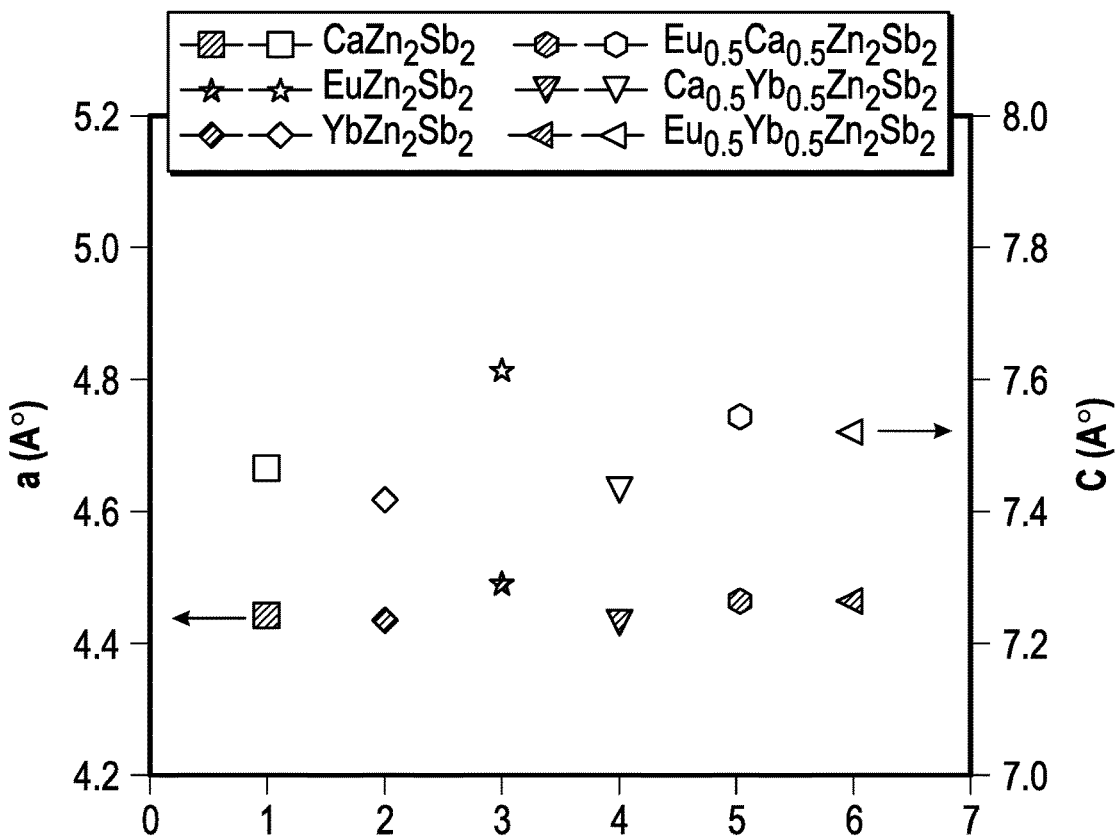
FIG. 11B illustrates refined lattice parameters a and c for p-type thermoelectric materials fabricated according to certain embodiments of the present disclosure.

FIG. 10 is a schematic illustration of the crystal structure of $AM_2X_2$ fabricated according to certain embodiments of the present disclosure. FIG. 11A illustrates the XRD patterns of $Ca_{1-x}Yb_xZn_2Sb_2$ (x=0, 0.25, 0.5, 0.75, and 1), $Eu_{0.5}Yb_{0.5}Zn_2Sb_2$, $Eu_{0.5}Ca_{0.5}Zn_2Sb_2$, and $EuZn_2Sb_2$. All of the diffraction peaks are indexed according to the previously reported structure of $CaAl_2Si_2$ (space group P$\bar{3}$m1, No. 164). All the samples were found to be phase pure in the XRD detection limit. However, when a melting method, in contrast to ball-milling and hot-pressing, is used for fabrication, impurity phases, such as ZnSb, $Zn_4Sb_3$, and $M_9Zn_{4.5}Sb_9$ (M=Yb, Eu), may be present in the material. Little variation is observed in the lattice parameters of all $Ca_{1-x}Yb_xZn_2Sb_2$ compounds because of similar atomic size of Ca (194 pm) and Yb (197 pm). The Eu containing compounds showed a larger lattice parameter with increasing Eu fraction, consistent with the bigger atomic radius of Eu (204 pm). The refined unit cell parameters a and c of each compound are shown in FIG. 11B.

Figure 12A:
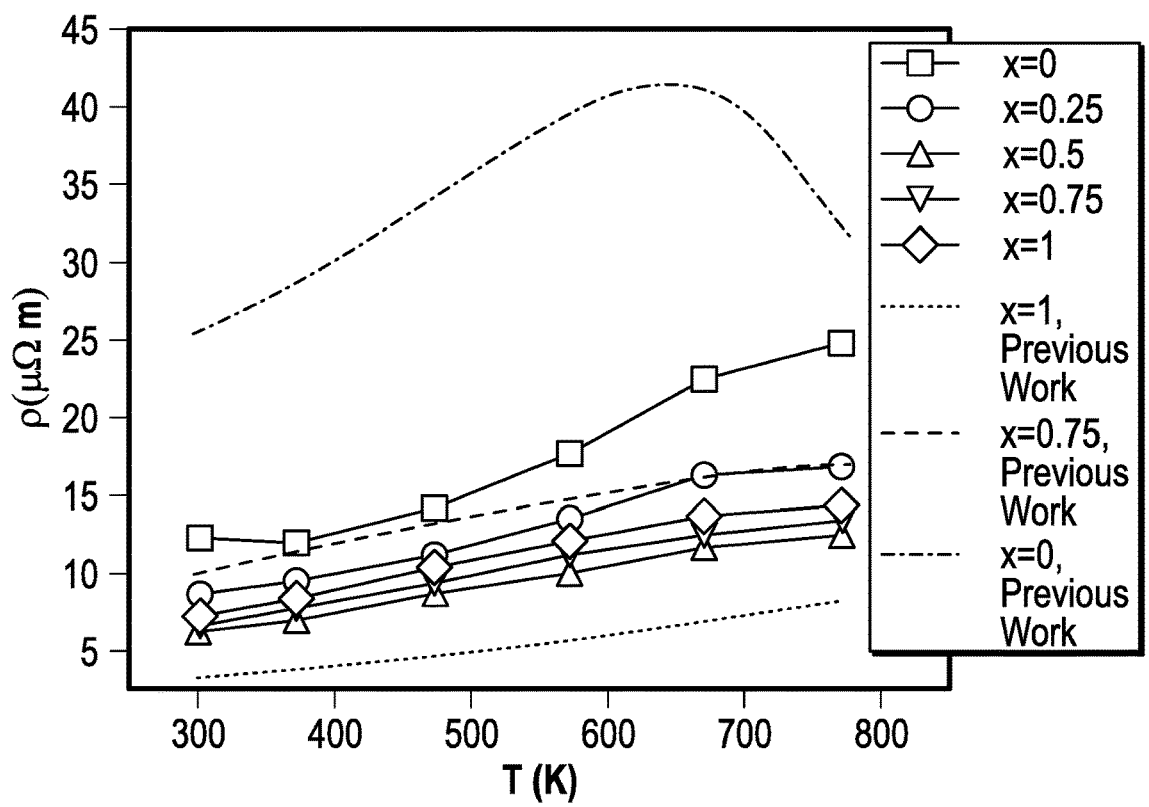
FIGS. 12A-12F are graphs illustrating temperature dependent thermoelectric properties of p-type thermoelectric materials fabricated according to embodiments of the present disclosure as compared to reference compounds.

FIGS. 12A-12C, and 12E illustrate the temperature dependence of the electrical resistivity (FIG. 12A, 12B) and the Seebeck coefficient (FIG. 12C) of all ball milled and hot pressed $Ca_{1-x}Yb_xZn_2Sb_2$ compounds. The observed behavior of both the resistivity and Seebeck coefficient indicates typical behavior of a degenerate semiconductor. The electrical resistivity and Seebeck coefficient increase with temperature. As shown in FIG. 12A, by increasing Yb content, the resistivity is decreased with x<0.5 and then increased a little. For comparison, the resistivity and Seebeck coefficient of three representative samples by the previously employed melting method ($CaZn_2Sb_2$, $YbZn_2Sb_2$, and $Ca_{0.25}Yb_{0.75}Zn_2Sb_2$) previously reported are shown. Clearly, $CaZn_2Sb_2$ (x=0) prepared by melting shows much higher resistivity and also higher Seebeck coefficient, while $YbZn_2Sb_2$ (x=1) by melting method exhibits lower resistivity and much lower Seebeck coefficient. The optimized sample $Ca_{0.25}Yb_{0.75}Zn_2Sb_2$ (x=0.75) via ball milling shows a lower resistivity and higher Seebeck coefficient than the same composition by melting. For $Ca_{1-x}Yb_xZn_2Sb_2$ samples by melting, the electric resistivity drops sharply from 23.7 μΩm to 3.2 μΩm as Yb content increases, which attributes to the increased Yb vacancies. The melting method would introduce A-site vacancies by forming ZnSb impurity in the previous studies. Deficiency of A-site cations leads to fewer electrons in the bonding and anti-bonding states, which would contribute to the lower resistivity by increasing the hole carrier concentration. At the same time, the increased carrier concentration would contribute to the reduction in Seebeck coefficient for melting samples based on Pisarenko relations with the assumption of similar effective previously reported.

Figure 12B:
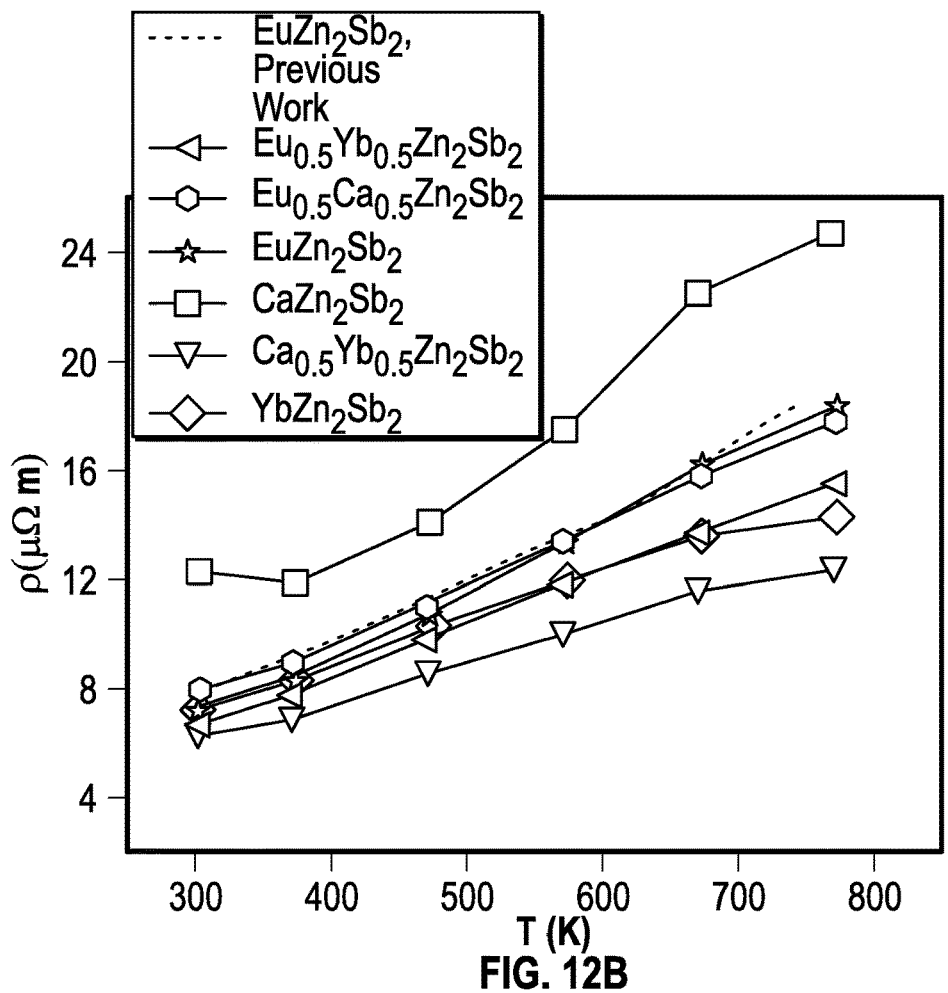
Figure 12C:
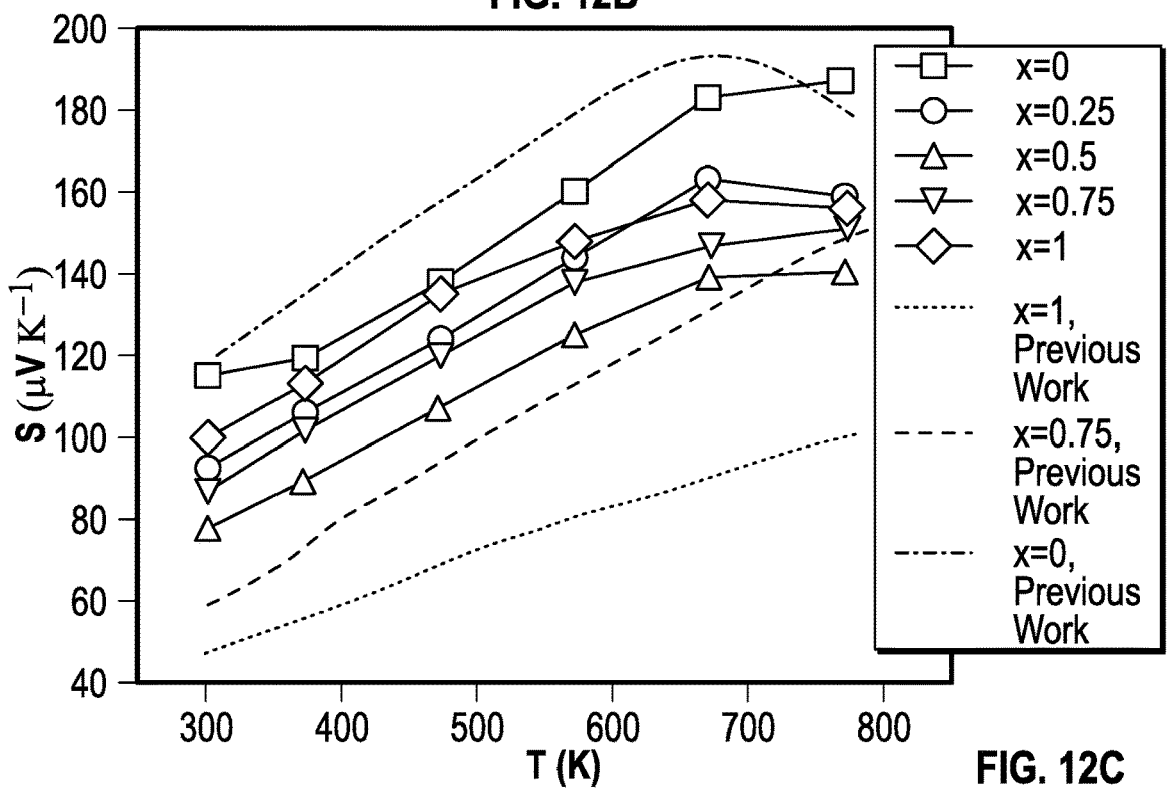
Figure 12D:
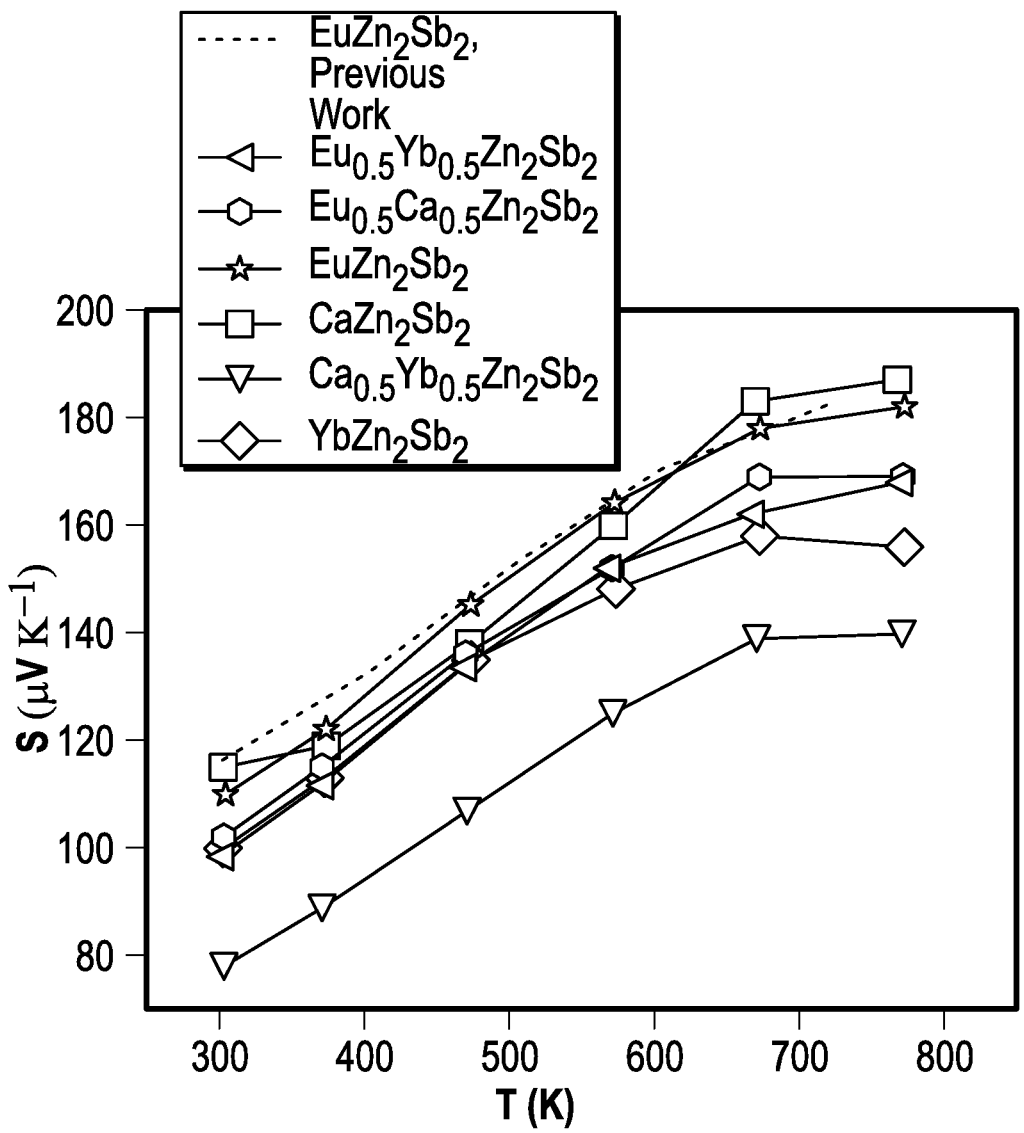
Figure 12E:
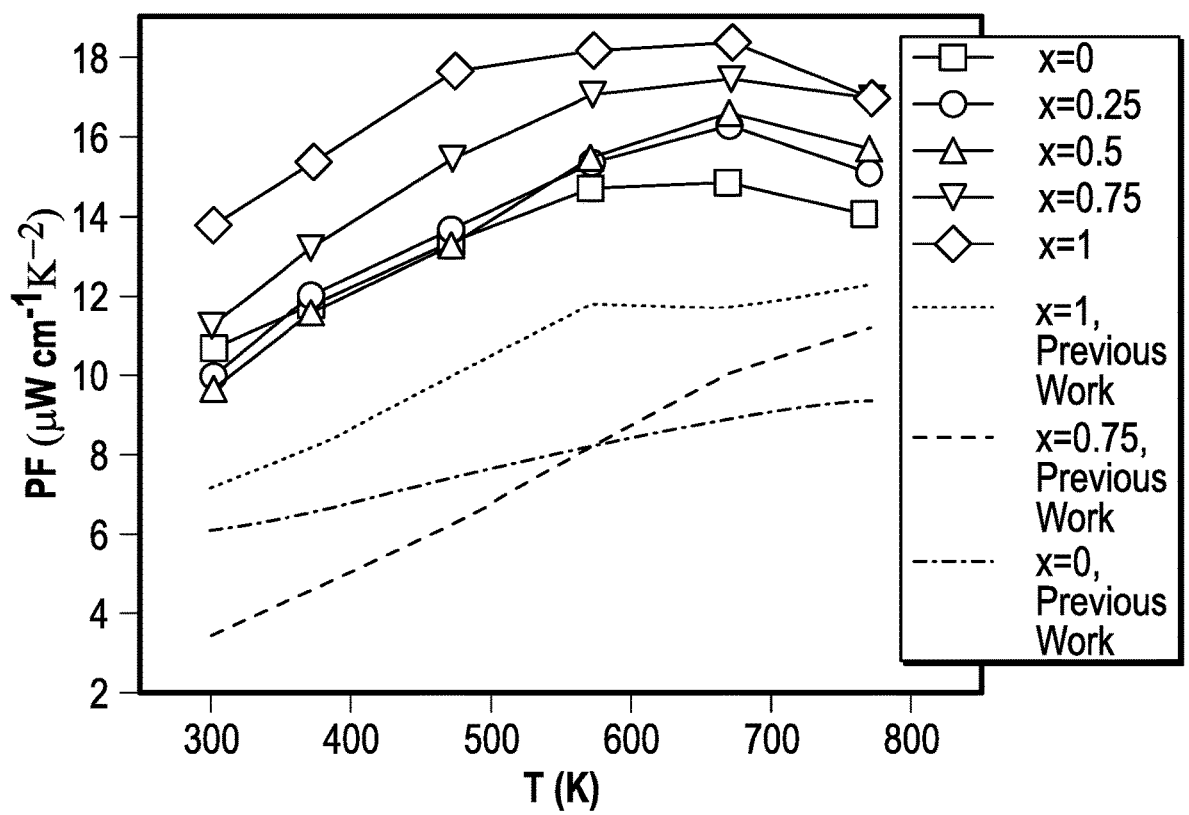
Figure 12F:
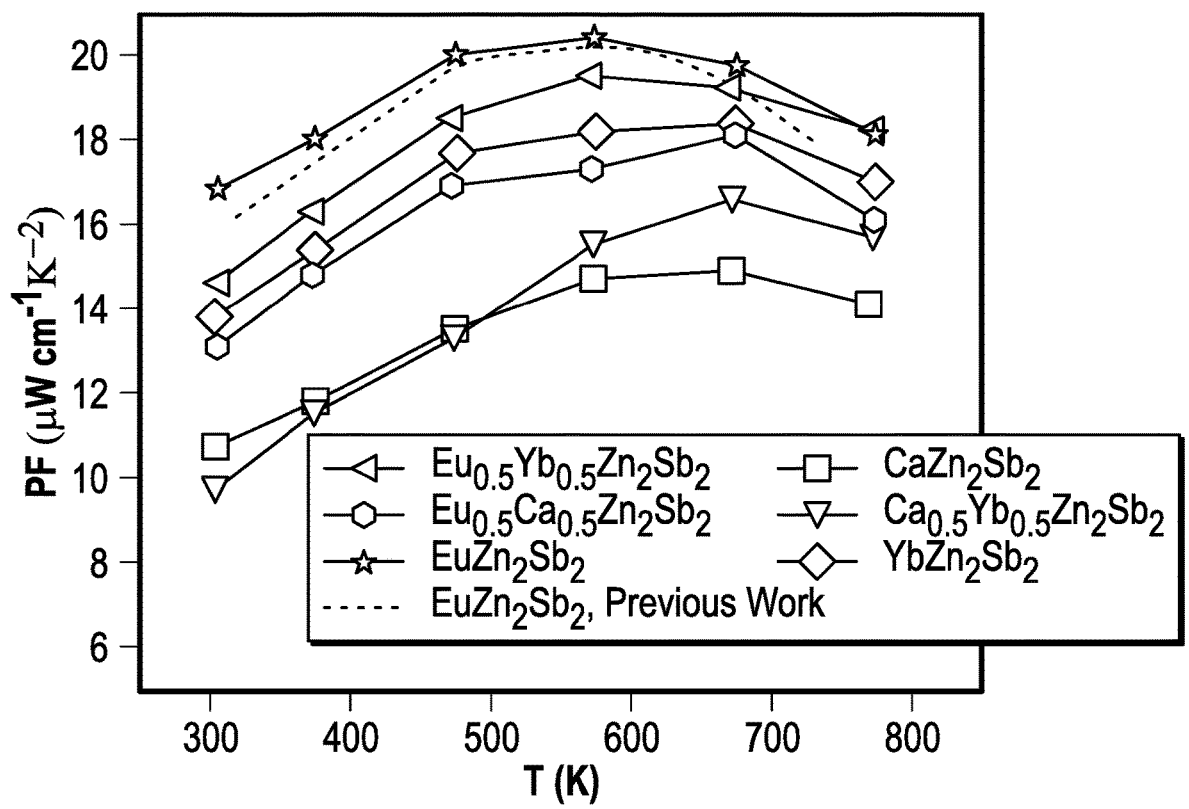

FIGS. 12B, 12D, and 12F illustrate the electric transport properties of ball milled and hot pressed Eu-containing samples $EuZn_2Sb_2$ and $Eu_{0.5}A_{0.5}Zn_2Sb_2$ (A=Yb, Ca) fabricated according to embodiments of the present disclosure. The properties of those samples are shown in comparison with $CaZn_2Sb_2$, $YbZn_2Sb_2$, and $Ca_{0.5}Yb_{0.5}Zn_2Sb_2$ in FIGS. 12B and 12D. The resistivity of $EuZn_2Sb_2$ is higher than $YbZn_2Sb_2$ but lower than $CaZn_2Sb_2$. The Eu alloyed compounds ($Eu_{0.5}Ca_{0.5}Zn_2Sb_2$ and $Eu_{0.5}Yb_{0.5}Zn_2Sb_2$) appear to have intermediate properties. The resistivity and Seebeck coefficient of $EuZn_2Sb_2$ did not differ greatly from those values associated with the previously reported samples fabricated by melting.

FIGS. 12E and 12F illustrate the power factor (PF=$S^2/\rho$) calculated from the measured electrical resistivity and Seebeck coefficient. As shown in FIG. 12E, at a higher Yb concentration, the power factor of $Ca_{1-x}Yb_xZn_2Sb_2$ samples increases. Compared with the three samples prepared by melting method and illustrated by the dotted lines in FIG. 12E, the power factors of the samples fabricated by hot pressing and ball milling are ~100% higher, mainly due to the higher phase purity. Among all the samples shown in FIG. 12F, $EuZn_2Sb_2$ possesses the highest power factor of ~21 μW cm$^{-1}$ K$^{-2}$.

The carrier concentration (n) and Hall mobility (μ) are listed in Table 3, related to electrical resistivity by 1/ρ=neμ. To compare the effect of ball milling method with melting method on the properties of $Ca_{1-x}Yb_xZn_2Sb_2$, the resistivity and carrier concentration in terms of Yb concentration is plotted in FIG. 13A. With increasing Yb concentration, the carrier concentration of samples by melting increases from 3.1 to 15×10$^{19}$ cm$^{-3}$ and resistivity decreases sharply, as a result of increased vacancies in Yb-site by melting method. However, for the samples prepared by ball milling method, the highest carrier concentration is ~8.75×10$^{18}$ cm$^{-3}$, found in $Ca_{0.5}Yb_{0.5}Zn_2Sb_2$, half of that in $YbZn_2Sb_2$ by melting.

TABLE 3

Room-temperature thermoelectric transport properties of $Ca_{1-x}Yb_xZn_2Sb_2$, $EuZn_2Sb_2$, $Eu_{0.5}Ca_{0.5}Zn_2Sb_2$, and $Eu_{0.5}Yb_{0.5}Zn_2Sb_2$.

| $Ca_{1-x}Yb_xZn_2Sb_2$ | x = 0 | x = 0.25 | x = 0.5 | x = 0.75 | x = 1 |
|---|---|---|---|---|---|
| Carrier concentration (10$^{19}$ cm$^{-3}$) | 5.92 | 6.91 | 8.72 | 6.08 | 4.14 |
| Hall mobility (cm$^2$ V$^{-1}$ s$^{-1}$) | 85.9 | 105 | 115 | 152 | 209 |
| Effective mass (m$_e$) | 1.02 | 0.85 | 0.81 | 0.73 | 0.66 |

| $AZn_2Sb_2$ | A = Eu | A = $Eu_{0.5}Ca_{0.5}$ | A = $Eu_{0.5}Yb_{0.5}$ |
|---|---|---|---|
| Carrier concentration (10$^{19}$ cm$^{-3}$) | 3.60 | 5.11 | 4.49 |
| Hall mobility (cm$^2$ V$^{-1}$ s$^{-1}$) | 240 | 153 | 210 |
| Effective mass (m$_e$) | 0.69 | 0.79 | 0.69 |

Figure 13A:
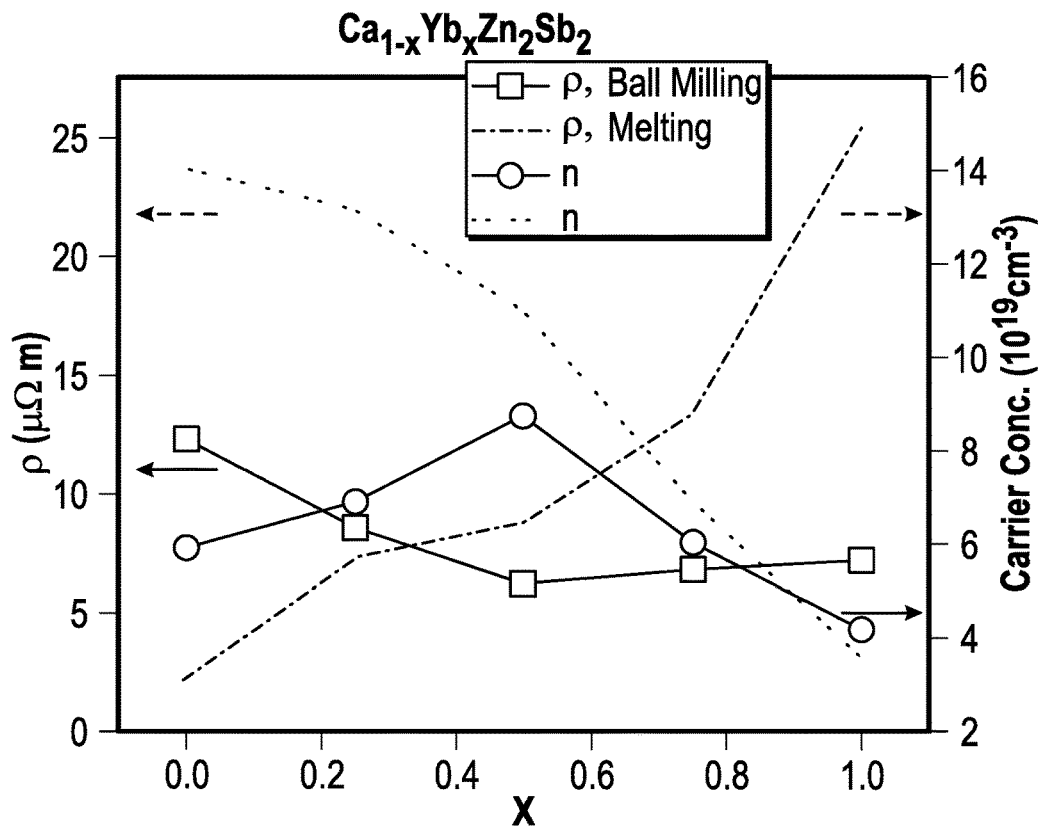
FIG. 13A is a graph illustrating the room temperature resistivity and carrier concentration comparison for samples of p-type thermoelectric materials fabricated according to embodiments of the present disclosure.
Figure 13B:
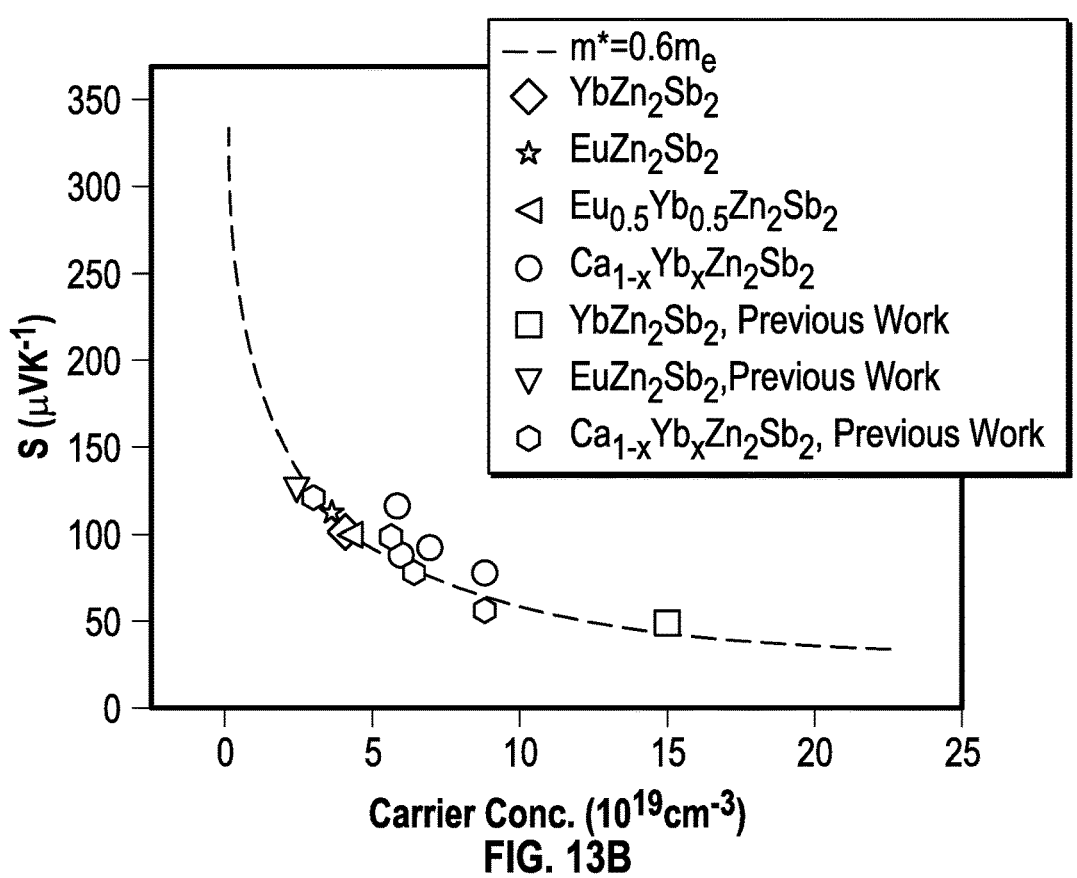
FIG. 13B is a graph illustrating Seebeck coefficients dependence of carrier concentration n in accordance with a single band model with m*=0.6 $m_e$ at 300K for samples of p-type thermoelectric materials fabricated according to embodiments of the present disclosure.
Figure 13C:
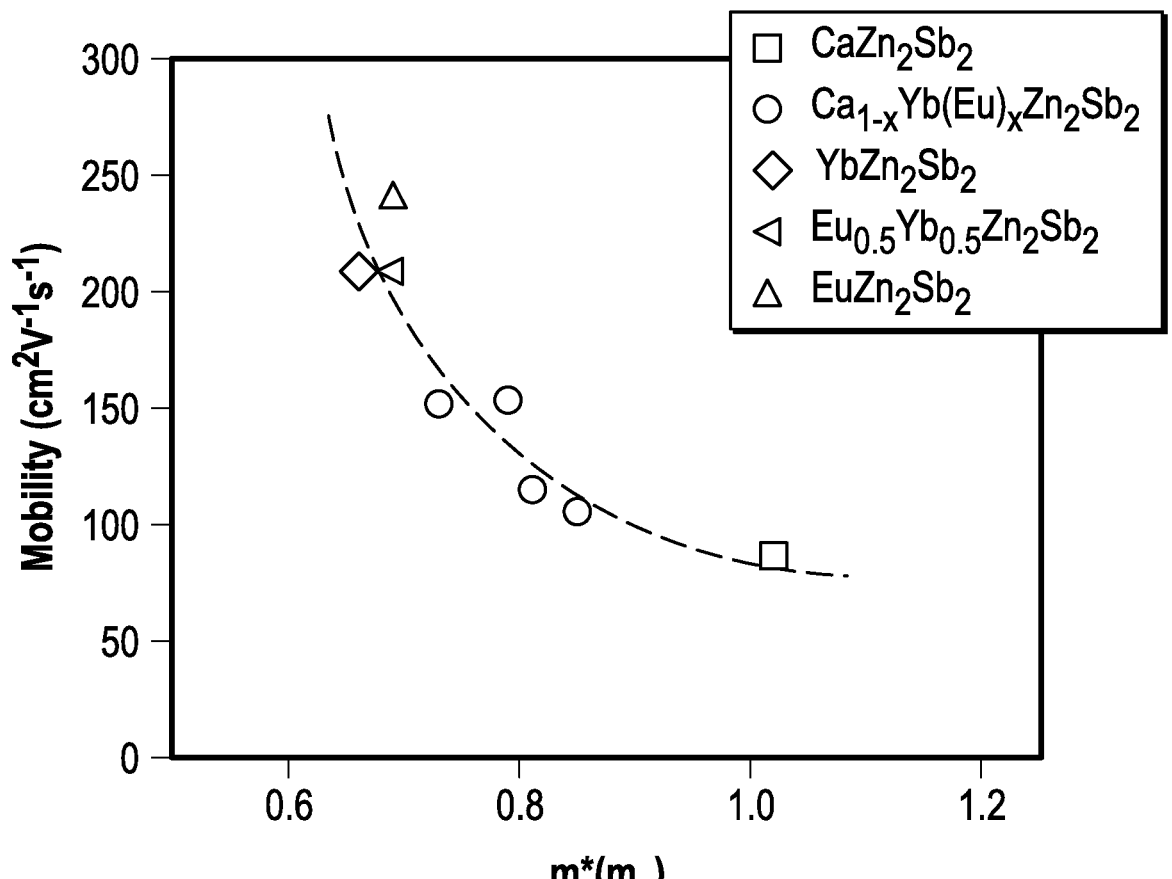
FIG. 13C is a graph illustrating Carrier mobility verses effective mass for samples of p-type thermoelectric materials fabricated according to embodiments of the present disclosure.

FIGS. 13A-13C illustrate the carrier concentration as a function of the resistivity (FIG. 13A) and the Seebeck coefficient (FIG. 13B), as well as the Hall mobility (FIG. 13C). The single parabolic band model has been successfully applied in the Zintl $AZn_2Sb_2$ system and the DFT calculation has also demonstrated that $AZn_2Sb_2$ contains three bands at the valence band edge that are degenerate at Γ point, which can be modeled as a single parabolic band with a single combined effective mass. Previous studies show those Zintl compounds have similar effective mass of ~0.6 m$_e$. Here the Pisarenko relations are plotted in FIG. 13B by using a density of states (DOS) effective mass m*=0.6 m$_e$ and assuming acoustic phonons are the primary scattering sources. The well-established Pisarenko relations between the Seebeck coefficient and carrier concentration gives a good description of experimental data for rare earth alloyed $AZn_2Sb_2$ samples. However, for Ca-rich $AZn_2Sb_2$, the enhanced Seebeck coefficient lying well above the Pisarenko line indicates an increase in the density of state mass.

To calculate each sample's DOS effective mass, an estimation can also be obtained by using SPB model. The Ca-rich compound shows higher effective mass than rare earth-rich compounds, and with more Ca, the effective mass gradually increases (Table 3). With increasing Ca concentration, the Hall mobility (FIG. 13C) gradually decreases to 85.9 cm$^2$ V$^{-1}$ s$^{-1}$ in CaZn$_2$Sb$_2$. The extremely high mobility ~240 cm$^2$ V$^{-1}$ s$^{-1}$ is found in EuZn$_2$Sb$_2$. Although higher concentration would lead to lower mobility, the big difference in mobility between the rare earth and Ca alloyed AZn$_2$Sb$_2$ is surprising. The classical definition of mobility is ($\mu$=e$\tau$/m*). Previous studies assume the effective masses for all AZn$_2$Sb$_2$ samples are almost similar, the difference in mobility is most likely due to the changes in r arising from differences in microstructure and/or bonding features. Here, the experimental data for the samples by ball milling shows that the Hall mobility ($\mu$) decreases with increased effective mass (FIG. 13C). Therefore, the change of effective mass would also significantly change the mobility.

Figure 14A:
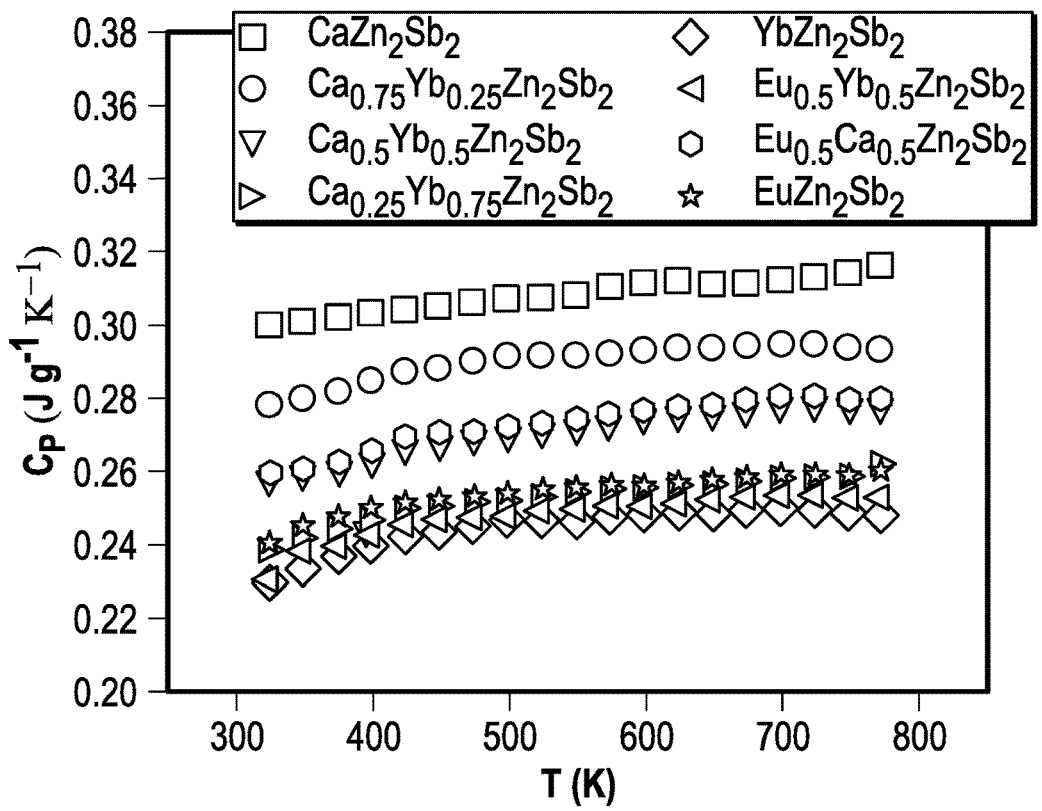
FIGS. 14A-14F illustrate temperature dependent thermal transport properties of p-type thermoelectric materials fabricated according to certain embodiments of the present disclosure.
Figure 14B:
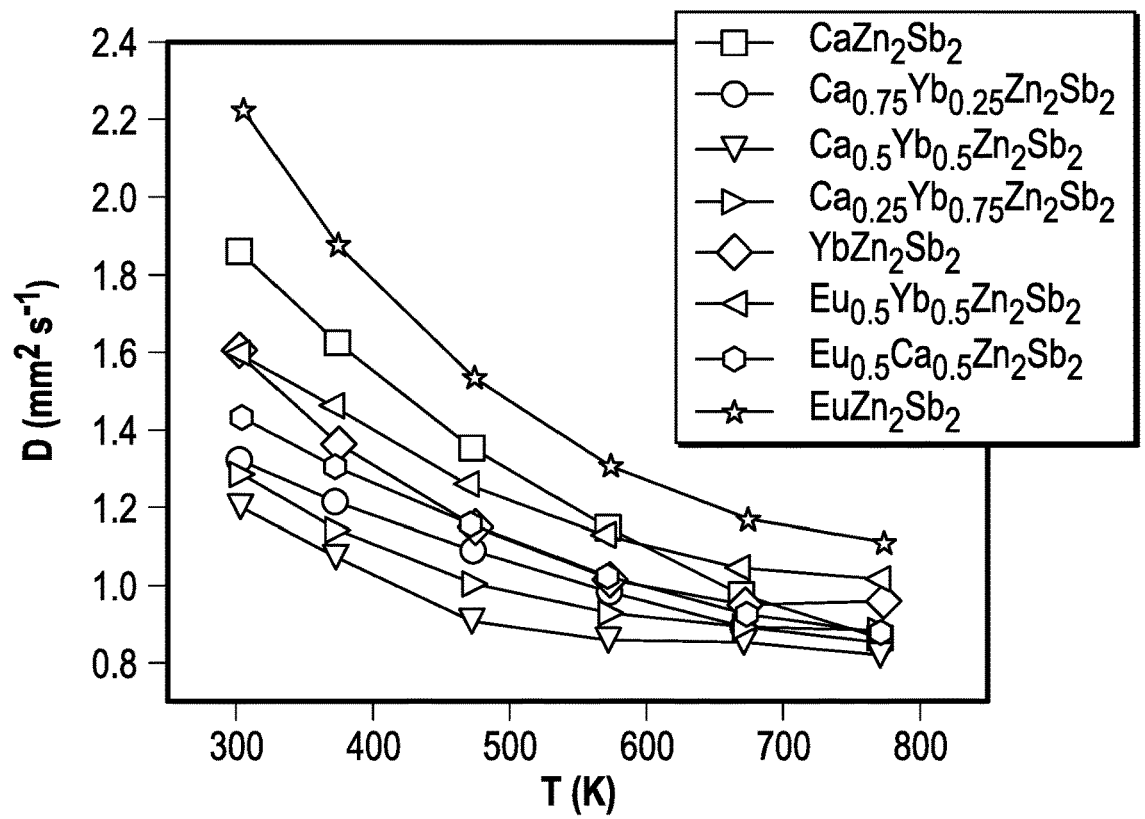
Figure 14C:
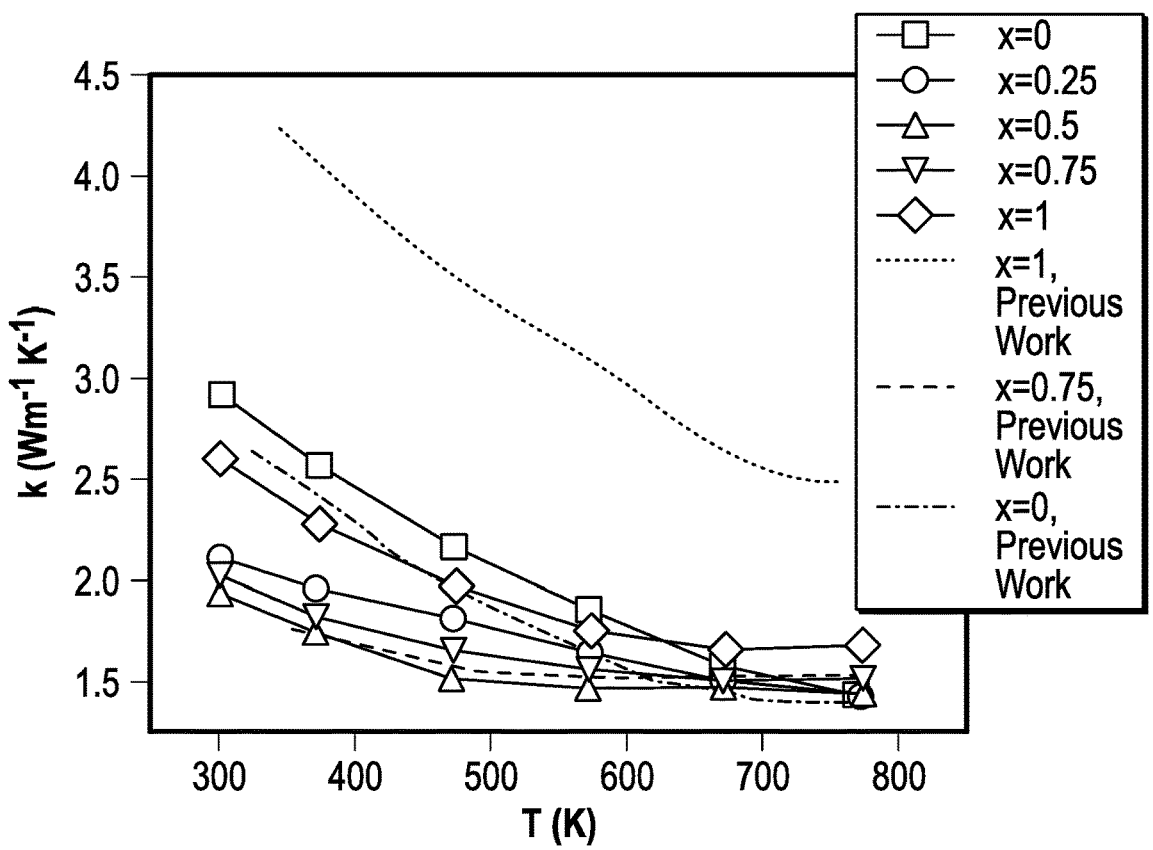

FIGS. 14A-14F illustrate the temperature-dependent thermal transport behavior of Ca$_{1-x}$Yb$_x$Zn$_2$Sb$_2$ and Eu alloyed AZn$_2$Sb$_2$ samples fabricated according to certain embodiments of the present disclosure. In particular, FIG. 14A illustrates the specific heat (C$_P$) for all samples, which decreases gradually from Ca rich samples to Yb/Eu rich samples because of the element's increased relative atomic mass. All the specific heat curves increase with temperature. FIG. 14B shows the thermal diffusivity of the samples. With increasing temperature, the diffusivity (D) of all samples shows a gradually decreasing tendency. C$_P$ and D are used to calculate the total thermal conductivity ($\kappa$) of all the samples by $\kappa$=D$\rho_D$C$_P$, where $\rho_D$ is the measured density of samples. As shown in FIG. 14C, the total thermal conductivity decreases dramatically in the mixed Ca/Yb compound for all Ca$_{1-x}$Yb$_x$Zn$_2$Sb$_2$ samples made by different methods, indicating alloying is quite effective in lowering the lattice thermal conductivity. The extremely high thermal conductivity in sample YbZn$_2$Sb$_2$ by melting is due to the increased electronic contribution $\kappa_e$, estimated using the Wiedemann-Franz relationship ($\kappa_e$=LT/$\rho$), where L is the Lorenz number, approximated using a single parabolic band model.

Figure 14D:
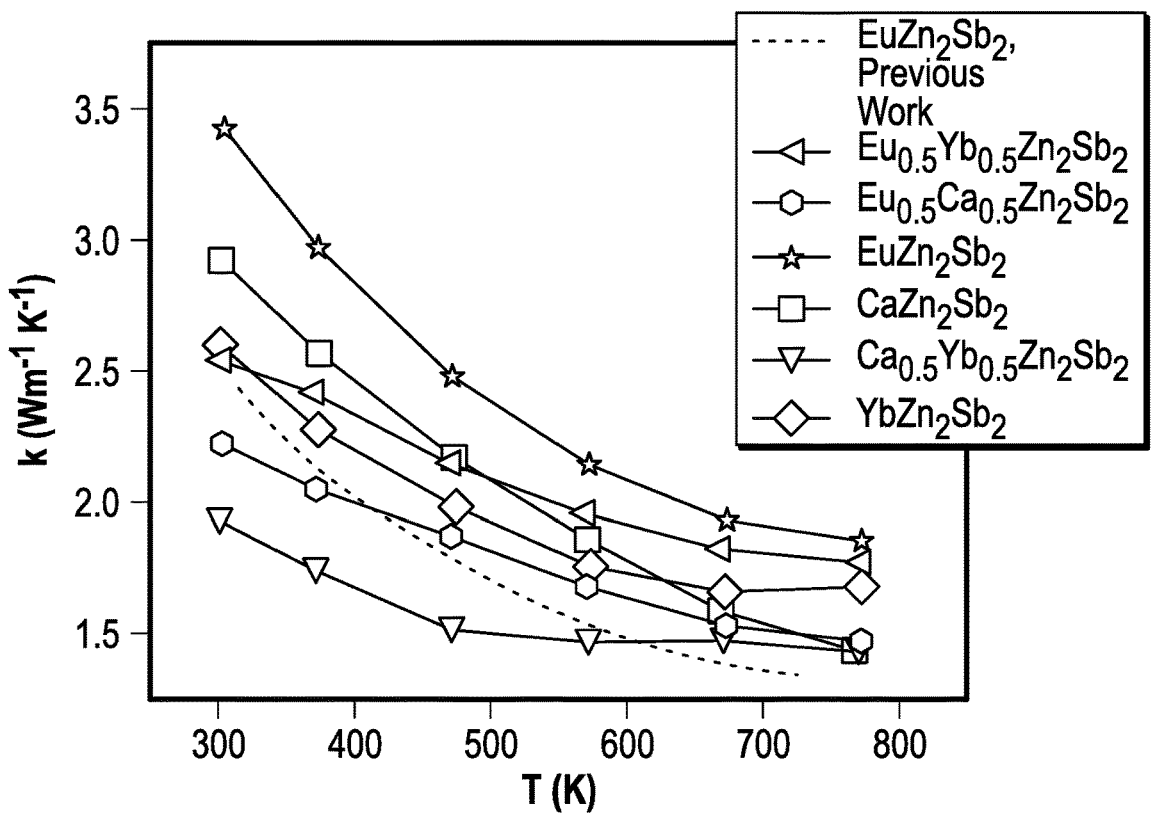
Figure 14E:
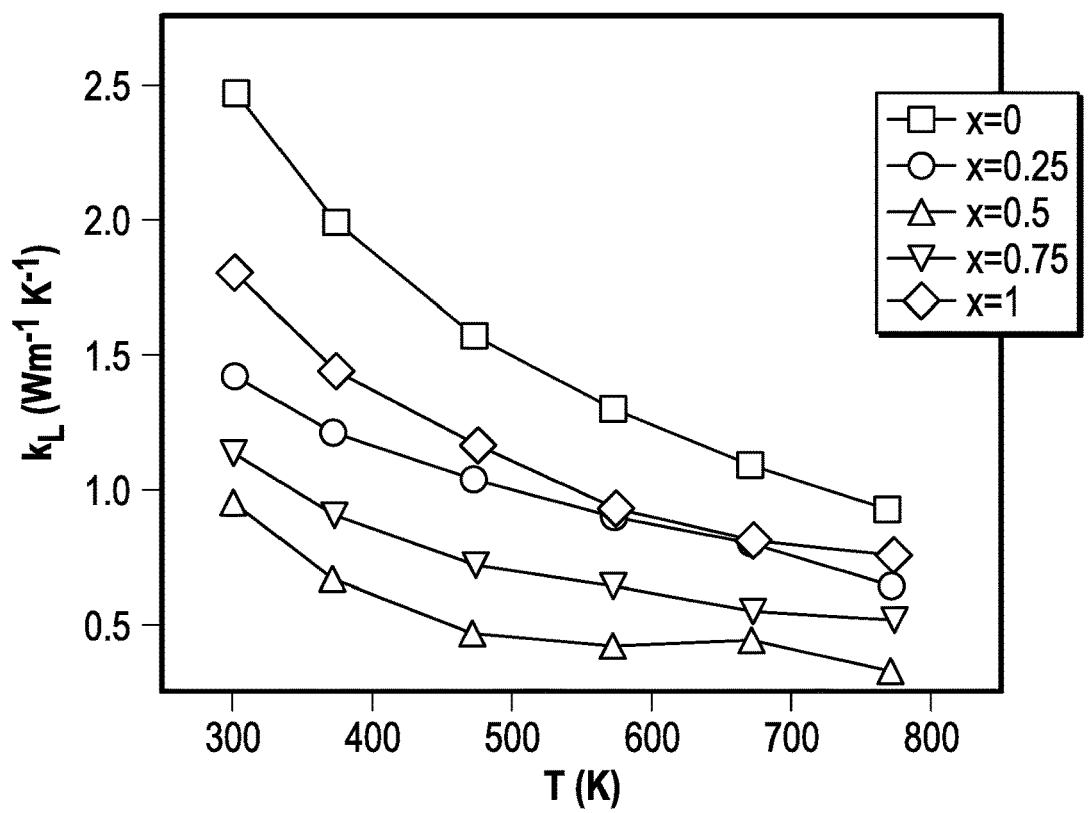
Figure 14F:
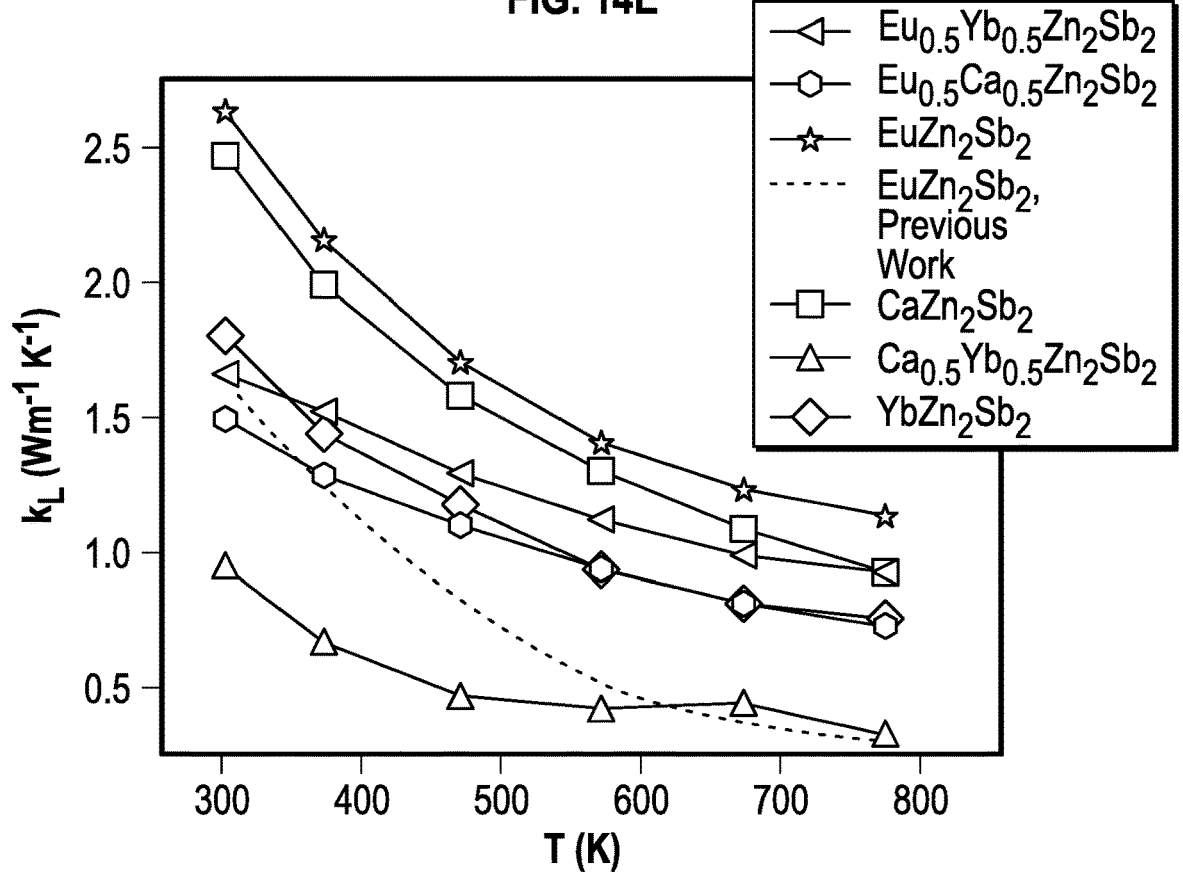

FIG. 14D shows that the mixed Ca with Yb/Eu samples exhibit lower thermal conductivity due to the mass fluctuations, while the mixed Eu/Yb samples isn't influenced by point defect scattering because of similar atomic mass. However, due to the considerable amounts of impurity phases Eu$_9$Zn$_{4.5}$Sb$_9$, the melting EuZn$_2$Sb$_2$ shows a little lower thermal conductivity than ball milling samples. By directly subtracting the electronic contribution from the total thermal conductivity, the lattice thermal conductivity ($\kappa_L$) were obtained and shown in FIGS. 14E and 14F The lattice thermal conductivity found in Ca$_{0.5}$Yb$_{0.5}$Zn$_2$Sb$_2$ reached as low as 0.4 W m$^{-1}$ K$^{-1}$. The point defects scattering also successfully lower the lattice thermal conductivity in Eu$_{0.5}$Ca$_{0.5}$Zn$_2$Sb$_2$, but not in Eu$_{0.5}$Yb$_{0.5}$Zn$_2$Sb$_2$ because of the dominating mass disorder scattering effect. Previously-reported data on EuZn$_2$Sb$_2$ suggested a significant low lattice thermal conductivity, except for resulting from the impurity phase Eu$_9$Zn$_{4+x}$Sb$_9$ in sample EuZn$_2$Sb$_2$ by melting, and also overestimated the $\kappa_e$ by using higher L.

Figure 15A:
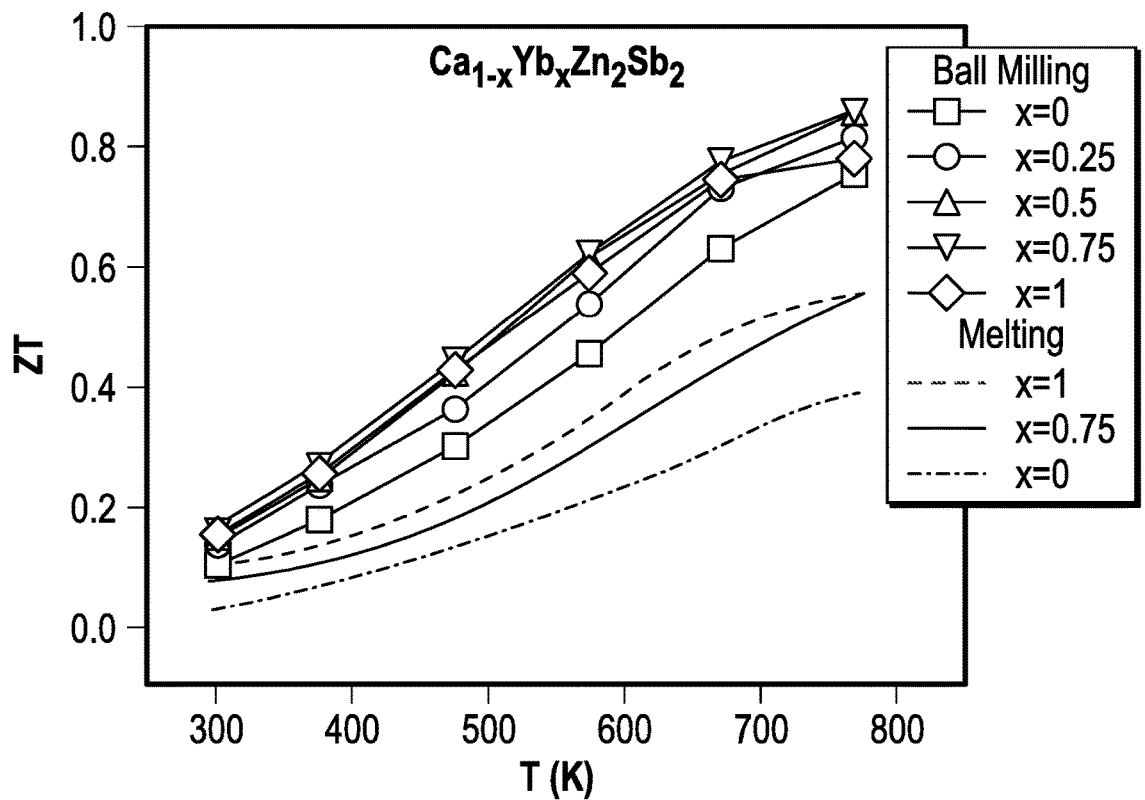
FIGS. 15A-15B illustrate temperature dependent ZT for p-type thermoelectric materials fabricated according to embodiments of the present disclosure as compared to reference compounds.
Figure 15B:
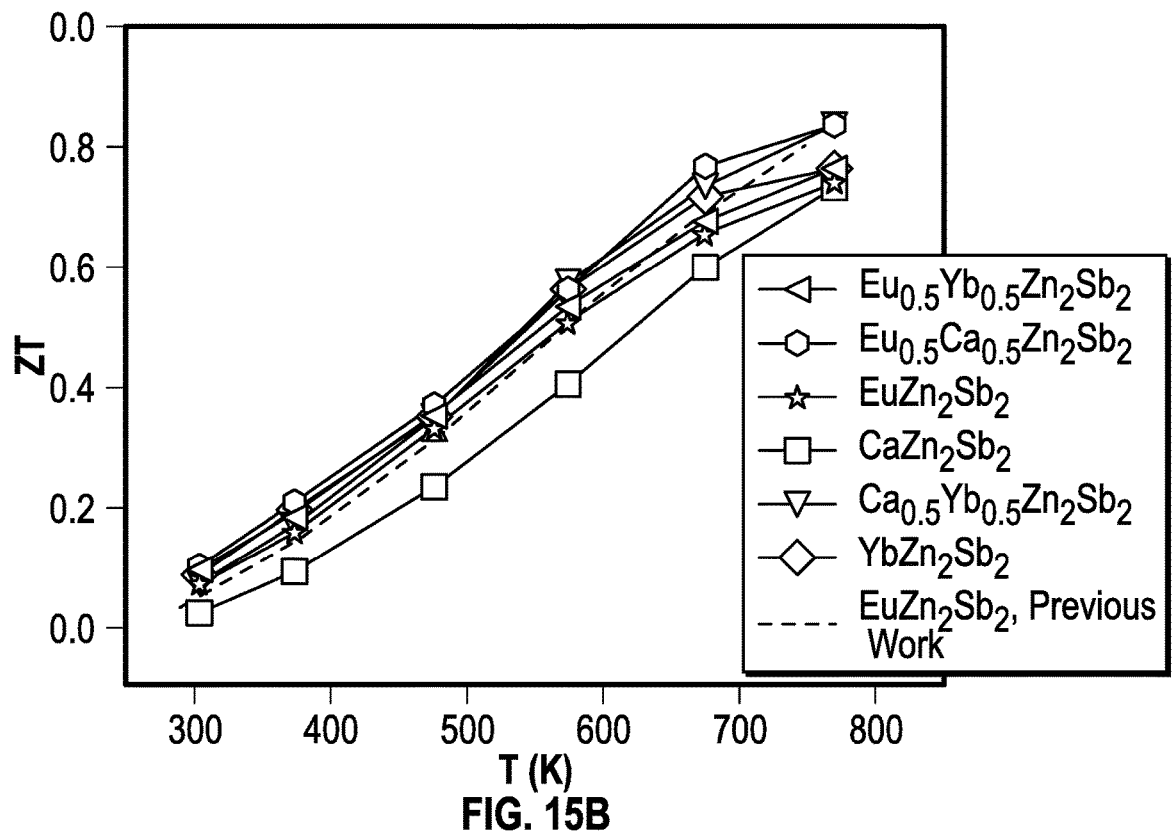

Combining the electrical and thermal properties, the corresponding ZT values are shown in FIGS. 15A and 15B. With increasing temperature, ZT increases continuously. At 773 K, the highest ZT ~0.9 for Ca$_{0.25}$Yb$_{0.75}$Zn$_2$Sb$_2$ was obtained, which is an improvement of ~50% as compared to that of the best previously-reported sample by melting. However, compared with EuZn$_2$Sb$_2$, the ball milling method does not significantly influence ZT.

Figure 16A:
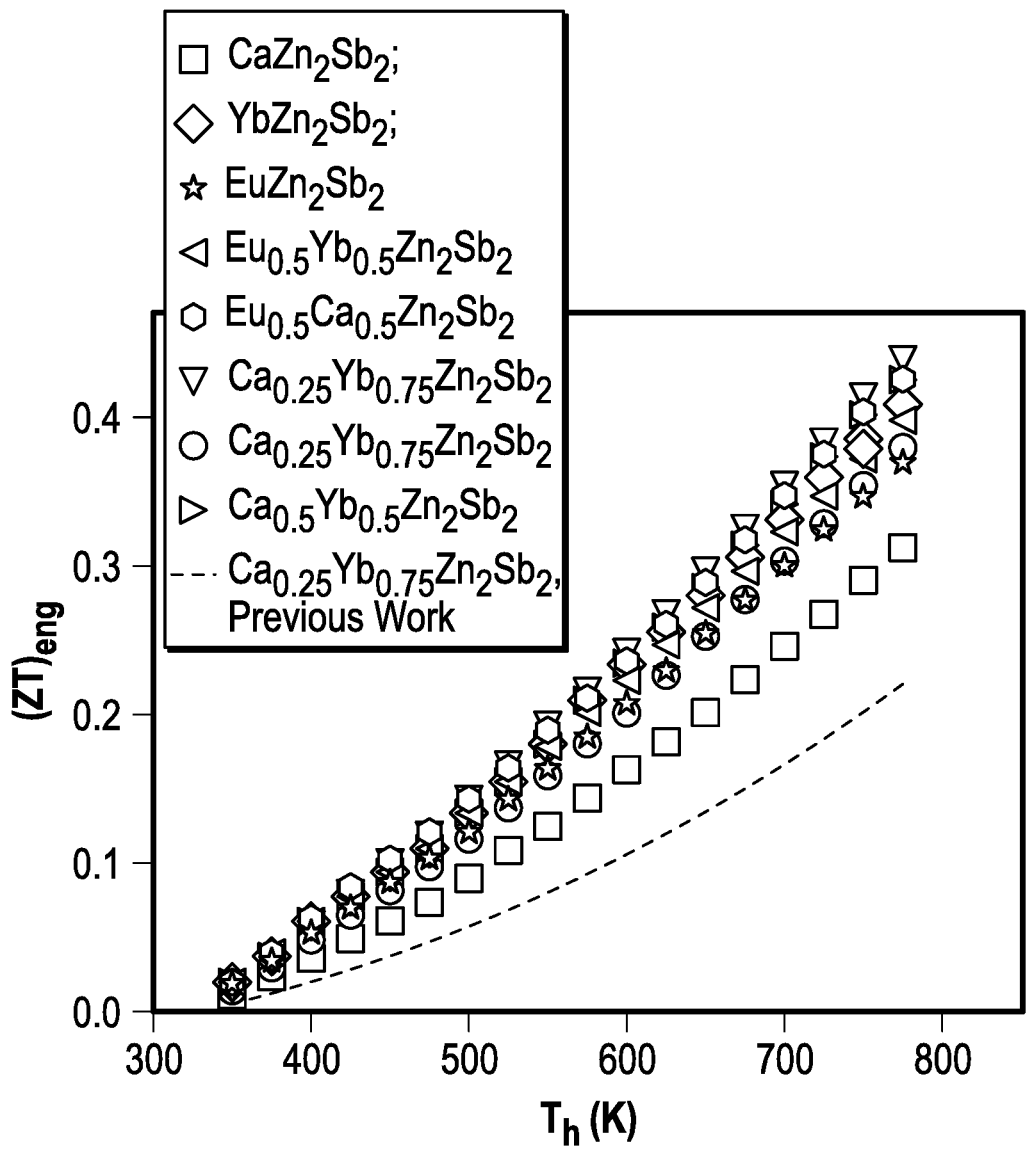
FIGS. 16A-16D illustrate properties of p-type thermoelectric materials fabricated according to certain embodiments of the present disclosure as compared to reference samples of p-type thermoelectric materials.
Figure 16B:
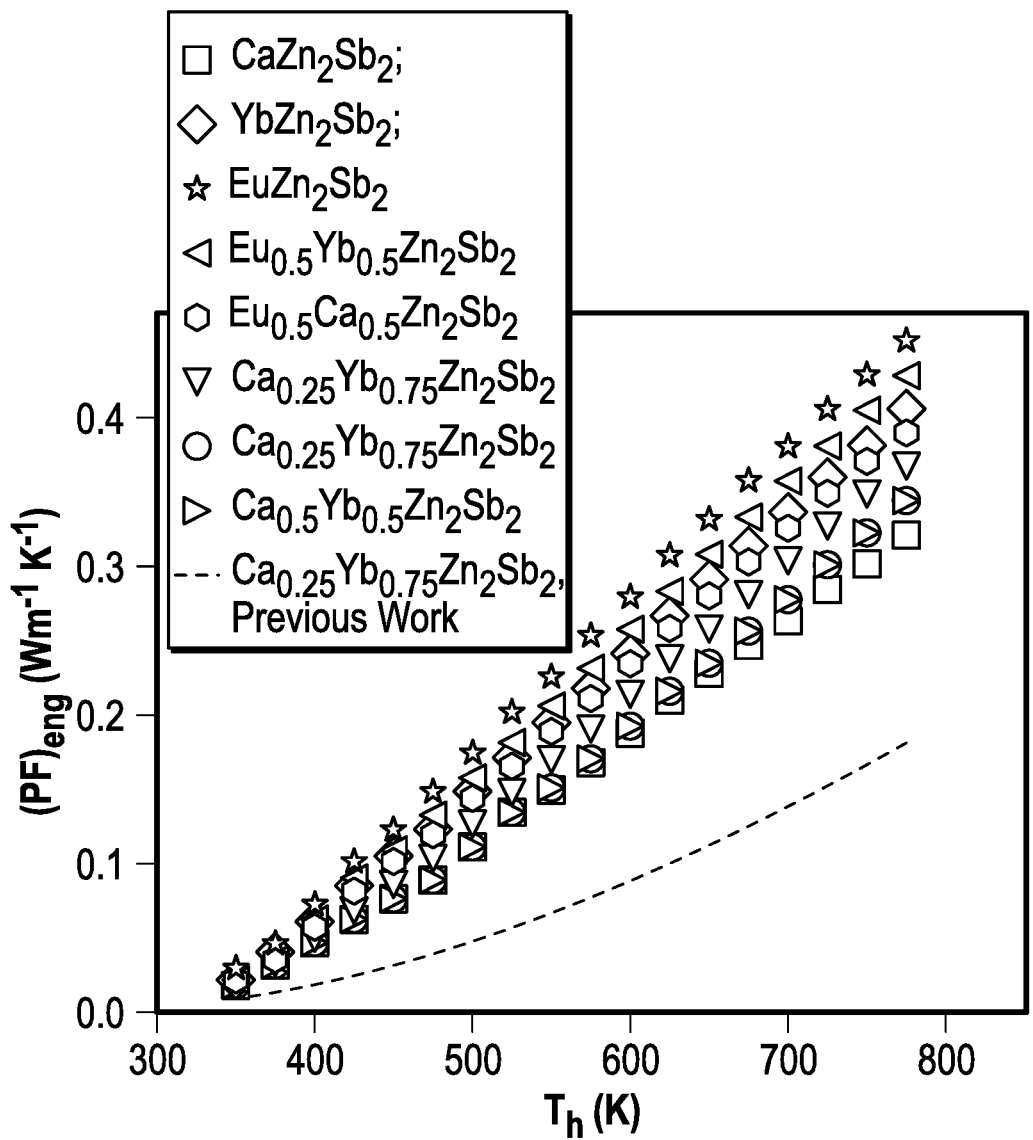
Figure 16C:
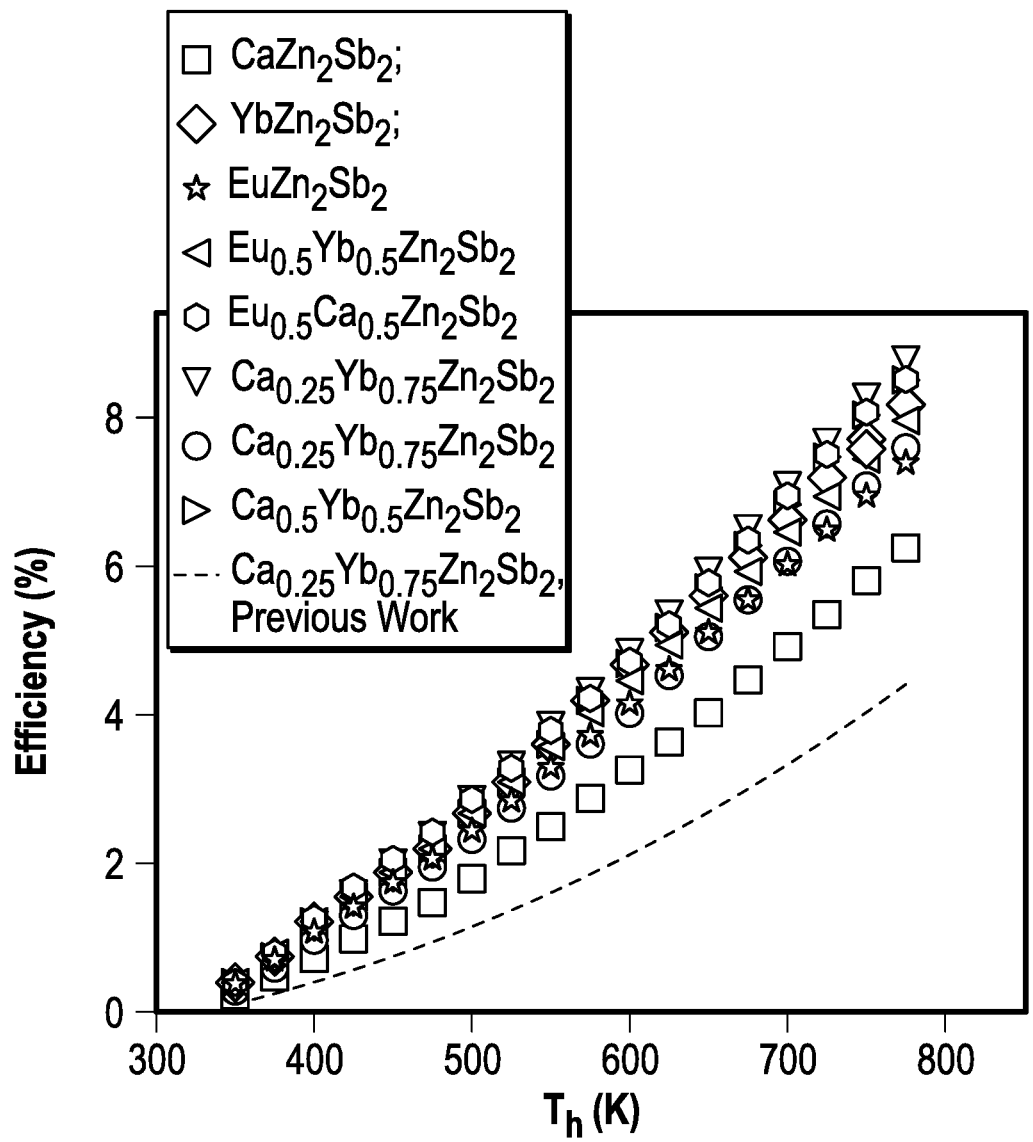
Figure 16D:
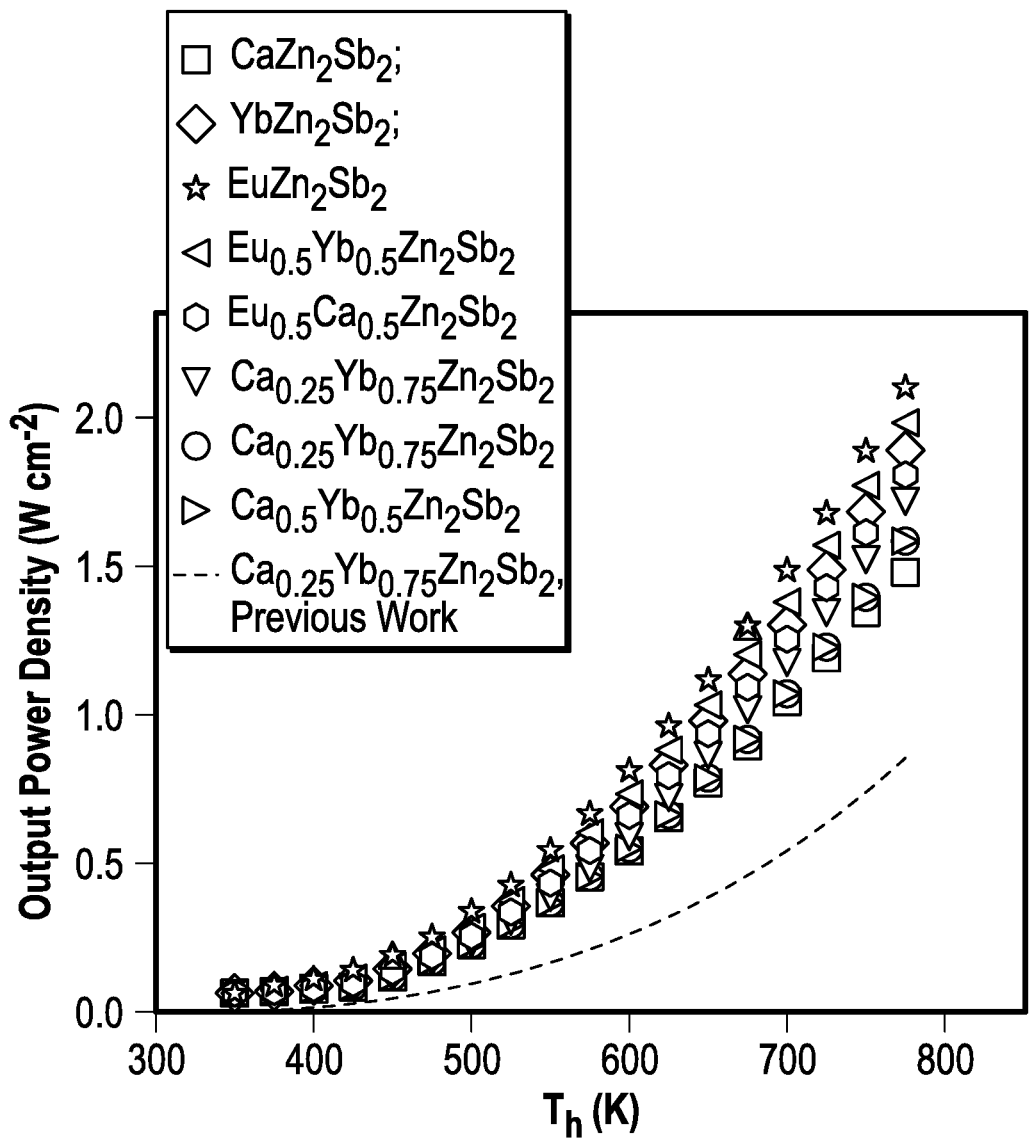

FIG. 16A shows the calculated (ZT)$_{eng}$ and FIG. 16B shows the calculated (PF)$_{eng}$ dependence of the hot side temperature up to 773 K while the cold side temperature is kept at 323 K. FIG. 16A shows that the optimized sample Ca$_{0.25}$Yb$_{0.75}$Zn$_2$Sb$_2$ improves the materials' performance by 45% in terms of (ZT)$_{eng}$ as compared with the sample CaZn$_2$Sb$_2$. Compared with the same composition Ca$_{0.25}$Yb$_{0.75}$Zn$_2$Sb$_2$ prepared by melting, the sample Ca$_{0.25}$Yb$_{0.75}$Zn$_2$Sb$_2$ has (ZT)$_{eng}$ doubled. EuZn$_2$Sb$_2$ exhibits the highest (PF)$_{eng}$~0.86 W mm$^{-1}$ K$^{-1}$ due to its higher power factor. FIG. 16C illustrates the calculated maximum efficiency $\eta_{max}$ and its corresponding output power density (FIG. 16D) P$_d$ including Thomson heat based on (ZT)$_{eng}$ and (PF)$_{eng}$, and assuming T$_c$=323 K and 2 mm of leg length. The conversion efficiency of the optimized Ca$_{0.25}$Yb$_{0.75}$Zn$_2$Sb$_2$ is about 8.4% at $\Delta$T=450° C., almost twice that of the similar composition by melting method. In FIG. 16D, EuZn$_2$Sb$_2$ exhibits the best output power density of 2.1 W cm$^{-2}$.

Figure 17C:
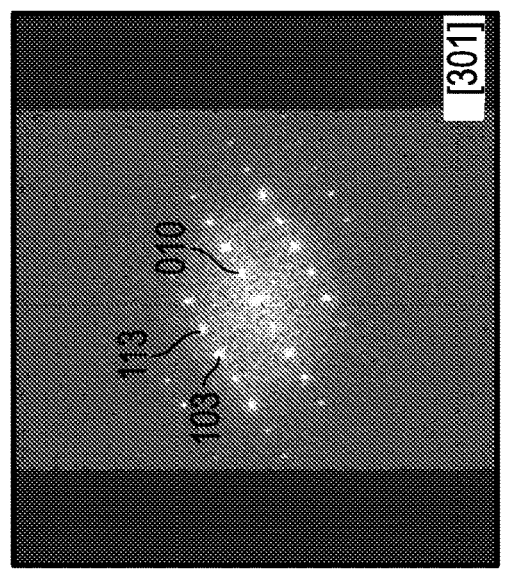
FIGS. 17A-17C illustrate images taken from a typical microstructure for p-type thermoelectric materials fabricated according to certain embodiments of the present disclosure.
Figure 17B:
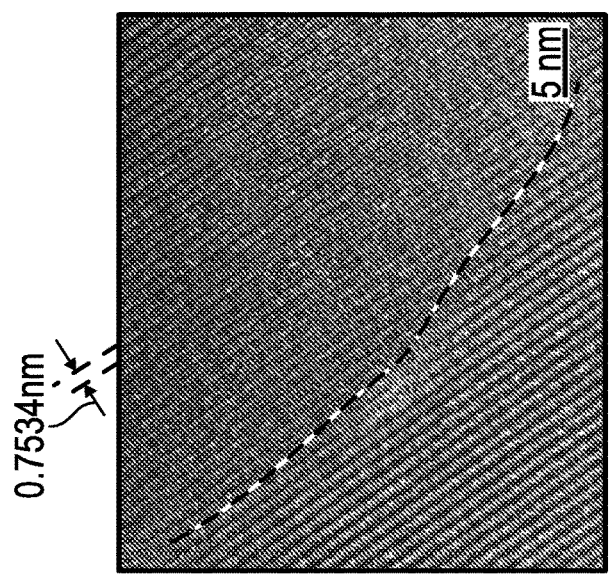
Figure 17A:
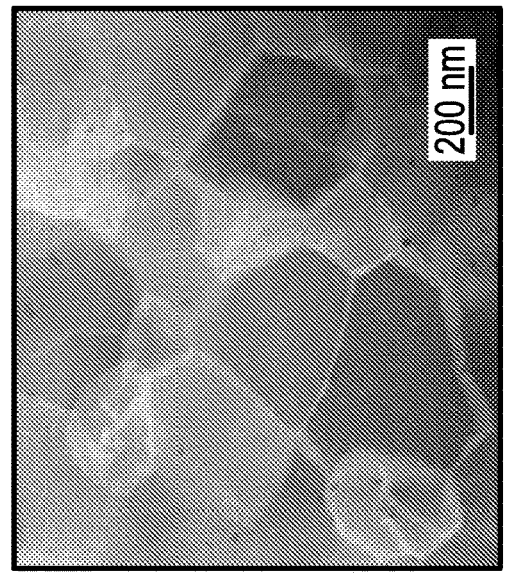

FIG. 17A illustrates a scanning transmission electron microscopy (STEM) image of the optimized Ca$_{0.25}$Yb$_{0.75}$Zn$_2$Sb$_2$ sample fabricated according to certain embodiments of the present disclosure. FIG. 17A indicates the sample is densely packed. Wide range of grain sizes from 50 to 500 nm is also observed. FIG. 17B shows a high-resolution TEM image and elucidates two grains adjacent to each other. The corresponding fast Fourier transformation (FFT) image, as shown in FIG. 17C, for the right side grain can be successfully indexed according to P$\bar{3}$m1 hexagonal structure along the [301] zone axis.

N-Type Mg$_3$Sb$_2$-Based Zintl Compounds

Making competitive n-type Zintl materials has been challenging even though effort has been intensive in the past decade. Discussed herein is an n-type thermoelectric material that comprises an improved average ZT as compared to previous works. The n-type Zintl materials discussed herein were fabricated by Nb substitution on Mg site in Mg$_{3.2-x}$Nb$_x$Sb$_{1.5}$Bi$_{0.49}$Te$_{0.01}$ that not only leads to an increase in the electrical conductivity and Seebeck coefficient, but also a decrease in the thermal conductivity, resulting in a much higher engineering figure of merit (ZT)$_{eng}$, and a calculated conversion efficiency above 15% for hot and cold side temperatures at 500° C. and 50° C., respectively. The Hall mobility was improved from ~19 V cm$^{-1}$ s$^{-2}$ to ~77 V cm$^{-1}$ s$^{-2}$ by tuning the carrier scattering mechanism, thus substantially increasing the power factor by a factor of 3, from ~5 to ~15 $\mu$W cm$^{-1}$ K$^{-2}$. Without limitation to this or any other particular theory, the enhancement in mobility may be due to the reason that ionization scattering has been shifted into mixed scattering between ionization scattering and acoustic phonon scattering, which less effectively scatter the carriers.

Sample Preparation. Magnesium (Mg, Sigma Aldrich, 99.9%, pieces), niobium (Nb, Sigma Aldrich, 99.9%, powder), bismuth (Bi, Sigma Aldrich, 99.999%, chunks), tellurium (Te, Sigma Aldrich, 99.999%, chunks), and antimony (Sb, Sigma Aldrich, 99.999%, chunks) were weighed according to the stoichiometry of Mg$_{3.2}$Sb$_{1.5}$Bi$_{0.5-x}$Te$_x$ (x=0, 0.002, 0.004, 0.006, 0.008, and 0.010), Mg$_{3.2-x}$Nb$_x$Sb$_{1.5}$Bi$_{0.49}$Te$_{0.01}$ (x=0.01, 0.05, 0.1, and 0.15), and sealed directly in the stainless steel jar with stainless steel balls inside an argon-filled glove box. Then the sealed jar was taken out for mechanical alloying by a high-energy ball mill (SPEX 8000D) for 10 h. The obtained final nanopowder was then loaded into a graphite die with an inner diameter of 12.7 mm, and consolidated by hot pressing at ~923 K for 2 min. The final hot pressed samples were cut and polished to the required dimensions for characterizations.

Sample Characterization. A PANalytical multipurpose diffractometer with an X'celerator detector (PANalytical X'Pert Pro) was used to characterize the hot pressed samples. Morphology of the samples was characterized by scanning electron microscopy (SEM, LEO 1525). Transmission electron microscopy (TEM, JEOL 2100F) was used to analyze the detailed microstructures.

Property Measurements. The electrical resistivity (p) and Seebeck coefficient (S) were simultaneously measured on a commercial system (ZEM-3, ULVAC) using a four-point direct current switching method and static temperature difference method. The thermal conductivity was measured by measuring the thermal diffusivity (D) on a laser flash apparatus (LFA 457, NETZSCH), specific heat ($C_P$) on a DSC (404 C, NETZSCH), and volumetric density ($\rho_D$) by Archimedes method. The carrier concentration was obtained by Hall effect measurement (Van der Pauw method) at room temperature using a modified sample puck in Physical Properties Measurement System (PPMS D060, Quantum Design) under a magnetic field of 3 Tesla. It is understood that there is a 3% error in the electrical resistivity, 5% error in the Seebeck coefficient, and 5% error in the thermal conductivity, resulting in errors of around 12% for ZT. For better readability of the figures, the curves were plotted without the error bars.

RESULTS AND DISCUSSION

Figure 18A:
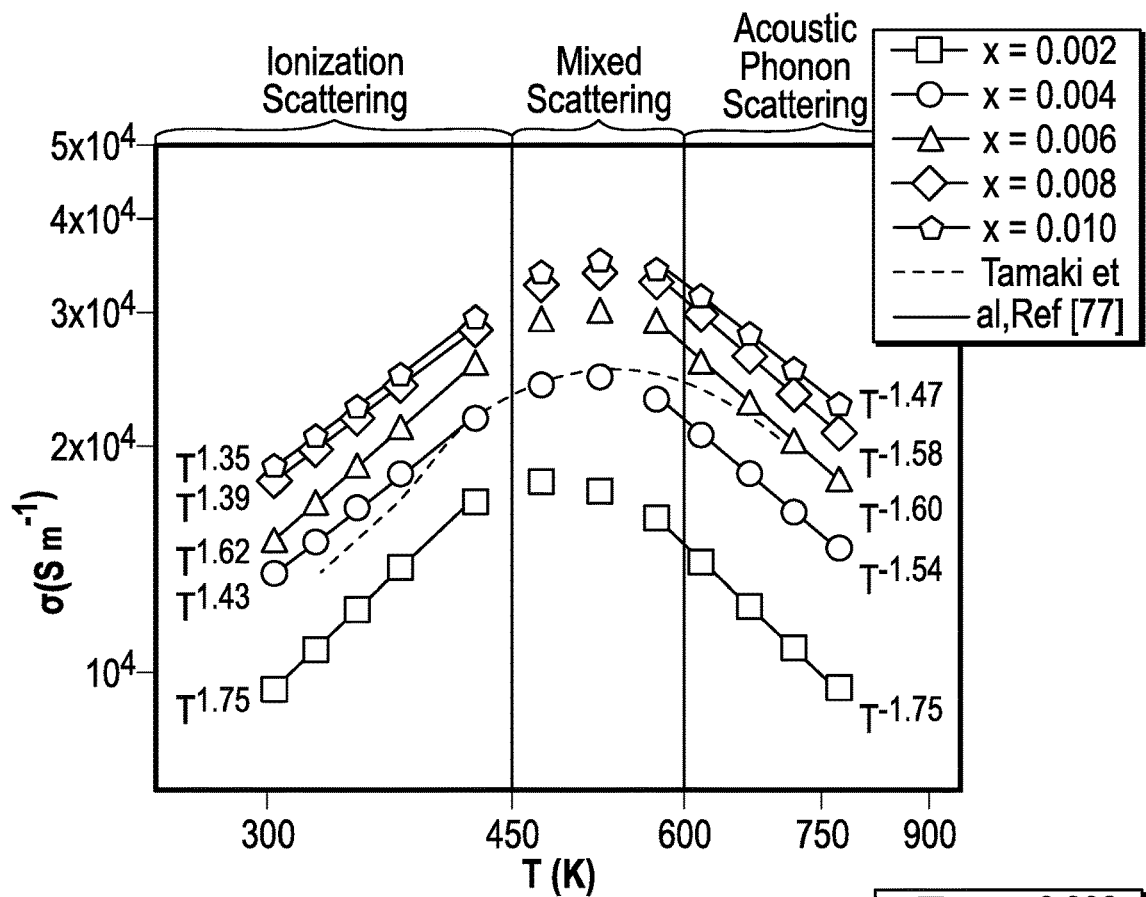
FIGS. 18A-18D are graphs of temperature dependent electrical conductivity and power factor, relationship between PF and $n_H$, and relationship between PF and $\mu_H$ of n-type Zintl compounds fabricated according to certain embodiments of the present disclosure.
Figure 18B:
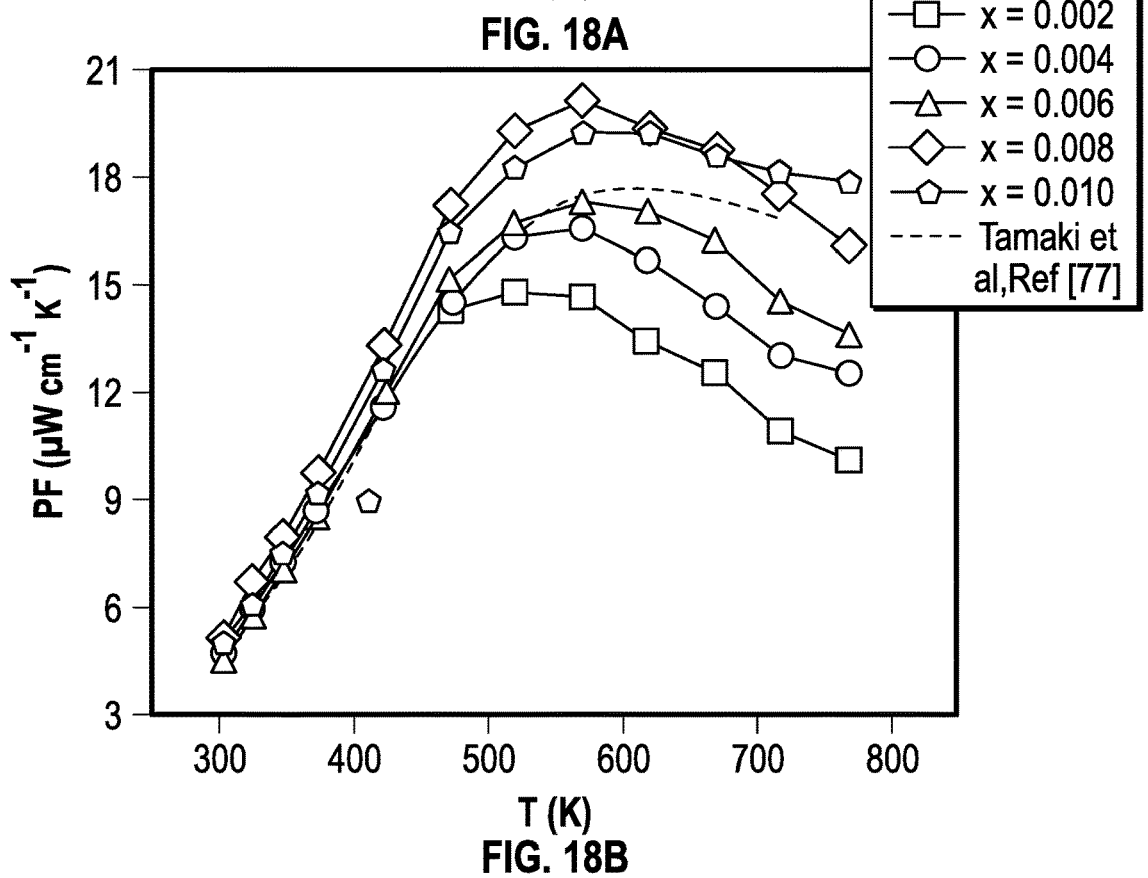
Figure 18C:
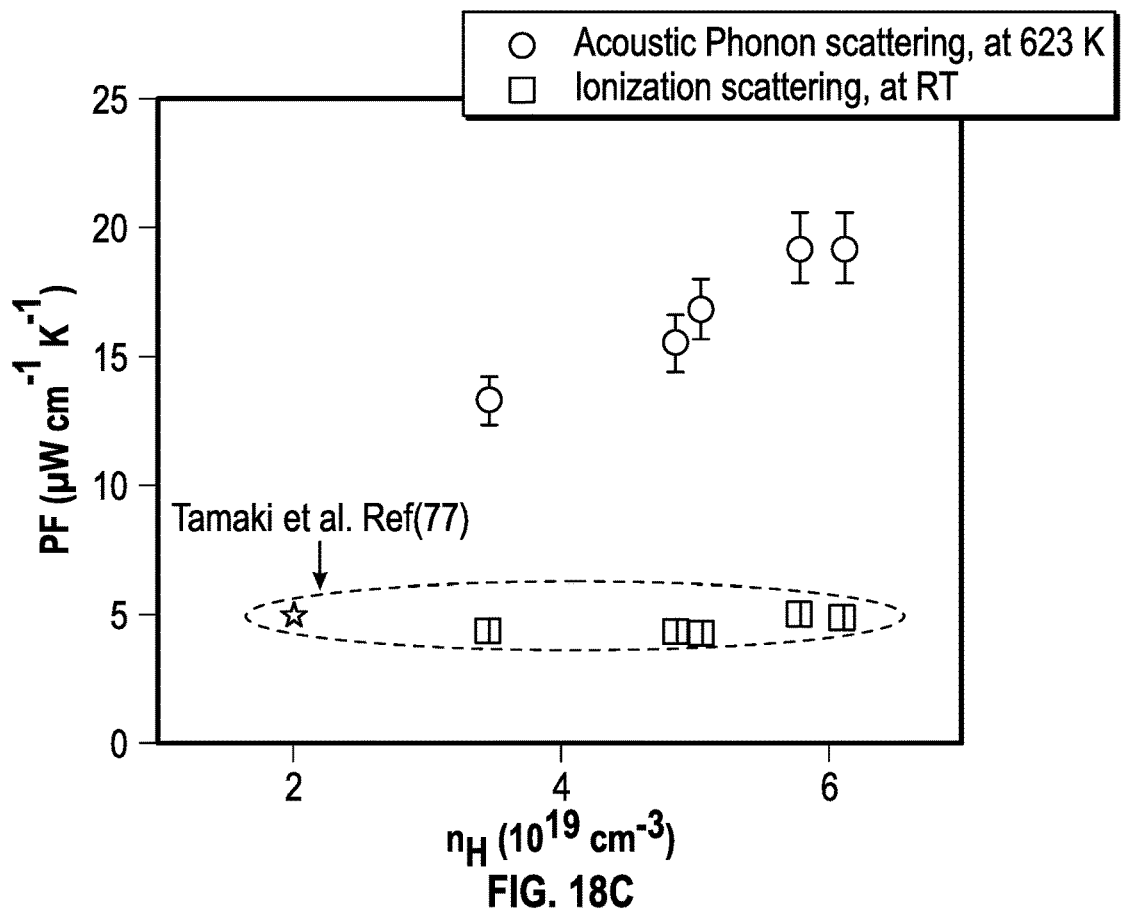
Figure 18D:
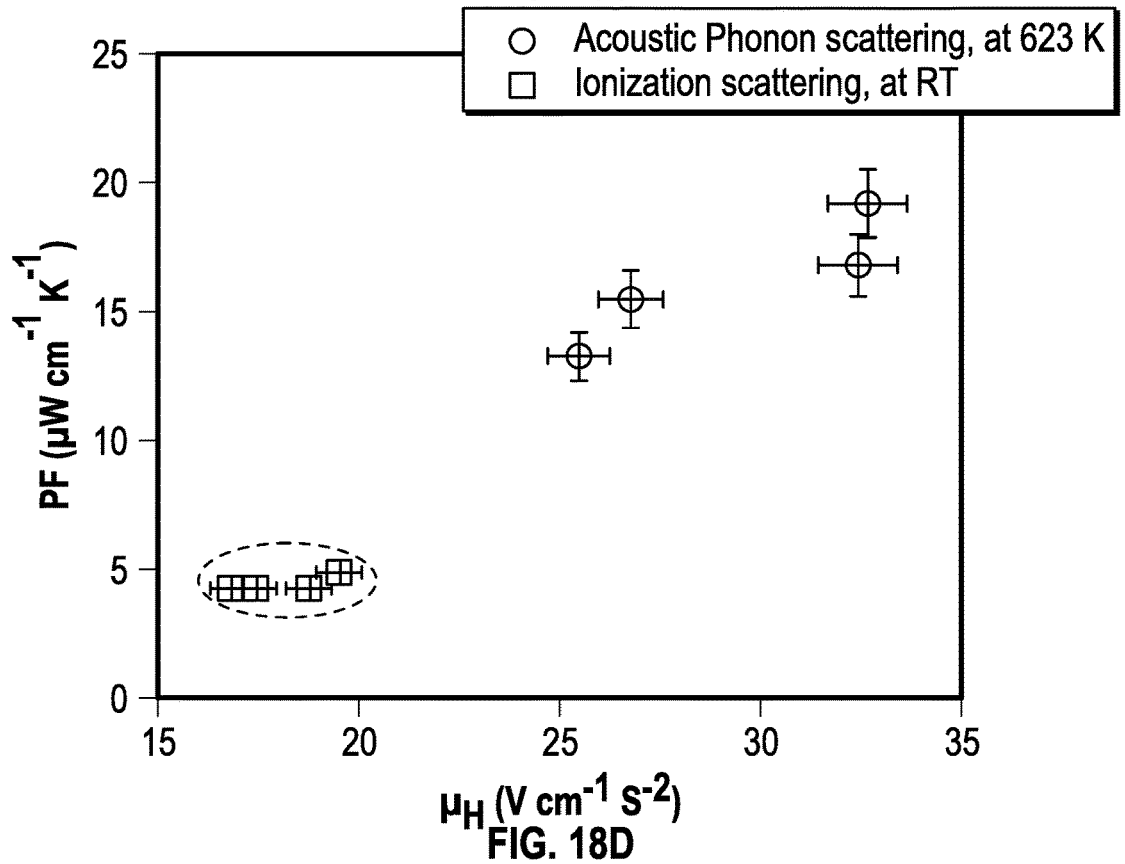

FIGS. 18A-18D are graphs of temperature dependent properties for n-type Zintl compounds fabricated according to certain embodiments of the present disclosure. FIG. 18A illustrates the electrical conductivity (G) and FIG. 18B shows the power factor (PF) of n-type Zintl $Mg_{3.2}Sb_{1.5}Bi_{0.5-x}Te_x$ compounds with (x=0.002, 0.004, 0.006, 0.008, and 0.010). FIG. 18C is a graph of the relationship between the power factor (PF) and the carrier concentration ($n_H$), and FIG. 18D is a graph of the relationship between the power factor (PF) and the hall mobility ($\mu_H$). Since the relaxation time for ionization scattering closely relates to the concentration of ionized impurities, the effect of Te concentration on ionization scattering of n-type $Mg_3Sb_2$-based materials was evaluated.

Figure 19:
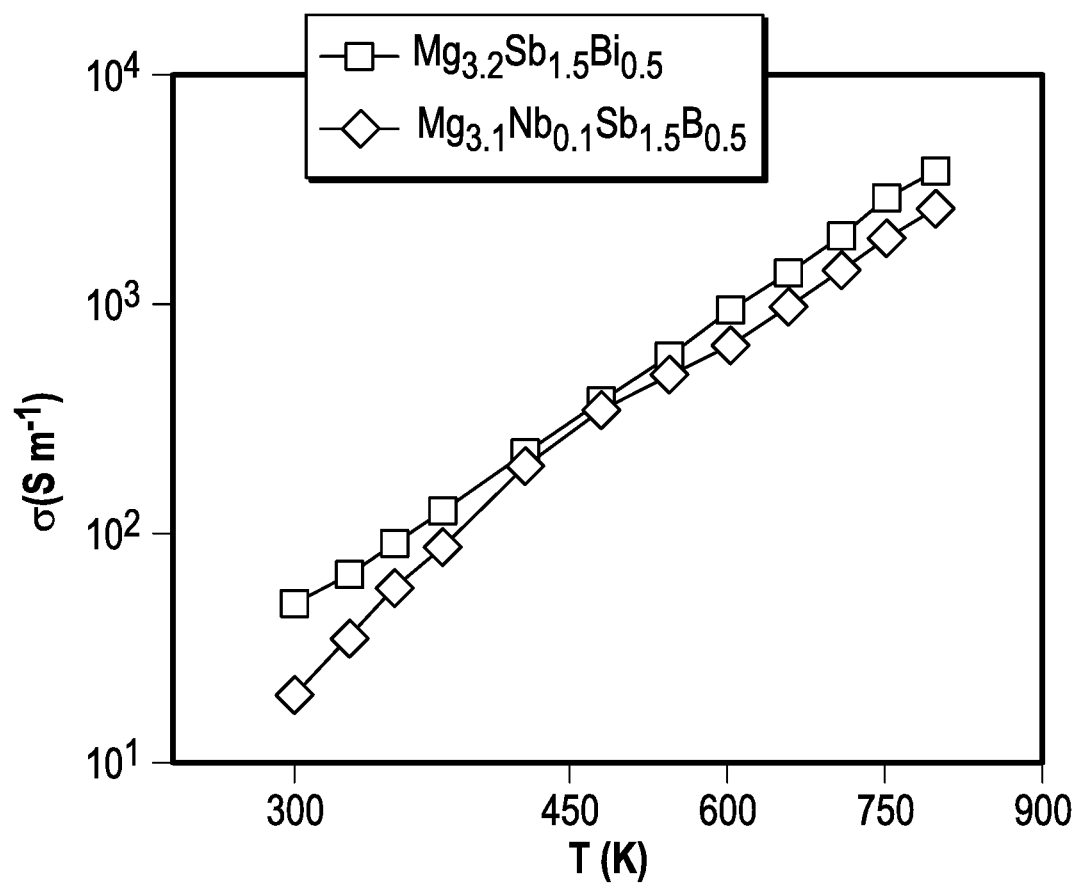
FIG. 19 is a graph of the electrical conductivity ($\sigma$) and temperature for thermoelectric materials fabricated according to certain embodiments of the present disclosure.

FIG. 19 is a graph of the electrical conductivity (G) and temperature for thermoelectric materials fabricated according to certain embodiments of the present disclosure. FIG. 19 shows that $Mg_{3.2}Sb_{1.5}Bi_{0.5}$ displays intrinsic carrier excitation from room temperature, therefore it is not included in the following discussion. Electrical conductivity can be expressed as:

$$\sigma = en_H\mu_H \quad (12)$$

where $n_H$ is the Hall carrier concentration and $\mu_H$ the Hall mobility. In the case when bipolar conduction does not happen, $n_H$ is almost constant hence the temperature dependence of electrical conductivity and Hall mobility are identical.

As shown in FIG. 18A, the electrical conductivity of $Mg_{3.2}Sb_{1.5}Bi_{0.5-x}Te_x$ could be divided into three distinctly different regions according to different temperature dependence, i.e., ionization scattering dominated region (light blue region, below 450 K), mixed scattering dominated region (light yellow region, between 450 and 600 K), and acoustic phonon scattering dominated region (light red region, above 600 K). Fitted temperature dependence for $Mg_{3.2}Sb_{1.5}Bi_{0.5-x}Te_x$ is similar to the theoretical values ($\sigma \propto T^{1.5}$ for ionization scattering and $\sigma \propto T^{-1.5}$ for acoustic phonon scattering) at different temperature range, where slightly deviations could be partly ascribed to the measurement uncertainty. Electrical conductivity of $Mg_{3.2}Sb_{1.5}Bi_{0.49}Te_{0.01}$ from Tamaki et al.'s paper is also plotted, which shows a similar temperature dependence with our specimens.

Since the relaxation time of ionization scattering is directly related to the concentration of ionized impurities, we actually expect a less effective ionization scattering when Te concentration is low. On the contrary, the experimental results show that even when Te concentration is as low as 0.1 wt % (i.e., x=0.002), a noticeable ionization scattering can still be observed. This clearly indicates that although the concentration of ionized impurities is a very important factor for ionization scattering, the presence of strong ionization scattering in n-type $Mg_3Sb_2$-based materials should be mainly ascribed to the intrinsic material's parameters, e.g., low effective mass (~0.2 $m_o$, $m_o$ is the free electron mass) and/or possibly low dielectric constant.

Te is a very efficient dopant for tuning the carrier concentration in n-type $Mg_3Sb_2$-based materials, therefore the thermoelectric properties could be precisely tuned by controlling a Te concentration (see FIG. 18A and FIGS. 20A-20F, discussed below). By optimizing the carrier concentration, peak power factor of ~20 $\mu W$ $cm^{-1}$ $K^{-2}$ can be obtained (as shown in FIG. 18B). It is noted that power factor varies noticeably with Te concentration at higher temperature range, while it is almost insensitive to doping concentration at lower temperature region and remains a low value around room temperature (~5 $\mu W$ $cm^{-1}$ $K^{-2}$). This is clearly shown in FIG. 18C, where power factor can be effectively tuned by Hall carrier concentration in acoustic phonon scattering dominated region (red open circles from measurements at 623 K) while it remains low in the wide range of Hall carrier concentration in ionization scattering dominated region. The data of $Mg_{3.2}Sb_{1.5}Bi_{0.49}Te_{0.01}$ from Tamaki et al.'s paper is plotted, although slightly different Hall carrier concentration is observed, the power factor is also low in ionization scattering dominated region. Such low power factors should be mainly ascribed to the low Hall mobilities (between ~15 and ~19 V $cm^{-1}$ $s^{-2}$) in ionization scattering dominated region as shown in FIG. 18D. In a sharp contrast, the Hall mobilities are noticeably higher (between ~25 and ~33 V $cm^{-1}$ $s^{-2}$) in acoustic phonon scattering dominated region, hence it partly explains the reason why much higher power factors are achieved in acoustic phonon scattering dominated region. Due to much larger variation in Hall mobility, it also partly explains why power factor is much more sensitive to Hall carrier concentration in acoustic phonon scattering dominated region.

According to the Hall mobility results, it is clear that ionization scattering significantly reduces the Hall mobility comparing to acoustic phonon scattering. Therefore, if ionization scattering could be shifted into other scattering mechanisms that less effectively scatter carriers, noticeable improvement in mobility and power factor is possible. In the following, it will be demonstrated that by further Nb-doping at Mg site, the ionization scattering can indeed be tuned into mixed scattering of ionization and acoustic phonon scattering from which substantial enhancement in Hall mobility is observed.

Figure 20A:
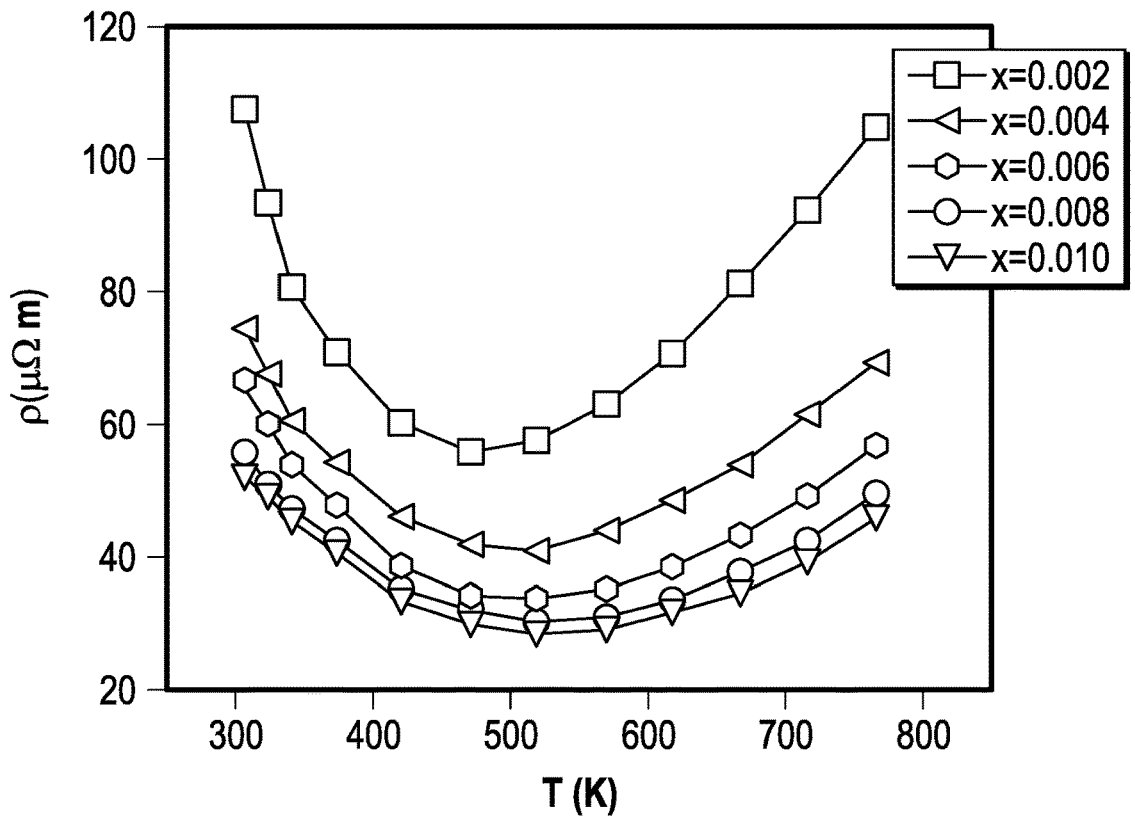
FIGS. 20A-20F are graphs of temperature-dependent thermoelectric properties for n-type thermoelectric materials fabricated according to certain embodiments of the present disclosure.
Figure 20B:
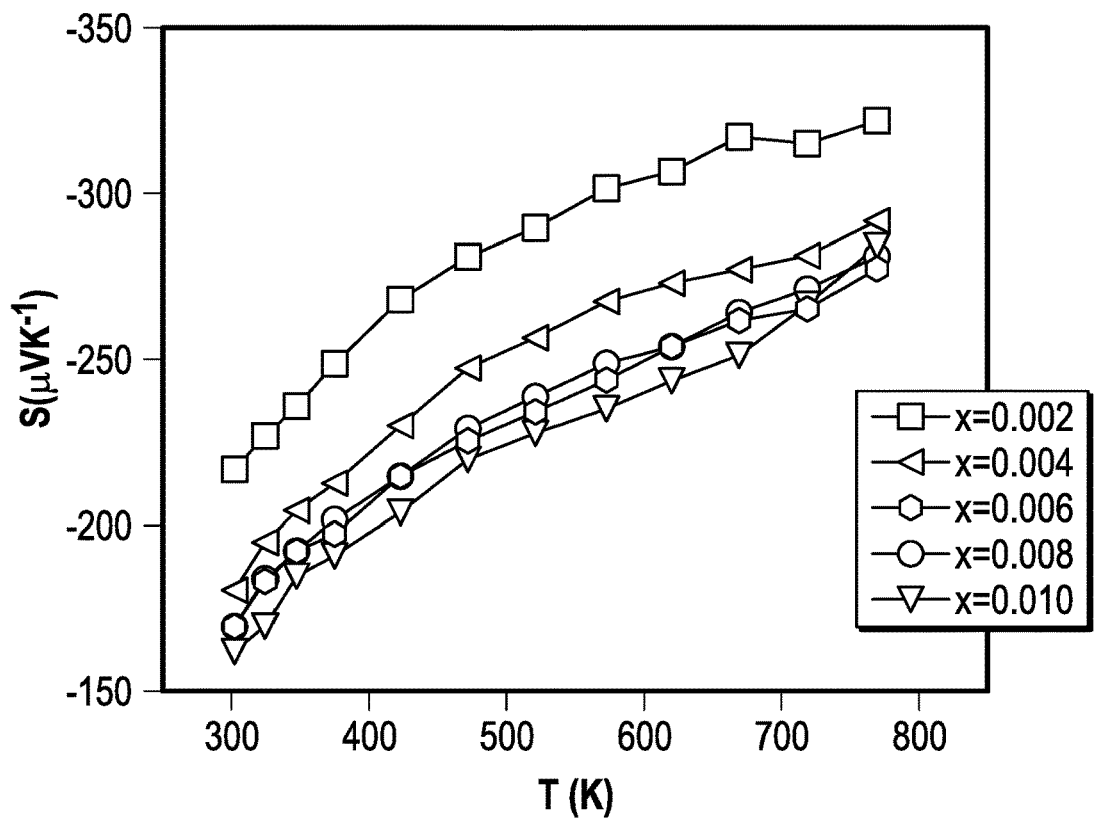
Figure 20C:
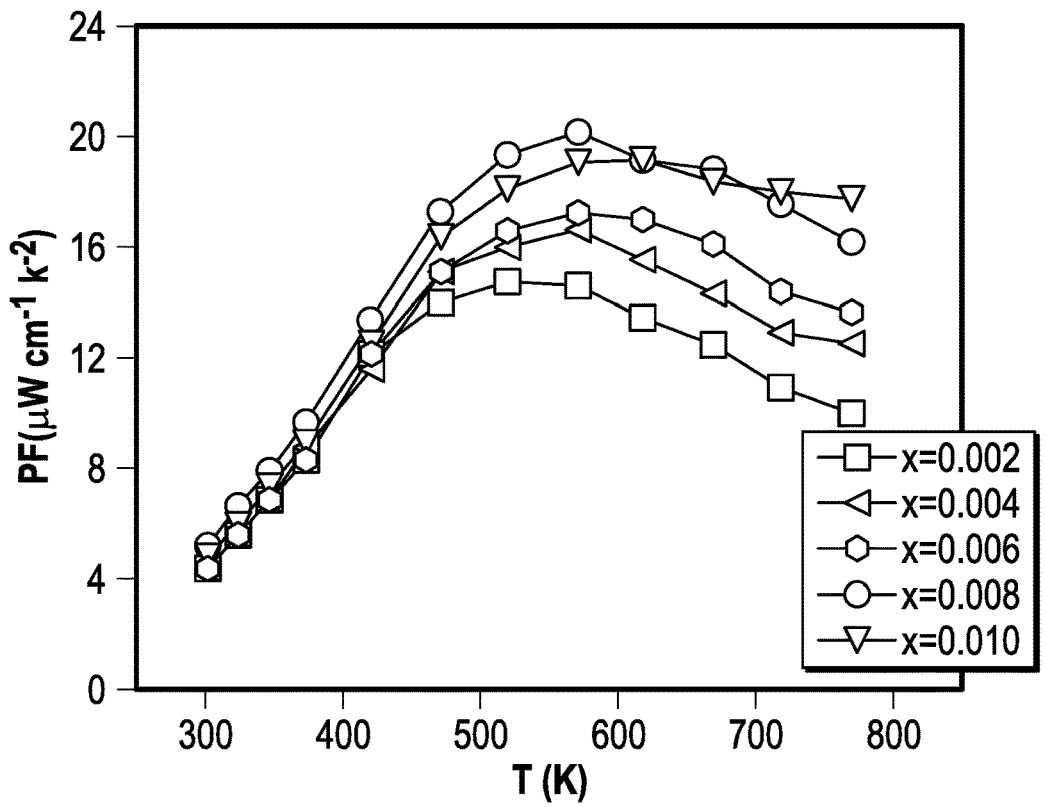
Figure 20D:
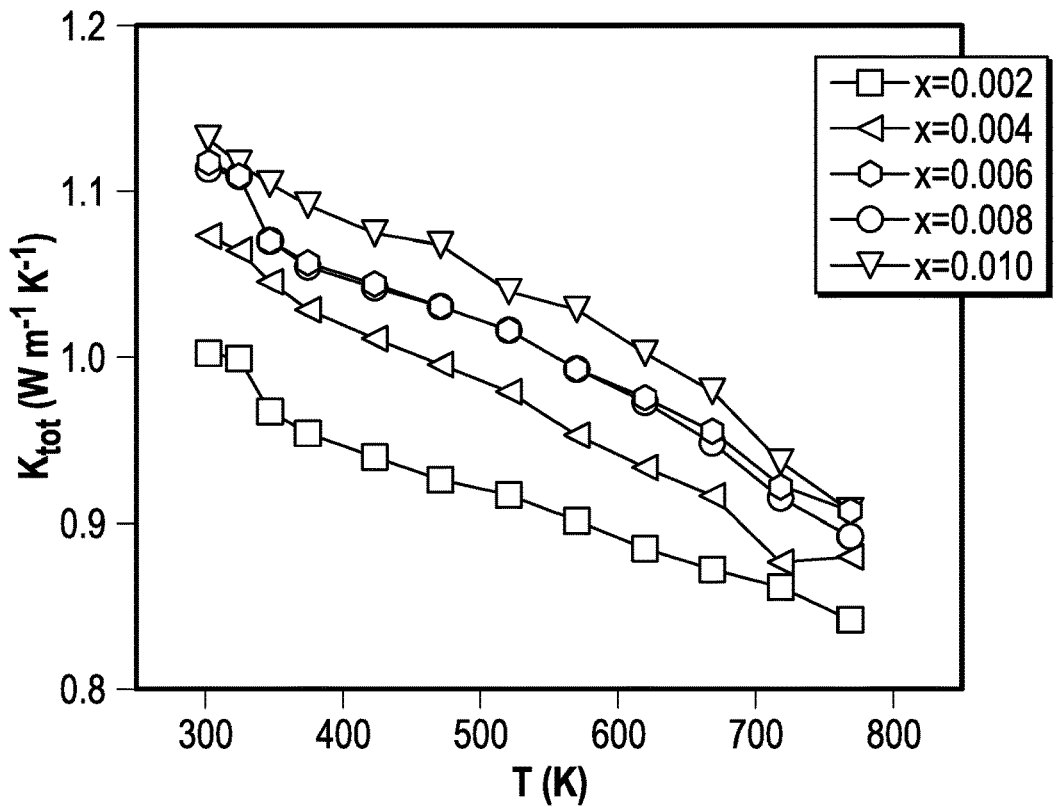
Figure 20E:
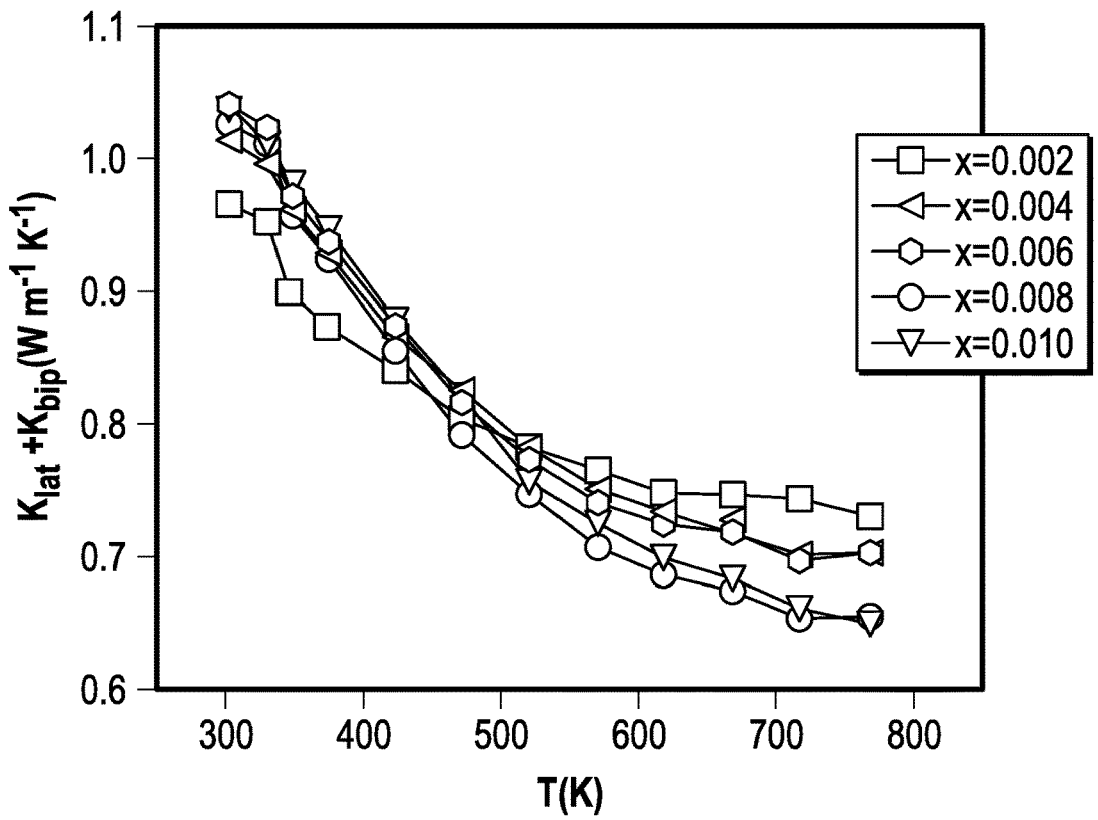
Figure 20F:
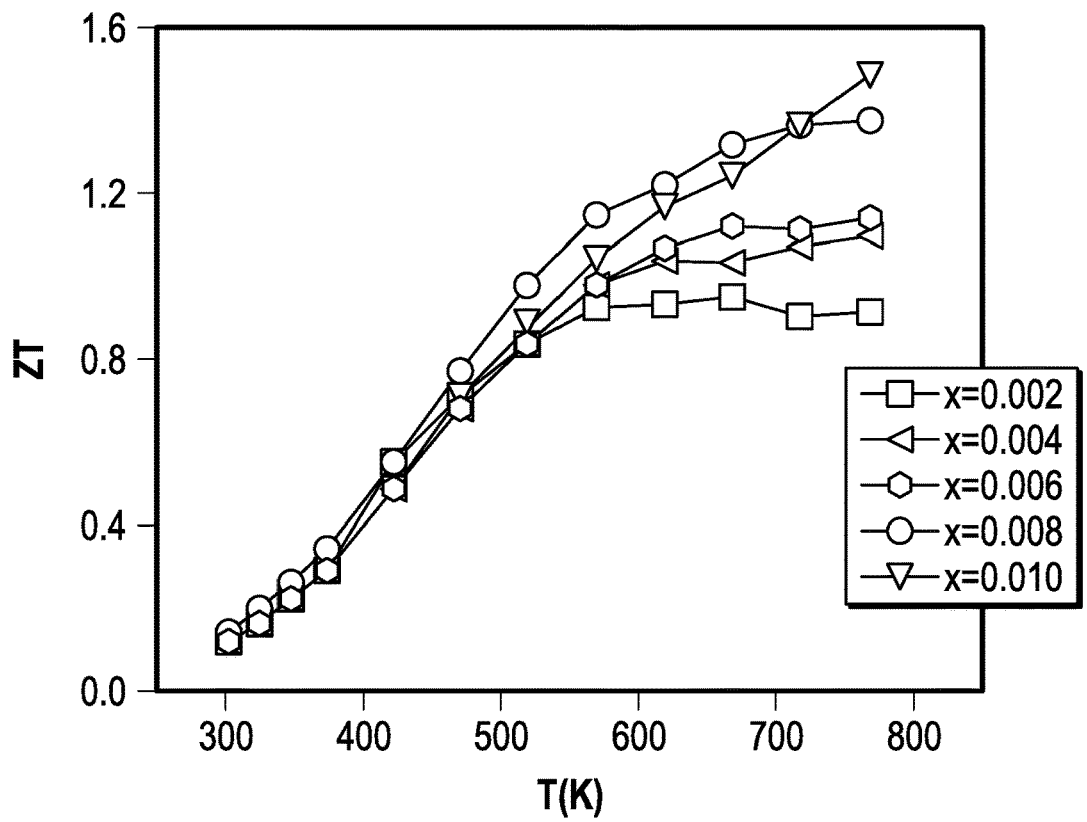

FIGS. 20A-20F illustrate temperature-dependent thermoelectric properties for $Mg_{3.2}Sb_{1.5}Bi_{0.5-x}Te_x$ (x=0.002, 0.004, 0.006, 0.008, and 0.010) fabricated according to certain embodiments of the present disclosure. For $Mg_{3.2}Sb_{1.5}Bi_{0.5}Te_x$, no bipolar conduction happens during the temperature range from about 300K to about 800K. FIG. 20A illustrates the temperature dependence of the electrical resistivity, FIG. 20B illustrates the Seebeck coefficient (S), FIG. 20C illustrates the PF, FIG. 20D illustrates the total thermal conductivity; FIG. 20E illustrates the lattice thermal conductivity plus the bipolar thermal conductivity; and FIG. 20F illustrates the ZT. FIG. 20F shows that the peak ZT is about 0.8 at about 450K for all of the compositions illustrated.

Figure 21A:
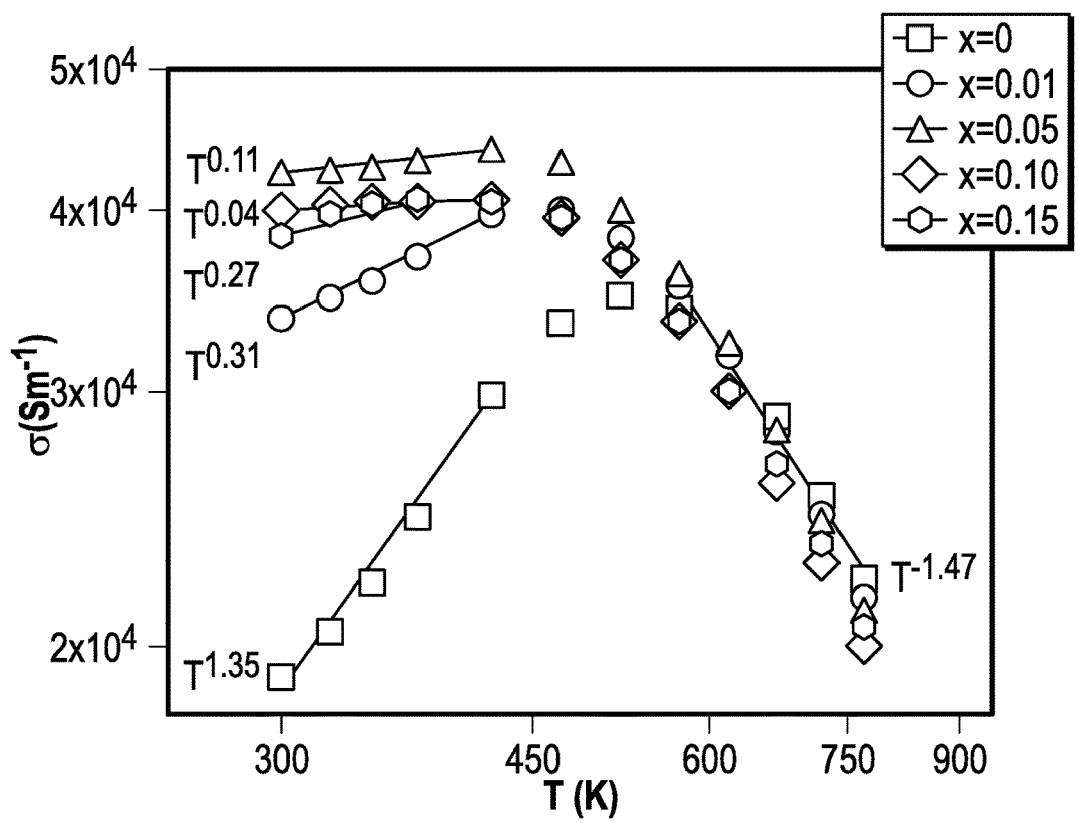
FIGS. 21A-21D are graphs of temperature-dependent thermoelectric properties for n-type thermoelectric materials fabricated according to certain embodiments of the present disclosure.
Figure 21B:
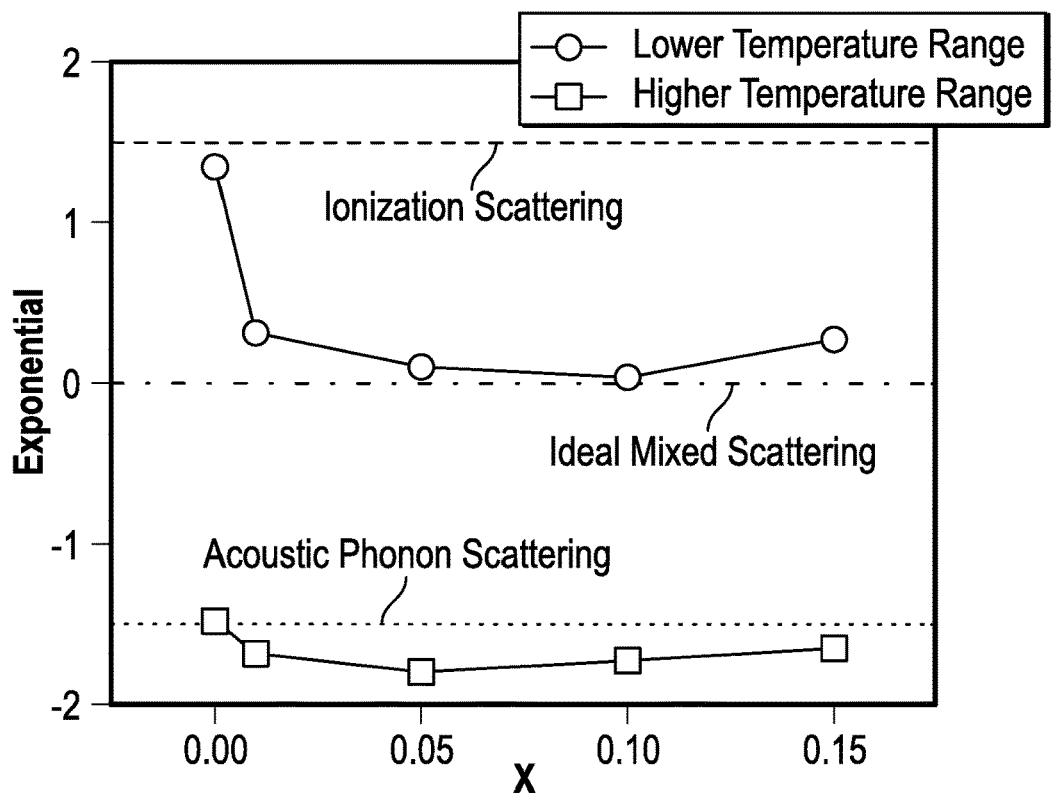
Figure 21C:
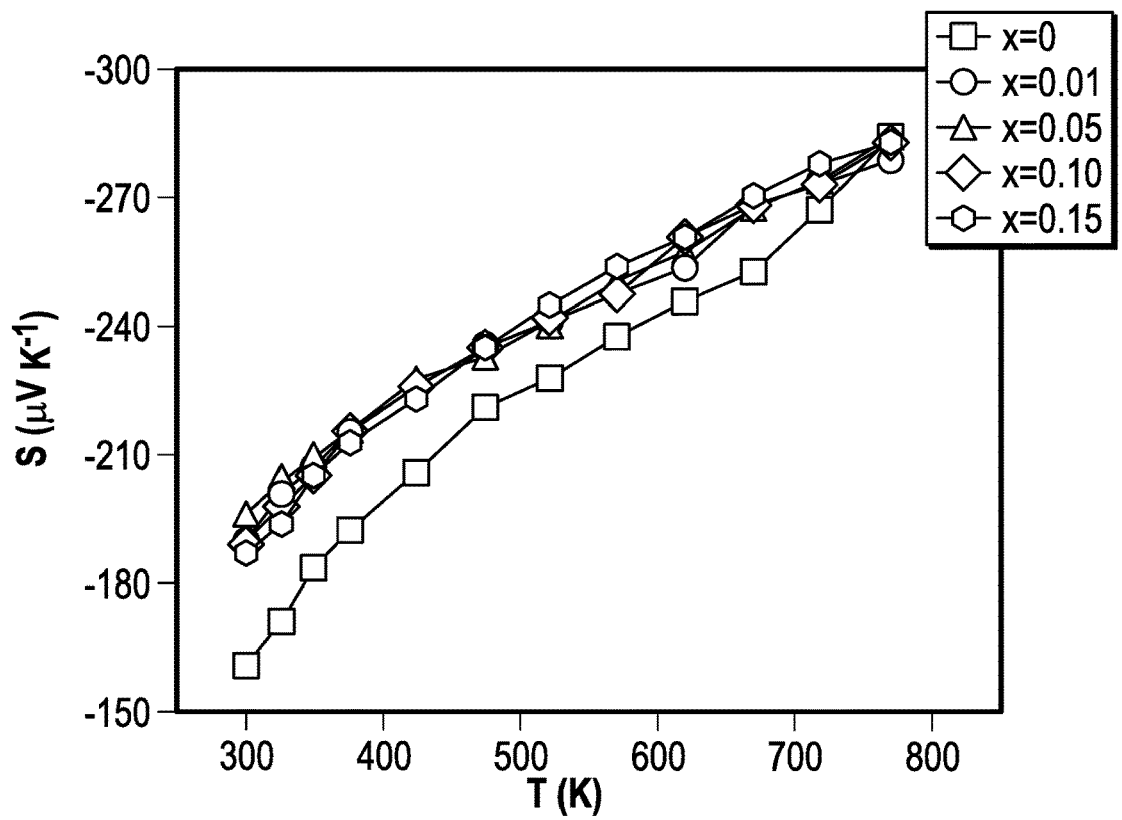
Figure 21D:
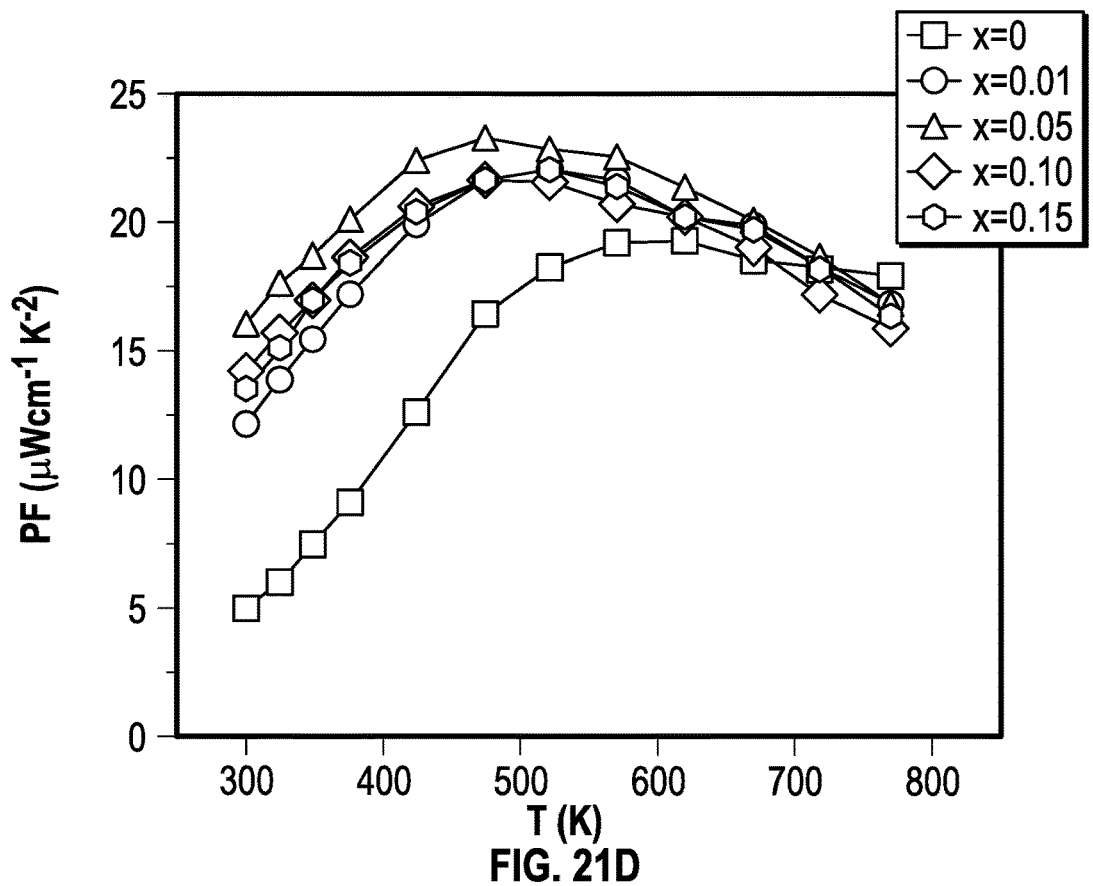
Figure 22A:
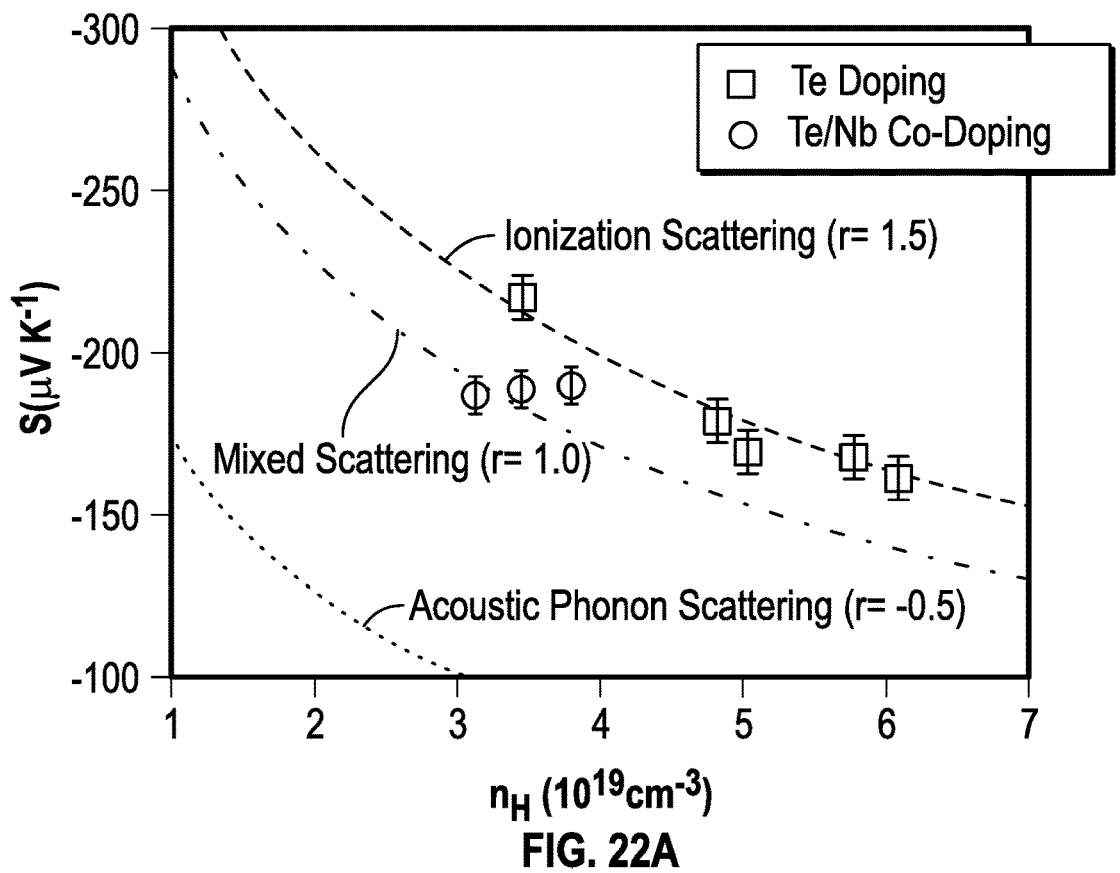
FIGS. 22A-22D are graphs of relationship between electronic transport properties for n-type thermoelectric materials fabricated according to certain embodiments of the present disclosure.
Figure 22B:
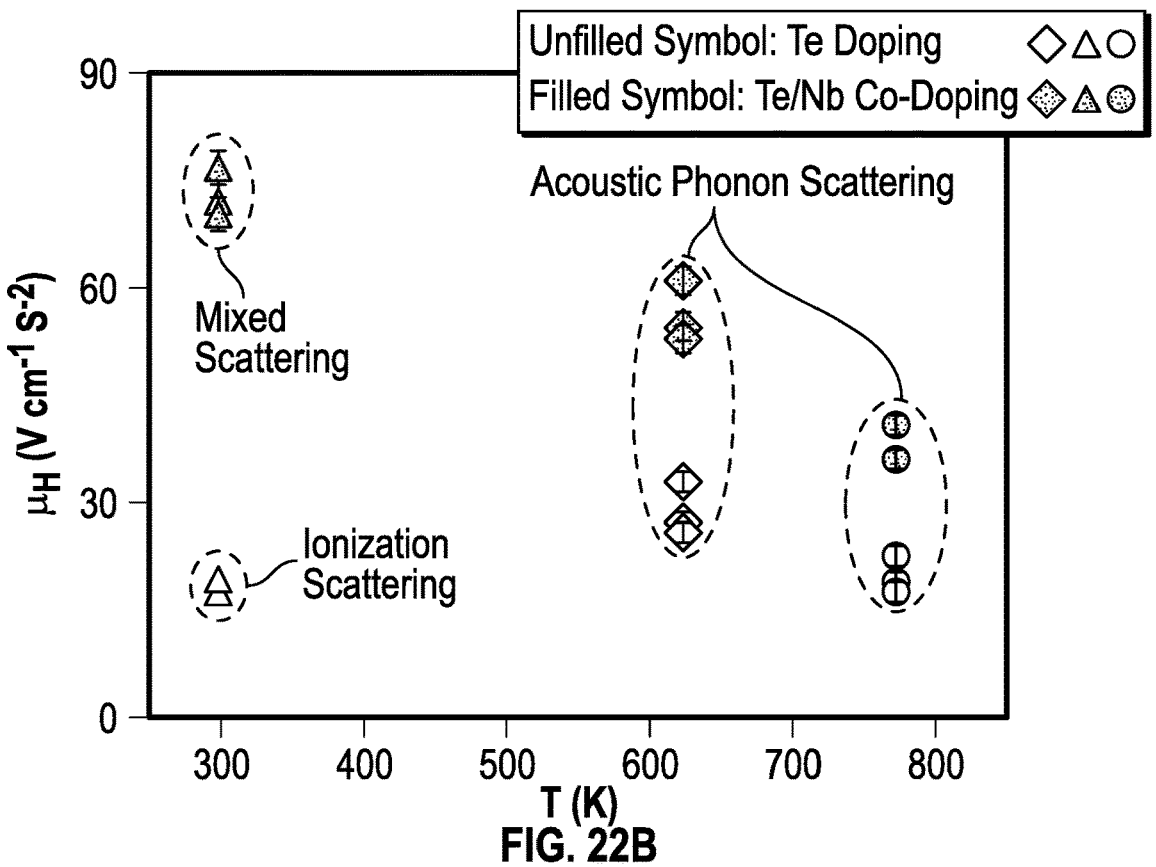
Figure 22C:
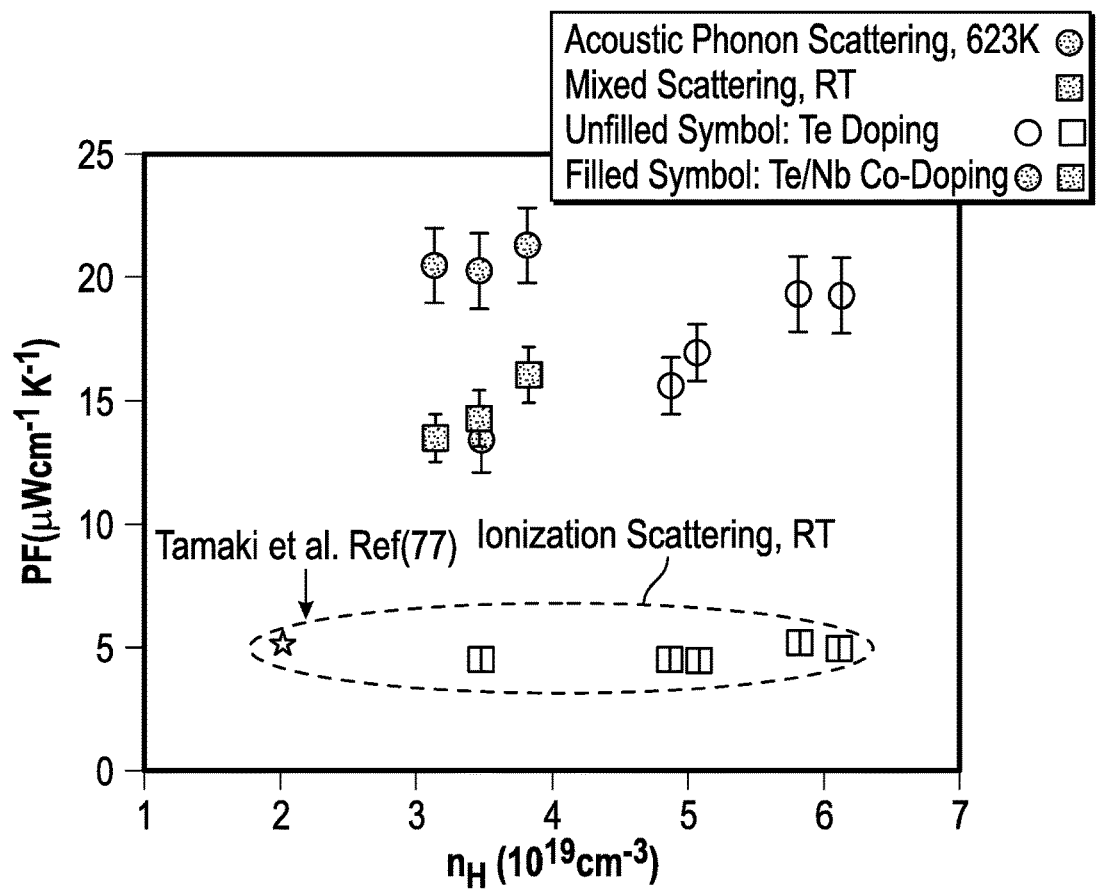
Figure 22D:
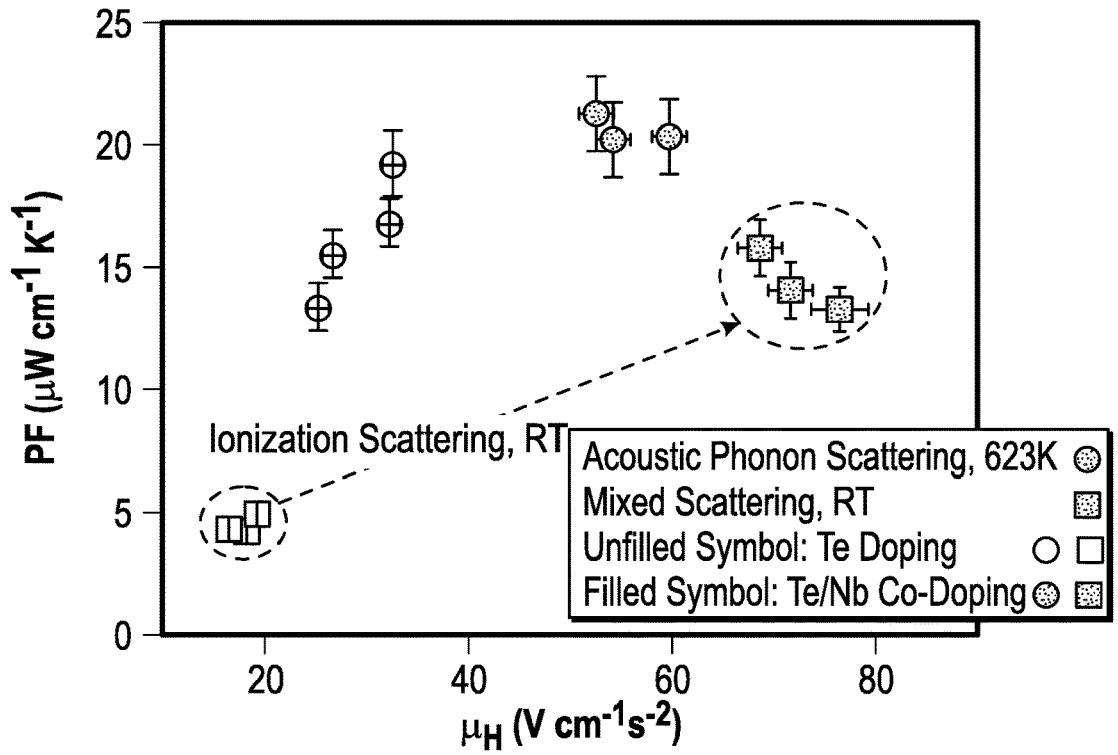

FIGS. 21A-21D are graphs of electronic transport properties of $Mg_{3.2-x}Nb_xSb_{1.5}Bi_{0.49}Te_{0.01}$ fabricated according to certain embodiments of the present disclosure. In particular, FIG. 21A shows the temperature dependent electrical conductivity of $Mg_{3.2-x}Nb_xSb_{1.5}Bi_{0.49}Te_{0.01}$ (x=0, 0.01, 0.05, 0.10, and 0.15), where the temperature dependence at lower temperature is noticeably changed after Nb doping. As further shown in FIG. 21B, the carrier scattering mechanism in Nb-doped specimens has been shifted from ionization scattering into mixed scattering at lower temperature range, where the temperature exponential changes from 1.35 in $Mg_{3.2}Sb_{1.5}Bi_{0.49}Te_{0.01}$ to 0.31, 0.33, 0.27, and 0.04 in Nb-doped specimens. In contrast, the scattering mechanism at higher temperature range remains as acoustic phonon scattering. As shown in FIG. 21C, slightly higher Seebeck coefficient is observed for $Mg_{3.2-x}Nb_xSb_{1.5}Bi_{0.49}Te_{0.01}$ (x>0) comparing to that of $Mg_{3.2}Sb_{1.5}Bi_{0.49}Te_{0.01}$. This should be ascribed to the slightly reduced Hall carrier concentration in $Mg_{3.2-x}Nb_xSb_{1.5}Bi_{0.49}Te_{0.01}$ (x>0), and details will be discussed later. Due to the enhanced electrical conductivity and Seebeck coefficient, power factors of $Mg_{3.2-x}Nb_xSb_{1.5}Bi_{0.49}Te_{0.01}$ (x>0) at lower temperature are substantially improved (as shown in FIG. 21D). The room temperature power factor is ~5 µW cm$^{-1}$ K$^{-2}$ for $Mg_{3.2}Sb_{1.5}Bi_{0.49}Te_{0.01}$ but ~15 µW cm$^{-1}$ K$^{-2}$ for $Mg_{3.1}Nb_{0.1}Sb_{1.5}Bi_{0.49}Te_{0.01}$, an enhancement of 200%. FIG. 22A is a Pisarenko plot of different scattering mechanisms for n-type Zintl materials fabricated according to certain embodiments of the present disclosure. FIG. 22B is a graph of hall mobility ($\mu_H$) as a function of temperature, FIG. 22C is a graph of the PF as a function of the $n_H$, and FIG. 22D is a graph of the PF as a function of the $\mu_H$.

The Pisarenko plot of FIG. 22A is used to understand the relationship between Seebeck coefficient (S) and Hall carrier concentration ($n_H$) in $Mg_{3.2}Sb_{1.5}Bi_{0.5-x}Te_x$ and $Mg_{3.2-x}Nb_xSb_{1.5}Bi_{0.49}Te_{0.01}$. $Mg_{3.2}Sb_{1.5}Bi_{0.5-x}Te_x$ specimens show a good agreement with ionization scattering. As compared to acoustic phonon scattering, the Seebeck coefficient due to ionization scattering is noticeably higher. By shifting the ionization scattering into mixed scattering, Seebeck coefficient is relatively reduced and $Mg_{3.2-x}Nb_xSb_{1.5}Bi_{0.49}Te_{0.01}$ specimens show a reasonable agreement with mixed scattering. Although the Seebeck coefficient in mixed scattering condition is smaller than that of ionization scattering at identical Hall carrier concentration, slightly increased Seebeck coefficient in $Mg_{3.2}Nb_xSb_{1.5}Bi_{0.49}Te_{0.01}$ (x>0) than that of $Mg_{3.2}Sb_{1.5}Bi_{0.49}Te_{0.01}$ is mainly due to the reduced Hall carrier concentration in $Mg_{3.2-x}Nb_xSb_{1.5}Bi_{0.49}Te_{0.01}$ (x>0). The Hall carrier concentration is between ~3.1×10$^{19}$ cm$^{-3}$ and ~3.8×10$^{19}$ cm$^{-3}$ for $Mg_{3.2-x}Nb_xSb_{1.5}Bi_{0.49}Te_{0.01}$ (x>0), but ~6.1×10$^{19}$ cm$^{-3}$ for $Mg_{3.2}Sb_{1.5}Bi_{0.49}Te_{0.01}$. This suggests that Nb has counter-doping effect which slightly cancels the carrier concentration. In order to further confirm this issue, $Mg_{3.2}Sb_{1.5}Bi_{0.5}$ and $Mg_{3.1}Nb_{0.1}Sb_{1.5}Bi_{0.5}$ samples were also prepared, the measured electrical conductivity of $Mg_{3.1}Nb_{0.1}Sb_{1.5}Bi_{0.5}$ is noticeably smaller than that of $Mg_{3.2}Sb_{1.5}Bi_{0.5}$ (FIG. 19). It is also worth noting that further increasing Nb concentration up to x=0.175 results in the transition from n-type to p-type, probably due to the decreased extra Mg that is essential to achieve n-type, detailed studies in this aspect is being carried out.

Due to the transition from ionization scattering to mixed scattering, noticeable enhancement in mobility is observed. The room temperature mobilities are around ~19 V cm$^{-1}$ s$^{-1}$ for $Mg_{3.2}Sb_{1.5}Bi_{0.5-x}Te_x$ (ionization scattering dominated) but between ~70 and ~77 V cm$^{-1}$ s$^{-1}$ for $Mg_{3.2-x}Nb_xSb_{1.5}Bi_{0.49}Te_{0.01}$ (mixed scattering dominated), an enhancement up to ~300%. It is noted that the difference in mobilities becomes much smaller at higher temperature range. This should be mainly ascribed to the reason that the same acoustic phonon scattering is dominated at this temperature range, where the difference in mobilities could be partly explained by the variation in Hall carrier concentration. It further indicates that carrier scattering mechanism plays a critical role in determining the carrier mobility. The increased Hall mobility in $Mg_{3.2-x}Nb_xSb_{1.5}Bi_{0.49}Te_{0.01}$ significantly improves the power factor at lower temperature range as shown in FIG. 22C and FIG. 22D.

Figure 23A:
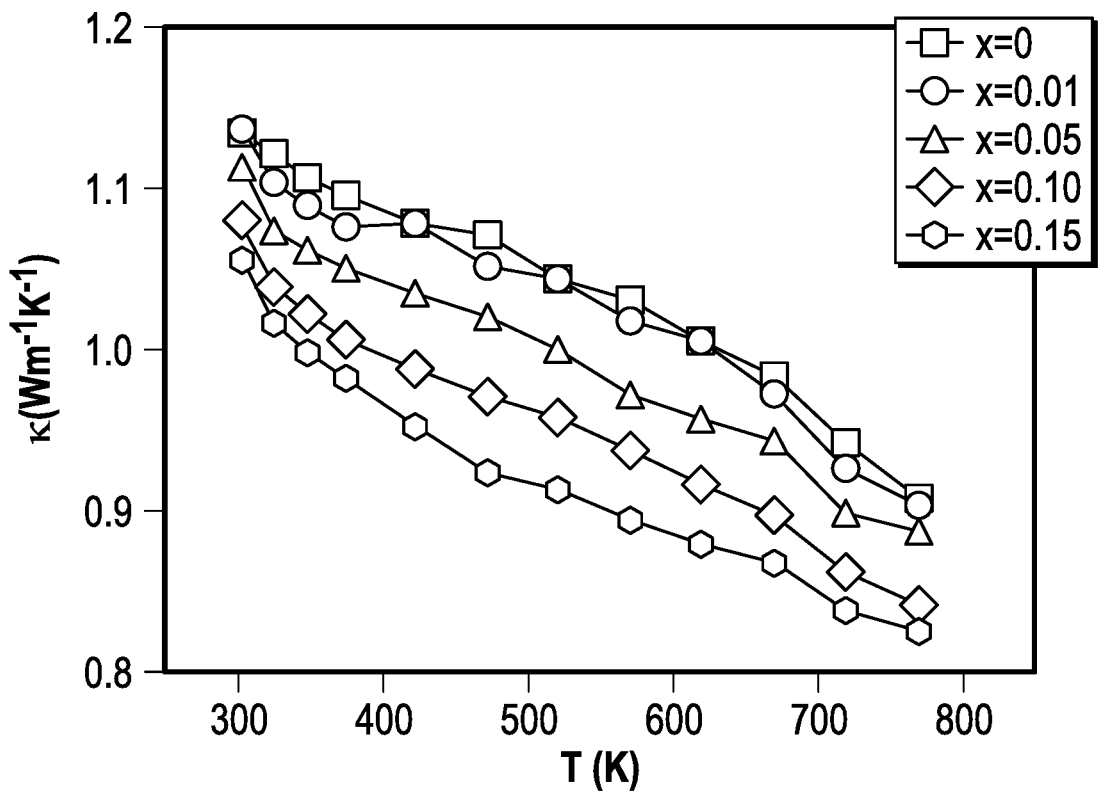
FIGS. 23A-23D are graphs of temperature-dependent thermoelectric properties for n-type thermoelectric materials fabricated according to certain embodiments of the present disclosure.
Figure 23B:
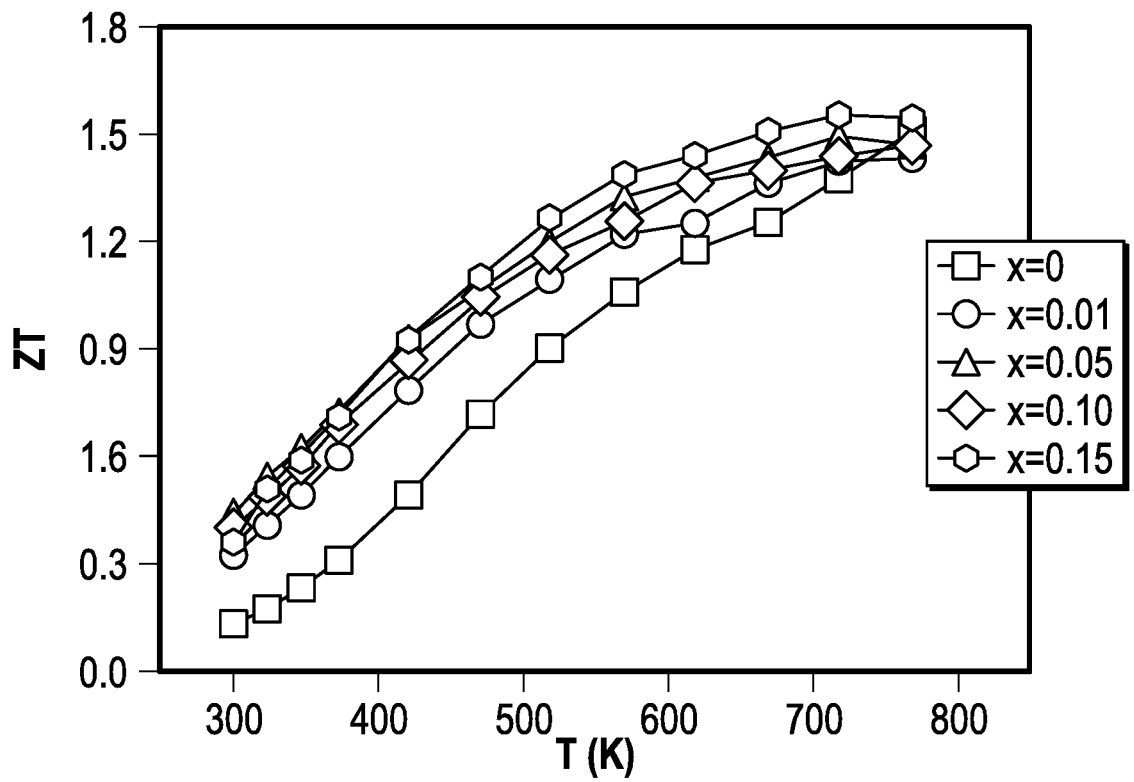
Figure 23C:
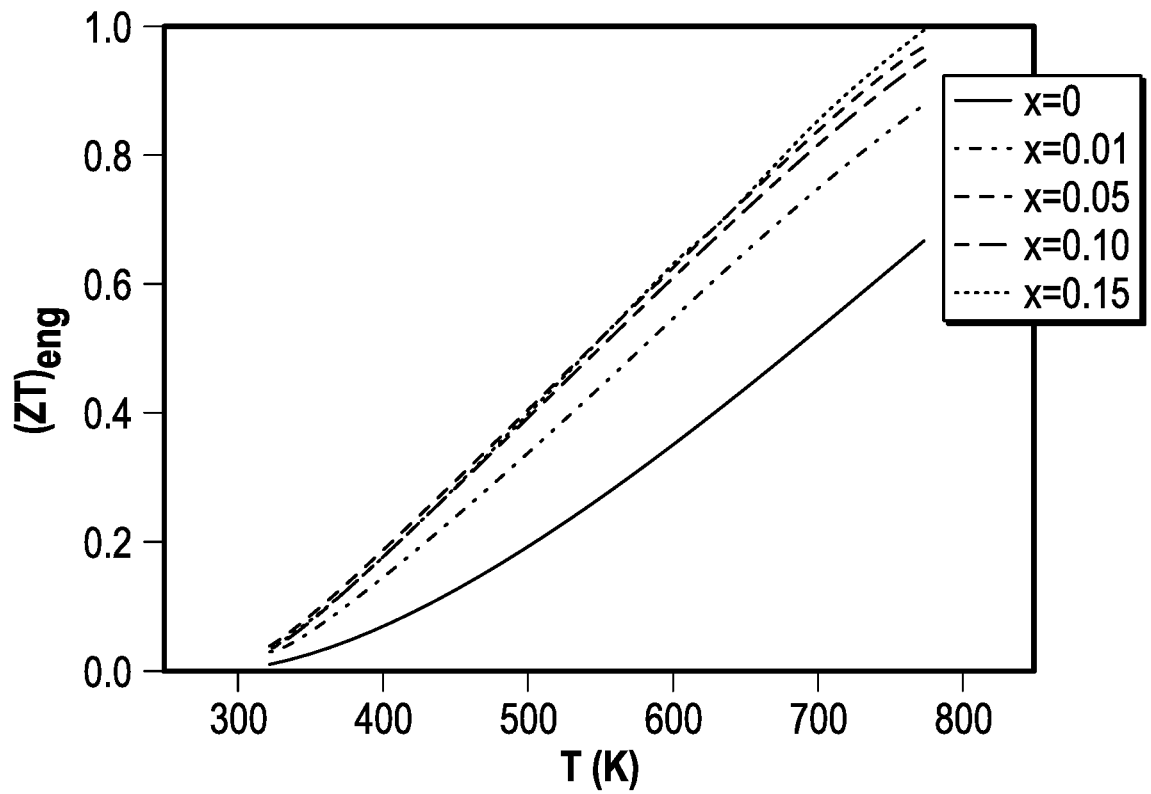
Figure 23D:
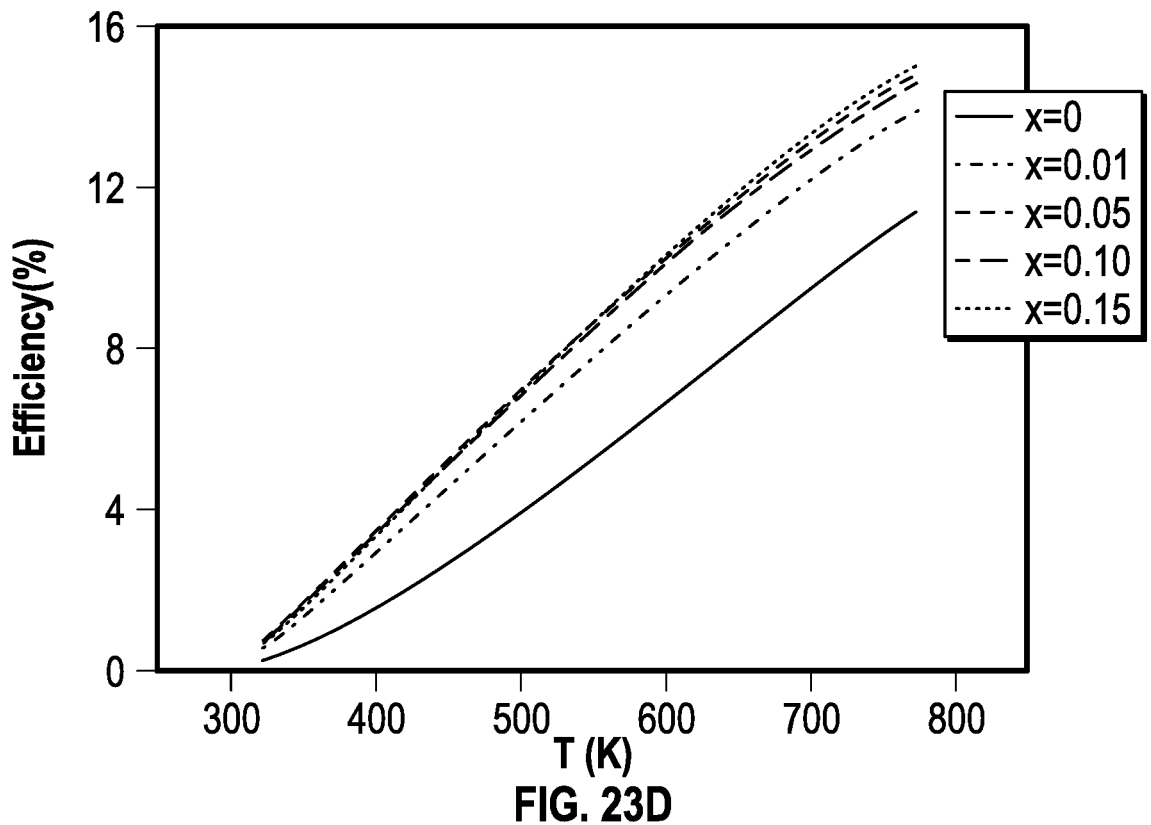
Figure 24:
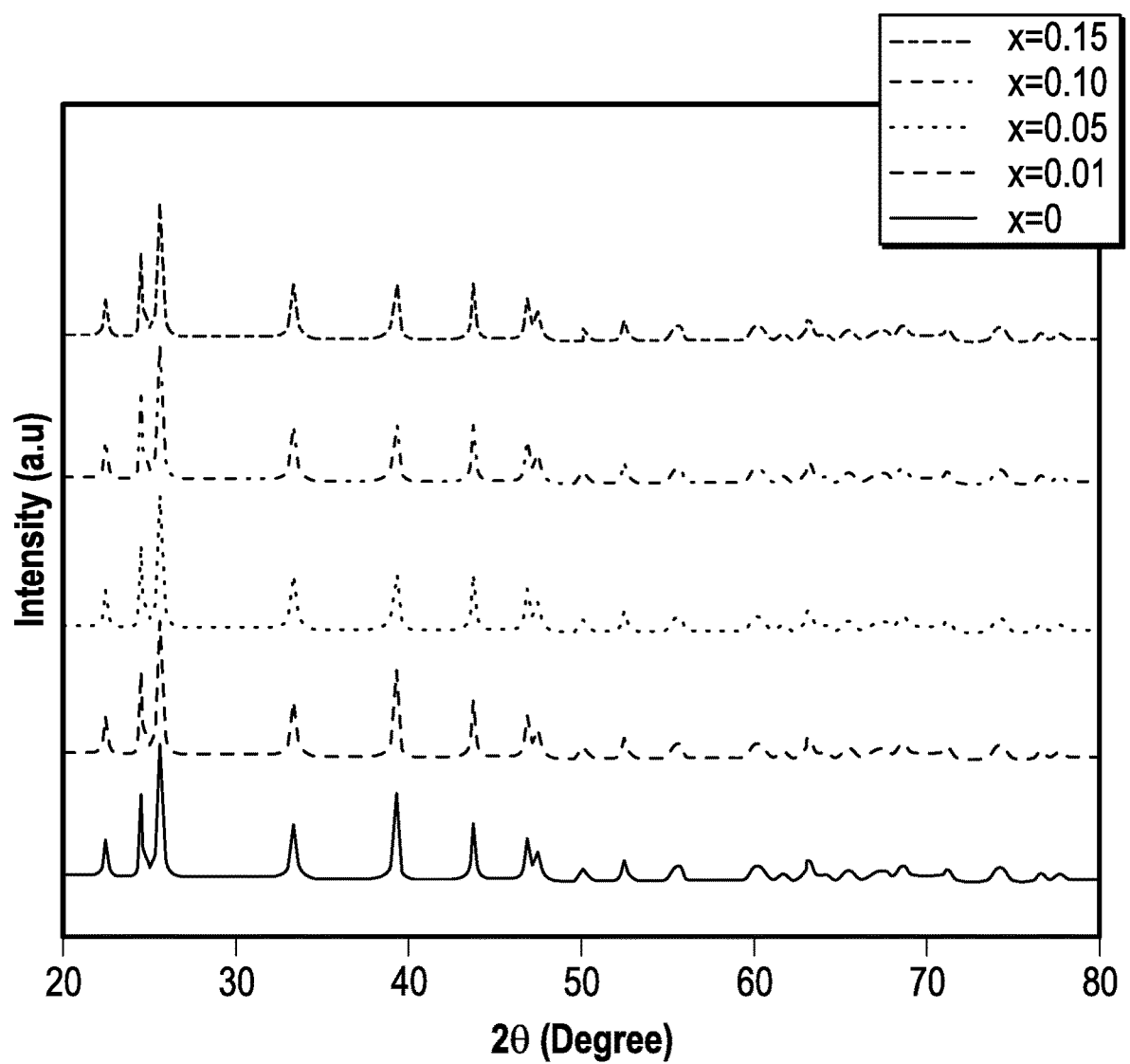
FIG. 24 is an x-ray diffraction (XRD) of Nb-doped n-type thermoelectric materials fabricated according to certain embodiments of the present disclosure.

FIGS. 23A-23D are graphs of temperature-dependent properties of $Mg_{3.2-x}Nb_xSb_{1.5}Bi_{0.49}Te_{0.01}$ manufactured according to certain embodiments of the present disclosure. FIG. 23A shows the slightly reduced thermal conductivities in $Mg_{3.2-x}Nb_xSb_{1.5}Bi_{0.49}Te_{0.01}$ (x>0) comparing to that of $Mg_{3.2}Sb_{1.5}Bi_{0.49}Te_{0.01}$, which could be partly explained by the point defects (mass difference between Nb and Mg) and presence of impurity phase, as shown in FIG. 24 and discussed below. FIG. 23B shows the ZT from about 300K to about 800K, with a peak ZT for each composition at above about 0.9 at about 425K, with the x=0.15 sample comprising the highest ZT from about 475K to about 800K. FIG. 23C is a graph of the $ZT_{eng}$ from about 300K to about 800K, and FIG. 23D is a graph of the calculated efficiency.

Due to the slightly reduced thermal conductivities and substantially improved power factors in Nb-doped specimens, ZTs at lower temperature are noticeably improved and hence the average ZT are significantly increased, the average ZT is ~0.78 for $Mg_{3.2}Sb_{1.5}Bi_{0.49}Te_{0.01}$ but ~1.07 for $Mg_{3.05}Nb_{0.15}Sb_{1.5}Bi_{0.49}Te_{0.01}$, an increase of ~37%. The calculated $(ZT)_{eng}$ at the cold side temperature ($T_C$) of 298 K and hot side temperature ($T_H$) of 773 K is 0.66 for $Mg_{3.2}Sb_{1.5}Bi_{0.49}Te_{0.01}$, but 0.99 for $Mg_{3.05}Nb_{0.15}Sb_{1.5}Bi_{0.49}Te_{0.01}$, an increase of ~50% (as shown in FIG. 23C), which results an efficiency increase from 11.4% to 15.1% at $T_H$ of 773 K, as shown in FIG. 23D.

High power factor not only leads to potentially high ZT but also large output power density. The relationship between power factor and maximum output power density ($\omega_{max}$) can be expressed as:

$$\omega_{max} = \frac{1}{4}\frac{(T_H - T_C)^2}{L_{leg}}PF \tag{13}$$

where $L_{leg}$ is length of leg. Due to the large difference in power factors between $Mg_{3.2}Sb_{1.5}Bi_{0.49}Te_{0.01}$ and $Mg_{3.15}Nb_{0.05}Sb_{1.5}Bi_{0.49}Te_{0.01}$, noticeable enhancement in output power density should be expected.

FIG. 24 is a graph of a plurality of x-ray diffraction patterns for $Mg_{3.2-x}Nb_xSb_{1.5}Bi_{0.49}Te_{0.01}$ fabricated according to certain embodiments of the present disclosure, where x=0, 0.01, 0.05, 0.10, and 0.15.

Figure 25A:
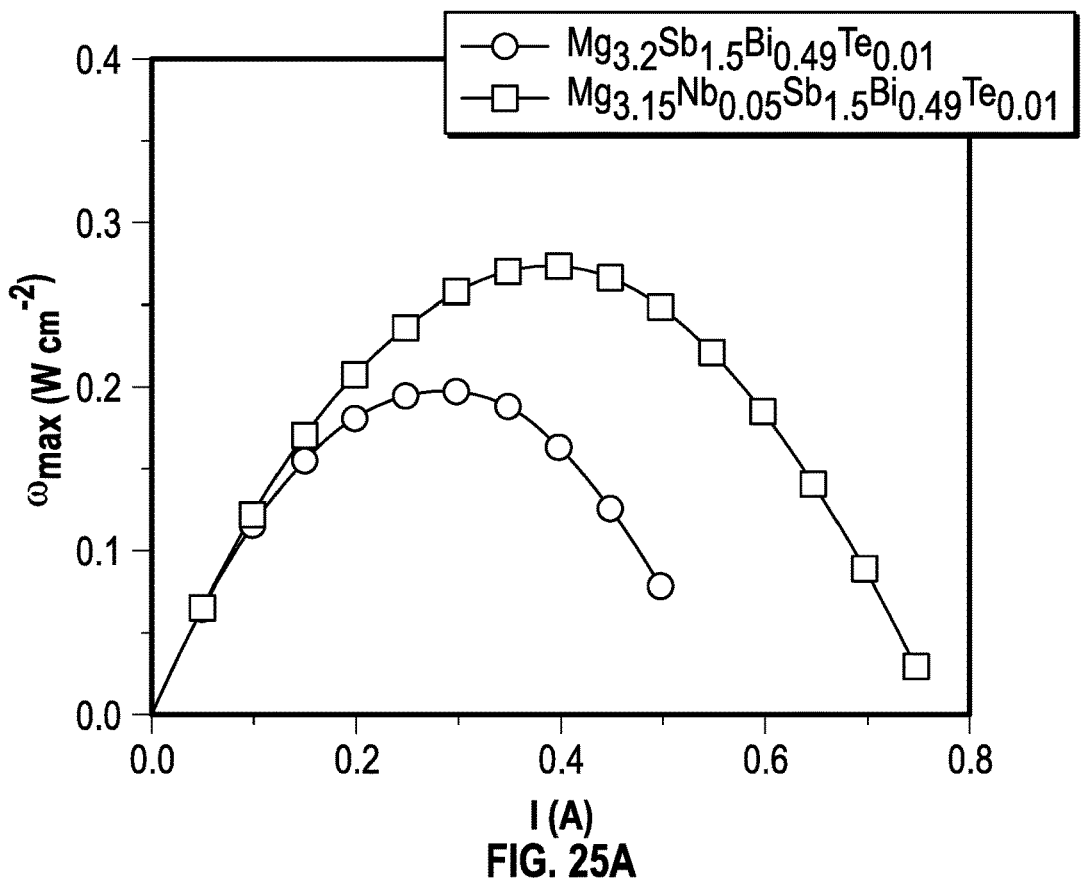
FIGS. 25A-25B are graphs of temperature-dependent thermoelectric properties for n-type thermoelectric materials fabricated according to certain embodiments of the present disclosure.
Figure 25B:
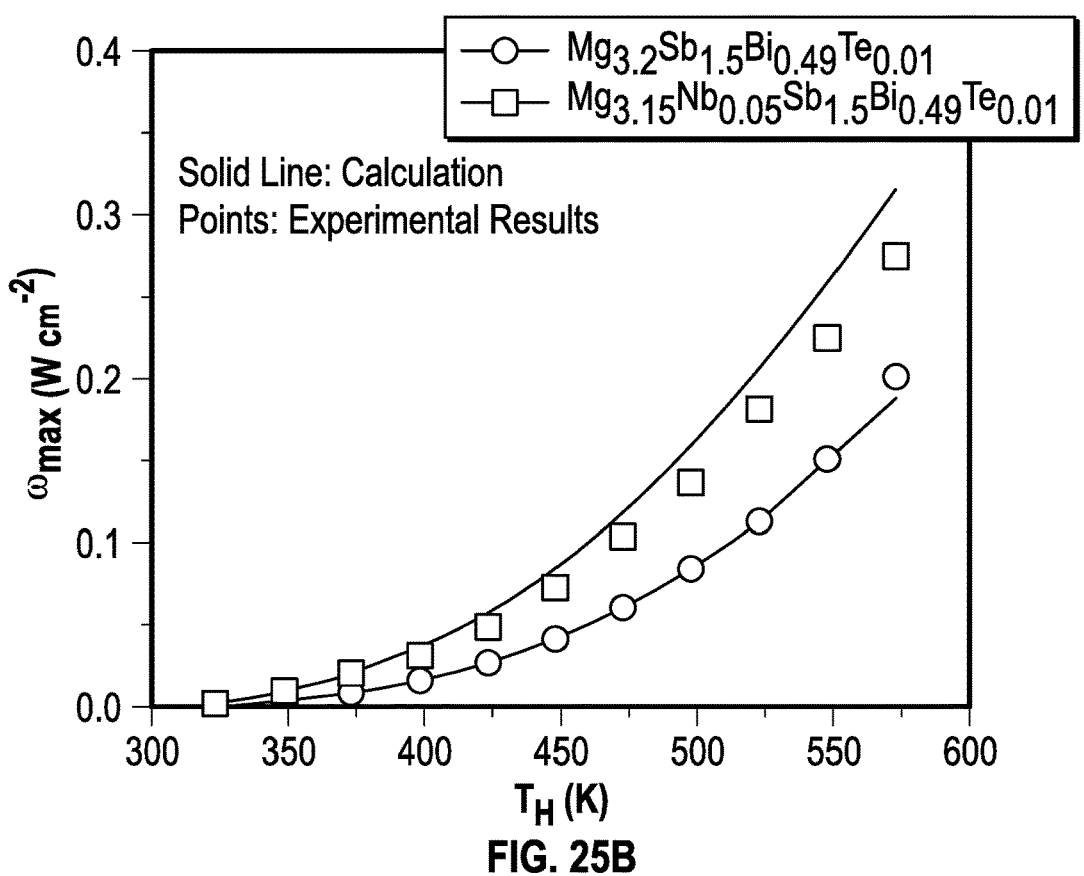

FIGS. 25A-25B are graphs illustrating comparison of maximum output power density ($w_{max}$) between $Mg_{3.2}Sb_{1.5}Bi_{0.49}Te_{0.01}$ and $Mg_{3.15}Nb_{0.05}Sb_{1.5}Bi_{0.49}Te_{0.01}$ at different hot side temperatures. The output power is measured by our home-made equipment where the $T_C$ is maintained at 298 K and the length of leg is ~12 mm. Due to the low melting point (~588 K) of brazing material, maximum hot side temperature is limited to 573 K for our measurement. FIG. 25A shows the relationship between applied current (I) and output power density at the hot side temperature of 573 K, where $Mg_{3.1}Nb_{0.1}Sb_{1.5}Bi_{0.49}Te_{0.01}$ shows noticeably higher output power density than of the $Mg_{3.15}Nb_{0.05}Sb_{1.5}Bi_{0.49}Te_{0.01}$. Hot side temperature dependent maximum output power density is further shown in FIG. 25B, where the measured results show a reasonable agreement with theoretical predictions. The measured peak maximum output power density is ~0.19 W cm$^{-2}$ for $Mg_{3.2}Sb_{1.5}Bi_{0.49}Te_{0.01}$ at the hot side temperature of 573 K, but ~0.27 W cm$^{-2}$ for $Mg_{3.15}Nb_{0.05}Sb_{1.5}Bi_{0.49}Te_{0.01}$, an increase of ~42%. It clearly demonstrates that noticeable enhancement in output power density is achieved due to the substantially improved power factor in Nb-doped specimen. It is worth noting that long leg length of ~12 mm was used in order to minimize the parasitic effect of contact resistance since ideal diffusion barrier layer has not been made yet.

In an embodiment, a method of manufacturing a thermoelectric material comprising: hot-pressing a powder comprising a material according to the formula $Ca_{1-x}Yb_xMg_2Bi_2$ into a pressed component, wherein the pressed component comprises a ZT value of at least 0.60 above about 675K. The method further comprising: wherein, prior to hot-pressing, the powder is formed using ball-milling, wherein the ball-milling comprises high energy ball milling, wherein the powder is ball-milled for a period from about 10 minutes to about 50 hours. The method further comprising wherein hot-pressing comprises holding at least some of the powder from about 700K and about 1000K for about 1 second to about 30 minutes. The method further comprising wherein x is greater than 0, or wherein x is from about 0.3 to about 1.0.

In an embodiment, a thermoelectric device comprising: a thermoelectric material according to the formula $AM_yX_y$, wherein the ZT of the thermoelectric material is above about 0.60 at above about 675K, y is from about 0.1 to about 0.9, wherein A comprises at least two components, wherein A comprises at least one of calcium (Ca), europium (Eu), ytterbium (Yb), and strontium (Sr), wherein M comprises at least one of manganese (Mn), zinc (Zn), and cadmium (Cd), wherein X comprises at least one of bismuth (Bi) and antimony (Sb), and wherein y=2. The device further comprising wherein the ZT of the thermoelectric material is above about 0.60 at above about 675K subsequent to hot-pressing a powder, and, wherein, prior to hot-pressing, the powder is fabricated by ball-milling.

In an embodiment, a thermoelectric device comprising: a hot-pressed thermoelectric component according to the formula $Ca_{1-x}Yb_xMg_2Bi_2$, wherein the hot-pressed component comprises a ZT value of at least 0.60 above about 675K, wherein x is greater than 0 or wherein x is from about 0.3 to about 1.0, and wherein the hot-pressed thermoelectric component is formed from ball-milled powder.

Exemplary embodiments are disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc., and in some embodiments may mean that the measured characteristic is within +/−5%, +/−10%, or a stated range). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention that is claimed below. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed is:

1. A thermoelectric device comprising:
   a thermoelectric material comprising a formula $AM_yX_y$, wherein the thermoelectric material comprises a dimensionless figure of merit (ZT) greater than 0.60 at about 675K, and wherein A comprises ytterbium (Yb) and calcium (Ca), wherein M comprises at least one of magnesium (Mg), or zinc (Zn), wherein X comprises at least one of bismuth (Bi) or antimony (Sb), and wherein y=2, wherein the thermoelectric material is according to the formula $Ca_{1-x}Yb_xMg_2Bi_2$ or $Ca_{1-x}Yb_xZn_2Sb_2$, wherein x is from greater than 0 about 0.9.

2. The device of claim 1, wherein the thermoelectric material is according to the formula $Ca_{1-x}Yb_xMg_2Bi_2$.

3. The device of claim 1, wherein x is from about 0.1 to 0.9.

4. The device of claim 1, wherein x is from about 0.3 to about 0.9.

5. A thermoelectric device comprising:
   a thermoelectric material comprising a formula $AM_yX_y$, wherein the thermoelectric material comprises a dimensionless figure of merit (ZT) greater than 0.60 at about 675K, and wherein A comprises ytterbium (Yb) and at least one component selected from calcium (Ca), europium (Eu), or strontium (Sr), wherein M comprises magnesium, and X comprises bismuth (Bi), and wherein y=2.

6. The device of claim 5, wherein the at least one component comprises calcium (Ca) or europium (Eu).

7. The device of claim 5, wherein the ZT of the thermoelectric material is greater than 0.60 at about 675K subsequent to hot-pressing.

8. The device of claim 5, wherein the thermoelectric material is according to the formula $Ca_{1-x}Yb_xMg_2Bi_2$ wherein x is from about 0.1 to about 0.9.

9. A thermoelectric device comprising:

a thermoelectric material comprising a formula $AM_yX_y$, wherein the thermoelectric material comprises a dimensionless figure of merit (ZT) greater than 0.60 at about 675K, and wherein A comprises ytterbium (Yb) and calcium (Ca), wherein M comprises at least one of magnesium (Mg), or zinc (Zn), wherein X comprises at least one of bismuth (Bi) or antimony (Sb), and wherein y=2, wherein the thermoelectric material is according to the formula $Ca_{0.5}Yb_{0.5}Mg_2Bi_2$ or $Ca_{0.25}Yb_{0.75}Zn_2Sb_2$.

10. A thermoelectric device comprising:

a thermoelectric component comprising magnesium (Mg), tellurium (Te), antimony (Sb), and bismuth (Bi) according to the formula $Mg_{3.2}Sb_{1.5}Bi_{0.5-x}Te_x$, wherein x is from 0.01 to 0.15; and a thermoelectric material comprising a formula $AM_yX_y$, wherein A comprises ytterbium (Yb) and calcium (Ca), wherein M comprises at least one of magnesium (Mg), or zinc (Zn), wherein X comprises at least one of bismuth (Bi) or antimony (Sb), and wherein y=2, wherein the thermoelectric material is according to the formula $Ca_{0.5}Yb_{0.5}Mg_2Bi_2$ or $Ca_{0.25}Yb_{0.75}Zn_2Sb_2$.

11. The device of claim 10, wherein the thermoelectric component comprises an average ZT above 0.8 from 400K to 800K.

12. A thermoelectric device comprising:

an n-type thermoelectric component according to the formula $Mg_{3.2-y}Nb_ySb_{1.5}Bi_{0.5-x}Te_x$, wherein x in the formula $Mg_{3.2-y}Nb_ySb_{1.5}Bi_{0.5-x}Te_x$ is from 0.01 to 0.15 and wherein y; in the formula $Mg_{3.2-y}Nb_ySb_{1.5}Bi_{0.5-y}Te_x$ is from 0 to 0.15; and a p-type thermoelectric component according to the formula $AM_yX_y$, wherein the thermoelectric material comprises a dimensionless figure of merit (ZT) greater than 0.60 at about 675K, wherein A comprises ytterbium (Yb) and at least one component selected from calcium (Ca), europium (Eu), or strontium (Sr), wherein M comprises at magnesium (Mg), and wherein X comprises bismuth (Bi), wherein y=2 in the formula $AM_yX_y$, and wherein the n-type thermoelectric component is electrically coupled to the p-type thermoelectric component.

13. The device of claim 12, wherein the at least one component comprises calcium (Ca) or europium (Eu).

14. The device of claim 12, wherein the p-type thermoelectric material is according to the formula $Ca_{1-x}Yb_xMg_2Bi_2$, wherein x in the formula $Ca_{1-x}Yb_xMq_2Bi_2$ is a great than 0 to about 0.9.

15. The device of claim 14, wherein x in the formula $Ca_{1-x}Yb_xMg_2Bi_3$ is from about 0.3 to about 0.9.

16. The device of claim 13, wherein the p-type thermoelectric material is according to the formula $Ca_{0.5}Yb_{0.5}Mg_2Bi_2$ or $Ca_{0.25}Yb_{0.75}Zn_2Sb_2$.

* * * * *